(12) United States Patent
Tanaka et al.

(10) Patent No.: US 6,940,116 B2
(45) Date of Patent: Sep. 6, 2005

(54) SEMICONDUCTOR DEVICE COMPRISING A HIGHLY-RELIABLE, CONSTANT CAPACITANCE CAPACITOR

(75) Inventors: Yoshinori Tanaka, Hyogo (JP); Masahiro Shimizu, Hyogo (JP); Hideaki Arima, Hyogo (JP)

(73) Assignee: Renesas Technology Corp., Tokyo (JP)

(*) Notice: Subject to any disclaimer, the term of this patent is extended or adjusted under 35 U.S.C. 154(b) by 331 days.

(21) Appl. No.: 09/756,864

(22) Filed: Jan. 10, 2001

(65) Prior Publication Data

US 2001/0001211 A1 May 17, 2001

Related U.S. Application Data

(62) Division of application No. 09/095,612, filed on Jun. 11, 1998, now Pat. No. 6,194,758.

(30) Foreign Application Priority Data

Dec. 24, 1997 (JP) ............................................. 9-367189

(51) Int. Cl.[7] ............................................. H01L 27/108
(52) U.S. Cl. ........................ 257/309; 257/306; 365/149
(58) Field of Search ................................. 257/296, 306, 257/309, 387; 365/149

(56) References Cited

U.S. PATENT DOCUMENTS

| | | | | |
|---|---|---|---|---|
| 5,023,683 A | | 6/1991 | Yamada ....................... | 257/309 |
| 5,162,248 A | | 11/1992 | Dennison et al. ........... | 438/396 |
| 5,168,073 A | * | 12/1992 | Gonzalez et al. ........... | 438/397 |
| 5,208,180 A | * | 5/1993 | Gonzalez ..................... | 438/387 |
| 5,414,655 A | | 5/1995 | Ozaki et al. ................. | 365/149 |
| 5,448,512 A | | 9/1995 | Hachisuka et al. .......... | 365/149 |
| 5,604,696 A | | 2/1997 | Takaishi ....................... | 365/149 |
| 5,650,349 A | | 7/1997 | Prall et al. ................... | 438/307 |
| 5,856,220 A | * | 1/1999 | Wang et al. ................. | 438/254 |

FOREIGN PATENT DOCUMENTS

| | | |
|---|---|---|
| DE | 4307725 | 9/1993 |
| DE | 4323961 | 1/1994 |
| JP | 62-128168 | 10/1987 |
| JP | 1-257365 | 10/1989 |
| JP | 06125051 A * | 5/1994 |
| JP | 7-86434 | 3/1995 |
| JP | 8-46152 | 2/1996 |
| JP | 8-306881 | 11/1996 |
| JP | 9-116114 | 5/1997 |

* cited by examiner

Primary Examiner—Minh Loan Tran
Assistant Examiner—Thomas L Dickey
(74) Attorney, Agent, or Firm—McDermott, Will & Emery

(57) ABSTRACT

A semiconductor device, including a memory cell region and a peripheral circuit region, comprises an insulating film, having an upper surface, formed on a major surface of a semiconductor substrate to extend from the memory cell region to the peripheral circuit region. A capacitor lower electrode assembly is formed in the memory cell region to upwardly extend to substantially the same height as the upper surface of the insulating film on the major surface of the semiconductor substrate. Additionally, the lower electrode assembly includes first and second lower electrodes that are adjacent through the insulating film. A capacitor upper electrode is formed on the capacitor lower electrode through a dielectric film, to extend onto the upper surface of the insulating film. The capacitor lower electrode includes a capacitor lower electrode part having a top surface and a bottom surface. A semiconductor device organized, as just described, permits implementation having a high density of integration while ensuring the capacitor exhibits high reliability and a constant capacitance.

5 Claims, 63 Drawing Sheets

SEMICONDUCTOR DEVICE COMPRISING A HIGHLY-RELIABLE, CONSTANT CAPACITANCE CAPACITOR

This application is a Divisional of application Ser. No. 09/095,612 filed Jun. 11, 1998 now U.S. Pat. No. 6,194,758.

CROSS-REFERENCE TO RELATED APPLICATION

This application is related to copending application Ser. No. 08/710,901 which is a continuation application of Ser. No. 08/253,435 and Ser. No. 08/882,300 which is a continuation application of Ser. No. 08/157,249, commonly assigned with the present invention.

BACKGROUND OF THE INVENTION

1. Field of the Invention

The present invention relates to a semiconductor device and a method of fabricating the same, and more specifically, it relates to a semiconductor device comprising a capacitor and a method of fabricating the same.

2. Description of the Prior Art

In recent years, high integration and refinement are increasingly required to a semiconductor device, particularly a semiconductor memory device such as a DRAM (dynamic random access memory). FIG. 114 is a typical plan view showing a part of a memory cell region of a conventional DRAM. Referring to FIG. 114, the memory cell region of the conventional DRAM comprises a capacitor including a field-effect transistor and capacitor lower electrodes 1170a and 1170b, word lines 1043a, 1043b, 1043e and 1043f and a bit line 1174. The field-effect transistor is formed by the word lines 1043a and 1043e serving as gate electrodes and an active region 1039 serving as a source/drain region. In more concrete terms, the active region 1039 is formed in a major surface of a semiconductor substrate, and the word lines 1043a, 1043b, 1043e and 1043f are formed on the major surface of the semiconductor substrate. A first interlayer isolation film (not shown) is formed on the word lines 1043a, 1043b, 1043e and 1043f and the major surface of the semiconductor substrate. The bit line 1174 is formed on the first interlayer isolation film substantially perpendicularly to the word lines 1043a, 1043b, 1043e and 1043f. A second interlayer isolation film (not shown) is formed on the bit line 1174 and the first interlayer isolation film. The capacitor lower electrodes 1170a and 1170b are formed on the second interlayer isolation film. The bit line 1174 is electrically connected with the active region 1039 through a contact hole 1049. The capacitor lower electrodes 1170a and 1170b are electrically connected with single ones of source/drain regions of the field-effect transistor in the active region 1039 through contact holes 1038a and 1038b respectively. FIG. 115 is a sectional view of the memory cell region of the DRAM taken along the line 500—500 in FIG. 114.

FIG. 115 is a sectional view showing the section taken along the line 500—500 in FIG. 114 and a section of a peripheral circuit region of the DRAM. Referring to FIG. 115, source/drain regions 1201a and 1201b of the field-effect transistor are formed on the active region 1039 enclosed with a trench isolation oxide film 1040 in the memory cell region of the DRAM. A gate electrode 1043a is formed on a channel region held between the pair of source/drain regions 1201a and 1201b through a gate insulating film 1042a. A silicon nitride film 1044a is formed on the gate electrode 1043a. The gate electrode 1043a consists of n-type doped polysilicon. Side walls 1046a and 1046b consisting of silicon nitride films are formed on side surfaces of the gate electrode 1043a and the silicon nitride film 1044a. A non-doped silicon oxide film 1047 is formed on the side walls 1046a and 1046b, the silicon nitride film 1044a and a major surface of a semiconductor substrate 1001. A gate electrode 1043b is formed on the trench isolation oxide film 1040 through a gate insulating film 1042b. A silicon nitride film 1044b is formed on the gate electrode 1043b. Side walls 1046c and 1046d consisting of silicon nitride films are formed on side surfaces of the gate electrode 1043b and the silicon nitride film 1044b. The non-doped silicon oxide film 1047 is formed on the side walls 1046c and 1046d and the silicon nitride film 1044b. A first interlayer isolation film 1048 is formed on the non-doped silicon oxide film 1047. The contact hole 1049 is formed by partially removing the first interlayer isolation film 1048 and the non-doped silicon oxide film 1047 by etching. A doped polysilicon film 1052 is formed in the contact hole 1049 and on the first interlayer isolation film 1048. A refractory metal silicide film 1053 is formed on the doped polysilicon film 1052. The doped polysilicon film 1052 and the refractory metal silicide film 1053 form the bit line 1174. A silicon nitride film 1054 is formed on the refractory metal silicide film 1053. Side walls 1055a and 1055b consisting of silicon nitride films are formed on side surfaces of the silicon nitride film 1054, the refractory metal silicide film 1053 and the doped polysilicon film 1052. A second interlayer isolation film 1037 is formed on the first interlayer isolation film 1048, the side walls 1055a and 1055b and the silicon nitride film 1054. The first and second interlayer isolation films 1048 and 1037 are partially removed, thereby forming the contact hole 1038a for electrically connecting the capacitor lower electrode 1170a with one of the source/drain regions 1201a and 1201b. A plug 1057 consisting of doped polysilicon is formed in the contact hole 1038a. The capacitor lower electrode 1170a is formed in the contact hole 1038a and on the second interlayer isolation film 1037. The capacitor lower electrode 1170a has a cylindrical structure, in order to ensure the capacitance of the capacitor with a small occupied area. A dielectric film 1150 is formed on the capacitor lower electrode 1170a and the second interlayer isolation film 1037. A capacitor upper electrode 1151 is formed on the dielectric film 1150. A third interlayer isolation film 1205 is formed on the capacitor upper electrode 1151.

The peripheral circuit region is provided with the field-effect transistor and a wiring layer 1202 which are elements forming peripheral circuits. Source/drain regions 1201d and 1201e are formed on the major surface of the semiconductor substrate 1001. Gate electrodes 1043c and 1043d are formed on channel regions which are adjacent to the source/drain regions 1201d and 1201e through gate insulating films 1042c and 1042d respectively. Silicon nitride films 1044c and 1044d are formed on the gate electrodes 1043c and 1043d. Side walls 1046e to 1046g consisting of silicon nitride films are formed on side surfaces of the gate electrodes 1043c and 1043d and the silicon nitride films 1044c and 1044d. The non-doped silicon oxide film 1047 is formed on the major surface of the semiconductor substrate 1001, the silicon nitride films 1044c and 1044d and the side walls 1046e to 1046g. The first interlayer isolation film 1048 is formed on the non-doped silicon oxide film 1047. The first interlayer isolation film 1048 is partially removed, thereby forming contact holes 1050 and 1051. The doped polysilicon film 1052 is formed on the first interlayer isolation film 1048 and in the contact holes 1050 and 1051. The refractory metal silicide film 1053 is formed on the doped polysilicon film 1052. The doped polysilicon film 1052 and the refractory metal silicide film 1053 form the wiring layer 1202 in the peripheral circuit region. A silicon nitride film 1203 is formed on the refractory metal silicide film 1053. Side walls 1204a and 1204b consisting of silicon nitride films are formed on side surfaces of the silicon nitride film 1203, the refractory metal silicide film 1053 and the doped polysilicon film 1052. The second interlayer isolation film 1037 is formed on the first interlayer isolation film 1048, the silicon nitride film 1203 and the side walls 1204a and 1204b. The dielectric film 1150 of the capacitor extending from the memory cell region is formed on the second interlayer isolation film 1037. The capacitor upper electrode 1151 is formed on the dielectric film 1150. The third interlayer isolation film 1205 is formed on the second interlayer isolation film 1037 and the capacitor upper electrode 1151.

FIG. 116 illustrates a modification of the memory cell region of the conventional RAM shown in FIG. 115. This modification has a capacitor lower electrode 1092 which is in the form of a thick film. The structure of this modification is substantially identical to that of the conventional DRAM shown in FIG. 115, except the shape of the capacitor lower electrode 1092.

As shown in FIG. 115 or 116, the capacitor lower electrode 1170a or 1092 is formed to vertically extend in the memory cell region of the conventional DRAM, in order to ensure the capacitance of the capacitor while facilitating high integration and refinement. Thus, the capacitance required to the capacitor can be ensured while reducing the occupied area of the capacitor lower electrode 1170a or 1092 in the memory cell region. However, such vertical extension of the capacitor lower electrode 1170a or 1092 in the memory cell region results in extreme difference between the vertical positions of the upper surface of the third interlayer isolation film 1205 in the memory cell region and the peripheral circuit region. In general, a wiring layer consisting of aluminum or the like is formed on the third interlayer isolation film 1205. In a photolithographic step for forming this wiring layer, however, no sufficient focal allowance for photolithography can be attained due to the step on the upper surface of the third interlayer isolation film 1205 in the memory cell region and the peripheral circuit region. Thus, the pattern of the wiring layer formed on the third interlayer isolation film 1205 is so blurred that the wiring layer is disconnected or shorted. Consequently, the semiconductor device is disadvantageously reduced in reliability.

In the peripheral circuit region of the conventional DRAM, further, contact holes 1144 and 1135 are formed in order to electrically connect the wiring layer 1202 and the capacitor upper electrode 1151 in the peripheral circuit region with a wiring layer (not shown) consisting of aluminum or the like formed on the third interlayer isolation film 1205, as shown in FIG. 117. While the contact holes 1144 and 1135 are generally simultaneously formed in the same etching step, the capacitor upper electrode 1151 is excessively etched on a bottom portion of the contact hole 1135 until the contact hole 1144 reaches the wiring layer 1202, due to the difference between the depth positions of the capacitor upper electrode 1151 and the wiring layer 1202 formed in the peripheral circuit region. Consequently, the contact hole 1135 may pass through the capacitor upper electrode 1151 and the dielectric film 1150, as shown in FIG. 117. Further, the elements of the peripheral circuit region such as the wiring layer 1202 and the field-effect transistor may be damaged by the etching for forming the contact hole 1135. Consequently, the reliability of the semiconductor device is so reduced that the same cannot stably operate or causes a malfunction.

SUMMARY OF THE INVENTION

An object of the present invention is to provide a semiconductor device which can be implemented with higher density of integration while ensuring the capacitance of the capacitor, and has high reliability.

Another object of the present invention is to provide a method of fabricating a semiconductor device which can be implemented with higher density of integration while ensuring the capacitance of the capacitor, and has high reliability.

A semiconductor device according to a first aspect of the present invention includes a memory cell region and a peripheral circuit region, and comprises an insulating film, a capacitor lower electrode, a dielectric film and a capacitor upper electrode, which are formed on a major surface of a semiconductor substrate. The insulating film having an upper surface is formed on the major surface of the semiconductor substrate to extend from the memory cell region to the peripheral circuit region. The capacitor lower electrode is formed on the major surface of the semiconductor substrate to upwardly extend beyond the upper surface of the insulating film in the memory cell region. The capacitor upper electrode is formed on the capacitor lower electrode through the dielectric film, to extend onto the upper surface of the insulating film. The capacitor lower electrode includes a capacitor lower electrode part upwardly extending in opposition to the capacitor upper electrode and having a top surface and a bottom surface. The upper surface of the insulating film is located between the top surface and the bottom surface of the capacitor lower electrode part.

Thus, the capacitor lower electrode is partially embedded in the insulating film. Consequently, the difference between the vertical positions of the upper surface of the insulating film extending from the memory cell region to the peripheral circuit region and the top surface of the capacitor lower electrode part in the memory cell region can be reduced as compared with the prior art. In case of forming an interlayer isolation film on the capacitor lower electrode and the insulating film, therefore, a step on an upper surface of this interlayer isolation film can be reduced between the memory cell region and the peripheral circuit region. In case of forming a wiring layer on the insulating film by photolithography, the pattern of this wiring layer can consequently be prevented from being blurred by such a step on the upper surface of the interlayer isolation film. Thus, the wiring layer can be prevented from disconnection or shorting resulting from a blurred pattern. Consequently, the semiconductor device can be implemented with higher density of integration while ensuring the capacitance of the capacitor and attaining high reliability.

The capacitor lower electrode is partially embedded in the insulating film, whereby the capacitor upper electrode can be formed on an outer side surface of the capacitor lower electrode part located between the top surface of the capacitor lower electrode part and the upper surface of the insulating film through the dielectric film. Thus, the outer side surface of the capacitor lower electrode part can also be utilized as the capacitor, thereby increasing the capacitance of the capacitor.

Further, the area of the outer side surface of the capacitor lower electrode part which can be utilized as the capacitor can be changed by changing the position of the upper surface of the insulating film. Thus, the capacitance of the capacitor can be changed without changing the shape of the capacitor lower electrode part.

In the structure of the semiconductor device according to the first aspect of the present invention, the capacitor lower electrode may include first and second capacitor lower electrodes, which may be formed in the memory cell region to be adjacent to each other through a part of the insulating film. This part of the insulating film may have a width which is smaller than the minimum working size formable by photolithography. Thus, the distance between the first and second capacitor lower electrodes can be reduced as compared with the prior art. Consequently, the semiconductor device can be implemented with higher degree of integration.

In the structure according to the first aspect of the present invention, the semiconductor device may comprise a side wall electrode part which is formed on a side surface of the capacitor lower electrode located upward beyond the upper surface of the insulating film. Thus, the surface area of the side surface of the capacitor lower electrode can be increased as compared with the prior art, thereby increasing the capacitance of the capacitor. Therefore, the occupied area of the capacitor lower electrode can be reduced as compared with the prior art while ensuring a constant capacitor capacitance. Consequently, the semiconductor device can be further refined.

In the structure according to the first aspect of the present invention, the semiconductor device may comprise a first wiring layer and a first interlayer isolation film. The first wiring layer may be formed on the major surface of the semiconductor substrate in a region located under the capacitor lower electrode, and the first interlayer isolation film may be formed to be in contact with the first wiring layer and the capacitor lower electrode part on the first wiring layer. Thus, the number of layers formed in the memory cell region can be reduced as compared with the case of forming a protective insulating film for protecting the first wiring layer between the first wiring layer and the first interlayer isolation film. Therefore, the vertical position of the top surface of the capacitor lower electrode part can be lowered in the memory cell region. In case of forming an interlayer isolation film on the capacitor lower electrode and the insulating film, therefore, a step on the upper surface of the interlayer isolation film between the memory cell region and the peripheral circuit region can be reduced. In case of forming a wiring layer on the interlayer isolation film by photolithography, the pattern of this wiring layer can consequently be prevented from being blurred by such a step on the upper surface of the interlayer isolation film. Thus, the wiring layer can be prevented from disconnection or shorting resulting from a blurred pattern.

In the structure according to the first aspect of the present invention, the semiconductor device may further comprise a first conductive region, a second interlayer isolation film, a second wiring layer and a connecting conductor film. The first conductive region may be formed on the major surface of the semiconductor substrate in a region located under the capacitor lower electrode, and the second interlayer isolation film may be formed on the first conductive region with a first contact hole exposing a surface of the first conductive region. The second wiring layer may be formed on the second interlayer isolation film, and the connecting conductor film may be formed in the first contact hole to electrically connect the first conductive region with the second wiring layer. The second wiring layer may have a width smaller than that of the first contact hole.

Thus, the semiconductor device can be refined as compared with the general case of forming the second wiring layer in a width completely covering the first contact hole.

In the structure according to the first aspect of the present invention, the semiconductor device may further comprise a second conductive region, a third interlayer isolation film, a third wiring layer, a wire protection film and a conductor film. The second conductive region may be formed on the major surface of the semiconductor substrate in a region located under the capacitor lower electrode, and the third interlayer isolation film may be formed on the second conductive region with a second contact hole exposing a surface of the second conductive region. The conductor film may be formed in the second contact hole to electrically connect the second conductive region with the capacitor lower electrode, and the wire protection film may be in contact with the capacitor lower electrode or the conductor film.

Thus, the wire protection film can be employed as a mask for etching for forming the second contact hole in a fabrication step for the semiconductor device. Therefore, no step of forming a resist pattern independently employed as a mask is required for forming the second contact hole, and the number of fabrication steps for the semiconductor device can be reduced.

In the structure according to the first aspect of the present invention, the semiconductor device may further comprise a fourth interlayer isolation film and a peripheral circuit element protection film. The capacitor upper electrode may be formed to extend toward the peripheral circuit region, and the fourth interlayer isolation film may be formed on the capacitor upper electrode with a third contact hole exposing a surface of the capacitor upper electrode. The peripheral circuit element protection film may be formed under the insulating film in a region located under the third contact hole.

Thus, the peripheral circuit element protection film can inhibit progress of etching even if the third contact hole passes through the capacitor upper electrode and reaches the insulating film in formation of the third contact hole by etching. Therefore, peripheral circuit elements such as a field-effect transistor and a wiring layer in the peripheral circuit region can be prevented from damage caused by etching for forming the third contact hole. Thus, the semiconductor device can be prevented from a defective operation resulting from damage of the elements of the peripheral circuit region. Consequently, a highly reliable semiconductor device can be obtained.

In the structure according to the first aspect of the present invention, the semiconductor device may further comprise a peripheral circuit insulating film and a fourth interlayer isolation film. The peripheral circuit insulating film may have a peripheral circuit region opening in the peripheral circuit region, and the capacitor upper electrode may be formed to extend into the peripheral circuit region opening. The fourth interlayer isolation film may be formed on the peripheral circuit region opening with a fourth contact hole exposing a surface of the capacitor upper electrode.

Therefore, the depth of the fourth contact hole may be changed to reduce the difference between the same and that of another contact hole in the peripheral circuit region by adjusting the depth of the peripheral circuit region opening and the thickness of the capacitor upper electrode. Thus, the fourth contact hole can be prevented from passing through the capacitor upper electrode to damage peripheral circuit elements such as a field-effect transistor and a wiring layer due to difference between the depths of the fourth contact hole and the other contact hole in the peripheral circuit region. Thus, the semiconductor device can be prevented from a defective operation such as a malfunction resulting from damage of the peripheral circuit elements. Consequently, a highly reliable semiconductor device can be obtained.

In the structure according to the first aspect of the present invention, the semiconductor device may further comprise a fourth interlayer isolation film and a peripheral circuit element. The capacitor upper electrode may be formed to extend toward the peripheral circuit region, and the fourth interlayer isolation film may be formed on the capacitor upper electrode with a fifth contact hole exposing a surface of the capacitor upper electrode. The peripheral circuit element may be formed under the insulating film in the peripheral circuit region. The fifth contact hole may be formed in a region not overlapping with the peripheral circuit element in plane.

Thus, the peripheral circuit element can be prevented from damage caused by etching even if the etching so progresses that the fifth contact hole passes through the capacitor upper electrode in formation of the fifth contact hole. Therefore, the semiconductor device can be prevented from a defective operation such as a malfunction resulting from damage of the peripheral circuit element. Consequently, a highly reliably semiconductor device can be obtained.

A semiconductor device according to a second aspect of the present invention includes a memory cell region and a peripheral circuit region, and comprises a semiconductor substrate having a major surface, an insulating film, a capacitor lower electrode, a dielectric film and a capacitor upper electrode. The insulating film is formed on the major surface of the semiconductor substrate to extend from the memory cell region to the peripheral circuit region. The capacitor lower electrode, including first and second capacitor lower electrodes, is formed on the major surface of the semiconductor device to extend to a vertical position substantially identical to that of an upper surface of the insulating film. The first and second capacitor lower electrodes are adjacent to each other through a part of the insulating film. The capacitor upper electrode is formed on the capacitor lower electrode through the dielectric film, to extend toward the upper surface of the insulating film. The capacitor lower electrode includes a capacitor lower electrode part upwardly extending in opposition to the capacitor upper electrode and having a top surface and a bottom surface. The part of the insulating film has a width which is smaller than the minimum working size formable by photolithography.

Thus, the overall capacitor lower electrode is embedded in the insulating film. Therefore, formation of a step resulting from the capacitor lower electrode can be prevented on the upper surface of the insulating film formed in the memory cell region and the peripheral circuit region. In case of forming an interlayer isolation film on the capacitor lower electrode part and the insulating film, therefore, formation of a step on an upper surface of the interlayer isolation film can be prevented between the memory cell region and the peripheral circuit region. In case of forming a wiring layer on the interlayer isolation film by photolithography, the pattern of this wiring layer can consequently be prevented from being blurred by such a step on the upper surface of the interlayer isolation film. Thus, the wiring layer can be prevented from disconnection or shorting resulting from a blurred pattern. Consequently, the semiconductor device can be implemented with higher density of integration while ensuring the capacitance of the capacitor and attaining high reliability.

The width of the part of the insulating film provided between the first and second capacitor lower electrodes is smaller than the minimum working size formable by photolithography, whereby the distance between the first and second capacitor lower electrodes can be reduced as compared with the prior art. Consequently, the semiconductor device can be implemented with higher density of integration.

In the structure of the semiconductor device according to the second aspect of the present invention, a side surface of the capacitor lower electrode may have a curved plane.

Thus, the surface area of the side surface of the capacitor lower electrode can be increased as compared with a flat side surface of a conventional capacitor lower electrode. Therefore, the occupied area of the capacitor can be reduced while ensuring a constant capacitor capacitance. Consequently, the semiconductor device can be further refined.

In the structure of the semiconductor device according to the second aspect of the present invention, the insulating film may include upper and lower insulating films which are different in etching rate from each other.

In case of carrying out a step of reducing the width of the part of the insulating film to be smaller than the minimum working size formable by photolithography through etching in a fabrication step described later, therefore, only a part of a side surface of the lower insulating film forming the part of the insulating film can be removed by etching through an etching condition for selectively removing the lower insulating film. Thus, the width of the part of the insulating film can be reduced while leaving the upper insulating film substantially unetched. In the etching step of reducing the width of the part of the insulating film, therefore, an upper surface of the upper insulating film can be prevented from being removed by etching. Consequently, the vertical position of a side surface of the capacitor lower electrode formed in a later step can be prevented from being lowered. As a result, the surface area of the capacitor lower electrode can be prevented from being reduced, thereby preventing reduction of the capacitance of the capacitor.

In the structure according to the first or second aspect of the present invention, the semiconductor device may comprise the dielectric film which is formed between at least either the side surface or only a part of the bottom surface of the capacitor lower electrode part and the insulating film. Thus, the side surface or the part of the bottom surface of the capacitor lower electrode part can be utilized as a capacitor. Therefore, the capacitance of the capacitor can be increased without changing the shape of the capacitor lower electrode.

In a step of fabricating the semiconductor device, a clearance is defined in a region for forming the dielectric film, in order to form the dielectric film between at least either the side surface or the part of the bottom surface of the capacitor lower electrode part and the insulating film. In the step of defining the clearance, another part of the bottom surface of the capacitor lower electrode part can be kept in contact with another layer such as the insulating film. In case of cleaning the semiconductor substrate provided with the semiconductor device while defining the clearance, therefore, the insulating film or the like which is in contact with the other part of the bottom surface of the capacitor lower electrode part serves as a reinforcing member against a physical impact or the like. Thus, the capacitor lower electrode can be prevented from partial breaking caused by an impact such as vibration in the cleaning step. Consequently, the semiconductor device can be prevented from a malfunction resulting from a defect such as partial breaking of the capacitor lower electrode, and a highly reliably semiconductor device can be obtained.

In the structure according to the first or second aspect of the present invention, the semiconductor device may comprise granular crystals at least on a part of the surface of the capacitor lower electrode or the side wall electrode part. Thus, the surface area of the capacitor lower electrode can be increased without increasing its occupied area. Therefore, the capacitance of the capacitor can be increased. Thus, the occupied area of the capacitor lower electrode can be reduced as compared with the prior art while ensuring the capacitance of the capacitor. Consequently, the semiconductor device can be further refined.

In a method of fabricating a semiconductor device including a memory cell region and a peripheral circuit region according to a third aspect of the present invention, an insulating film having an upper surface is first formed on a major surface of a semiconductor substrate to extend from the memory cell region to the peripheral circuit region. Then, the insulating film is partially removed by etching in the memory region, thereby forming an opening. Then, a capacitor lower electrode is formed in the opening on the major surface of the semiconductor substrate. Then, a capacitor upper electrode is formed on the capacitor lower electrode through a dielectric film, to extend onto the upper surface of the insulating film. The step of forming the capacitor lower electrode includes a step of forming a capacitor lower electrode part upwardly extending in opposition to the capacitor upper electrode and having a top surface and a bottom surface. The step of forming the insulating film includes a step of locating the upper surface of the insulating film between the top surface and the bottom surface of the capacitor lower electrode.

Thus, the capacitor lower electrode can be partially embedded in the insulating film. Thus, the difference between the vertical positions of the upper surface of the insulating film extending from the memory cell region to the peripheral circuit region and the top surface of the capacitor lower electrode part in the memory cell region can be reduced as compared with the prior art. In case of forming an interlayer isolation film on the capacitor lower electrode part and the insulating film, therefore, a step on an upper surface of the interlayer isolation film can be reduced between the memory cell region and the peripheral circuit region. In case of forming a wiring layer on the interlayer isolation film by photolithography, the pattern of this wiring layer can consequently be prevented from being blurred by such a step on the upper surface of the interlayer isolation film. Thus, the wiring layer can be prevented from disconnection or shorting resulting from a blurred pattern. Consequently, the semiconductor device can be implemented with higher density of integration while ensuring the capacitance of the capacitor and attaining high reliability.

The capacitor lower electrode can be partially embedded in the insulating film, whereby the capacitor upper electrode can be formed on an outer side surface of the capacitor lower electrode part located between the top surface of the capacitor lower electrode part and the upper surface of the insulating film through the dielectric film. Thus, the outer side surface of the capacitor lower electrode part can be utilized as a capacitor, thereby increasing the capacitance of the capacitor.

Further, the area of the outer side surface of the capacitor lower electrode part utilized as a capacitor can be changed by changing the position of the upper surface of the insulating film. Thus, the capacitance of the capacitor can be controlled without changing the shape of the capacitor lower electrode.

In the method of fabricating a semiconductor device according to the third aspect of the present invention, the step of forming the insulating film may include steps of forming a lower insulating film and forming an upper insulating film which is different in etching rate from the lower insulating film on the lower insulating film. The step of locating the upper surface of the insulating film between the top surface and the bottom surface of the capacitor lower electrode part may include a step of removing the upper insulating film.

Thus, the position of the upper surface of the insulating film can be arbitrarily changed by changing the thickness of the upper insulating film. Therefore, the area of the outer side surface of the capacitor lower electrode part utilized as a capacitor can be changed. Consequently, the capacitance of the capacitor can be changed without changing the shape of the capacitor lower electrode.

In the method of fabricating a semiconductor device according to the third aspect of the present invention, the step of locating the upper surface of the insulating film between the top surface and the bottom surface of the capacitor lower electrode part may include a step of partially removing the insulating film by etching.

Thus, the position of the upper surface of the insulating film can be arbitrarily changed by changing the thickness of the part of the insulating film removed by etching in the step of partially removing the insulating film by etching. Therefore, the area of the outer side surface of the capacitor lower electrode part utilized as a capacitor can be changed. Consequently, the capacitance of the capacitor can be changed without changing the shape of the capacitor lower electrode.

In the method of fabricating a semiconductor device according to the third aspect of the present invention, a conductive region may be formed on the major surface of the semiconductor substrate in a region located under the capacitor lower electrode. Then, an interlayer isolation film may be formed on the conductive region, and a wiring layer may be formed on the interlayer isolation film. A wire protection film may be formed on the wiring layer, and a contact hole may be formed by removing at least a part of the interlayer isolation film by etching, in order to electrically connect the conductive region with the capacitor lower electrode. The wire protection film may be employed as a part of a mask employed for etching in the step of forming the contact hole.

Thus, a step of forming a resist pattern independently employed as a mask for forming the contact hole can be omitted. Thus, the number of fabrication steps for the semiconductor device can be reduced.

The foregoing and other objects, features, aspects of the present invention and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(Embodiment 1)

Figure 1:
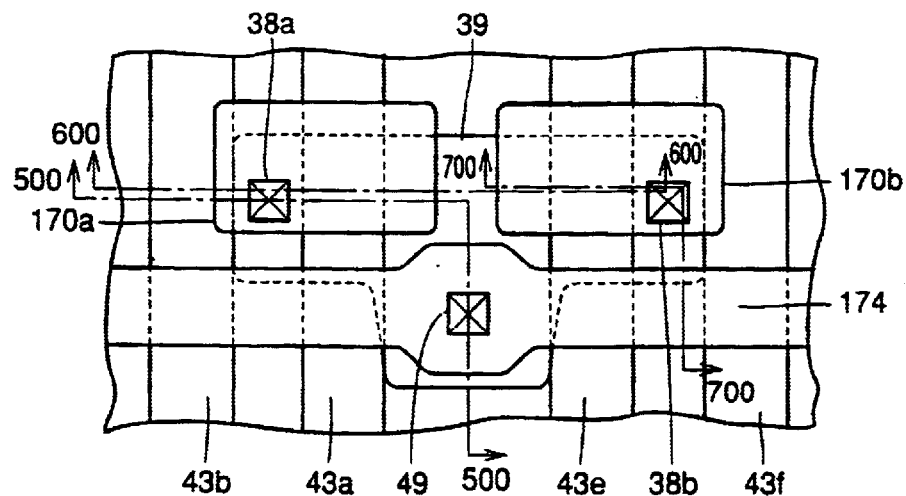
FIG. 1 is a typical plan view showing a memory cell region of a DRAM according to an embodiment 1 of the present invention.
Figure 2:
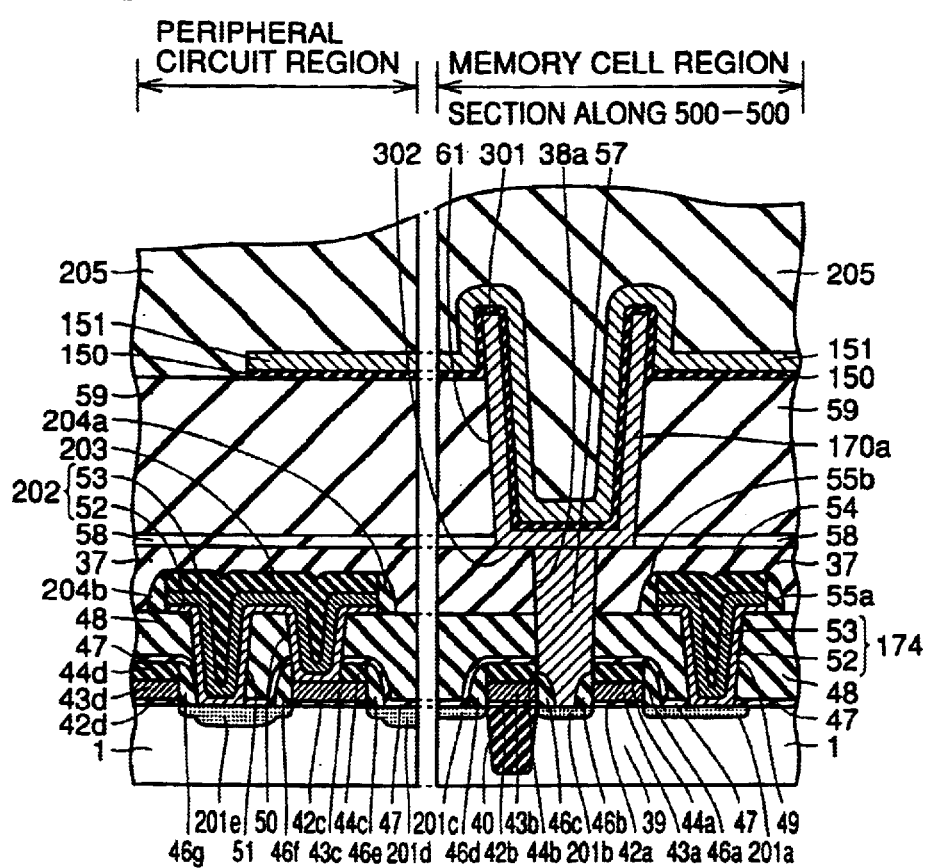
FIG. 2 is a sectional view showing the memory cell region and a peripheral circuit region of the DRAM according to the embodiment 1 of the present invention.

Referring to FIG. 1, a memory cell region of a DRAM according to an embodiment 1 of the present invention includes an active region 39 formed on a major surface of a semiconductor substrate, word lines 43a, 43b, 43e and 43f formed on the major surface of the semiconductor substrate for serving also as gate electrodes of field-effect transistors, a bit line 174, and a capacitor including capacitor lower electrodes 170a and 170b. The bit line 174 is electrically connected with the active region 39 through a contact hole 49. FIG. 2 is a sectional view of this memory cell region taken along the line 500—500 in FIG. 1.

With reference to FIG. 2, the structure of the DRAM according to the embodiment 1 of the present invention is now described.

Referring to FIG. 2, source/drain regions 201a to 201c of the field-effect transistors are formed on the active region 39 enclosed with a trench isolation oxide film 40 in the memory cell region of the DRAM according to the embodiment 1 of the present invention. A gate electrode 43a is formed on a channel region held between the pair of source/drain regions 201a and 201b through a gate insulating film 42a. The gate insulating film 42a is formed by a thermal oxide film, a silicon nitride film or an oxi-nitride film. The gate electrode 43a may be formed by a film of refractory metal such as tungsten or titanium, or a film of polysilicon or amorphous silicon doped with phosphorus or arsenic, or a silicide film thereof, or may be in a multilayer structure obtained by overlapping these materials with each other. A silicon nitride film 44a is formed on the gate electrode 43a. Side walls 46a and 46b consisting of silicon nitride films are formed on side surfaces of the gate electrode 43a and the silicon nitride film 44a. A non-doped silicon oxide film 47 is formed on the side wall 46a and the silicon nitride film 44a.

A gate electrode 43b is formed on the trench isolation oxide film 40 through a gate insulating film 42b. A silicon nitride film 44b is formed on the gate electrode 43b. Side walls 46c and 46d consisting of silicon nitride films are formed on side surfaces of the gate electrode 43b and the silicon nitride film 44b. The non-doped silicon oxide film 47 is formed on the side wall 46d and the silicon nitride film 44b. A first interlayer isolation film 48 is formed on the non-doped silicon oxide film 47. The first interlayer isolation film 48 and the non-doped silicon oxide film 47 are partially removed by etching, thereby forming a contact hole 49. A doped polysilicon film 52 is formed in the contact hole 49 and on the first interlayer isolation film 48. A refractory metal silicide film 53 is formed on the doped polysilicon film 52. The doped polysilicon film 52 and the refractory metal silicide film 53 form the bit line 174. A silicon nitride film 54 is formed on the refractory metal silicide film 53. Side walls 55a and 55b consisting of silicon nitride films are formed on side surfaces of the silicon nitride film 54, the refractory metal silicide film 53 and the doped polysilicon film 52. A second interlayer isolation film 37 is formed on the first interlayer isolation film 48, the side walls 55a and 55b and the silicon nitride film 54.

The first and second interlayer isolation films 48 and 37 and the non-doped silicon oxide film 47 are partially removed, thereby forming a contact hole 38a for electrically connecting the capacitor lower electrode 170a with one of the source/drain regions 201a and 201b. A plug 57 consisting of doped polysilicon is formed in the contact hole 38a. A silicon nitride film 58 is formed on the second interlayer isolation film 37. The capacitor lower electrode 170a is formed on the plug 57 and the second interlayer isolation film 37. This capacitor lower electrode 170a has a cylindrical structure, in order to ensure the capacitance of the capacitor with a small occupied area. A third interlayer isolation film 59 is formed on the silicon nitride film 58 and side surfaces of the capacitor lower electrode 170a. An upper surface of the third interlayer isolation film 59 is formed to be located between a top surface 301 and a bottom surface 302 of a capacitor lower electrode part which is a side surface portion of the cylindrical capacitor lower electrode 170a. A dielectric film 150 is formed on the capacitor lower electrode 170a and the third interlayer isolation film 59. A capacitor upper electrode 151 is formed on the dielectric film 150. A fourth interlayer isolation film 205 is formed on the capacitor upper electrode 151.

In the peripheral circuit region of the DRAM according to the embodiment 1 of the present invention, a field-effect transistor and a wiring layer 202 are formed on the major surface of the semiconductor substrate 1. In more concrete terms, source/drain regions 201d and 201e are formed on the major surface of the semiconductor substrate 1. Gate electrodes 43c and 43d are formed on channel regions which are adjacent to the source/drain regions 201d and 201e through gate insulating films 42c and 42d. Silicon nitride films 44c and 44d are formed on the gate electrodes 43c and 43d. Side walls 46e to 46g consisting of silicon nitride films are formed on side surfaces of the gate electrodes 43c and 43d and the silicon nitride films 44c and 44d. The non-doped silicon oxide film 47 is formed on the major surface of the semiconductor substrate 1, the silicon nitride films 44c and 44d and the side walls 46e to 46g. The first interlayer isolation film 48 is formed on the non-doped silicon oxide film 47. The first interlayer isolation film 48, the non-doped silicon oxide film 47 and the silicon nitride film 44c are partially removed, thereby forming contact holes 50 and 51. The doped polysilicon film 52 is formed on the first interlayer isolation film 48 and in the contact holes 50 and 51. The refractory metal silicide film 53 is formed on the doped polysilicon film 52. The doped polysilicon film 52 and the refractory metal silicide film 53 form the wiring layer 202 in the peripheral circuit region.

A silicon nitride film 203 is formed on the refractory metal silicide film 53. Side walls 204a and 204b consisting of silicon nitride films are formed on side surfaces of the silicon nitride film 203 and the wiring layer 202. The second interlayer isolation film 37 is formed on the first interlayer isolation film 48, the silicon nitride film 203 and the side walls 204a and 204b. The silicon nitride film 58 is formed on the second interlayer isolation film 37. The third interlayer isolation film 59 is formed on the silicon nitride film 58. The dielectric film 150 of the capacitor extending from the memory cell region is formed on the third interlayer isolation film 59. The capacitor upper electrode 151 is formed on the dielectric film 150. The fourth interlayer isolation film 205 is formed on the third interlayer isolation film 59 and the capacitor upper electrode 151, to extend from the memory cell region.

Thus, the capacitor lower electrode 170a is partially embedded in the third interlayer isolation film 59 in the DRAM according to the embodiment 1 of the present invention. Therefore, the difference between the vertical positions of the upper surface of the third interlayer isolation film 59 and the top surface 301 of the capacitor lower electrode 170a can be reduced. In case of forming the fourth interlayer isolation film 205, therefore, a step on an upper surface of the fourth interlayer isolation film 205 between the memory cell region and the peripheral circuit region can be reduced as compared with the prior art. In case of forming a wiring layer consisting of aluminum or the like on the fourth interlayer isolation film 205, therefore, the pattern of this wiring layer can be prevented from being blurred by such a step on the upper surface of the fourth interlayer isolation film 205. Thus, this wiring layer can be prevented from disconnection or shorting resulting from an unclear pattern. Consequently, the semiconductor device can be implemented with higher density of integration while ensuring the capacitance of the capacitor and attaining high reliability.

In the DRAM according to the embodiment 1 of the present invention, further, the capacitor lower electrode 170a is partially embedded in the third interlayer isolation film 59, whereby the dielectric film 150 and the capacitor upper electrode 151 can be formed also on outer side surfaces of the capacitor lower electrode 170a. Therefore, the outer side surfaces of the capacitor lower electrode 170a can also be utilized as the capacitor, whereby the capacitance of the capacitor can be increased.

Further, the areas of the outer side surfaces of the capacitor lower electrode 170a utilized as the capacitor can be changed by changing the position of the upper surface of the third interlayer isolation film 59. Thus, the capacitance of the capacitor can be changed without changing the shape of the capacitor lower electrode 170a.

With reference to FIGS. 3 to 13, steps of fabricating the DRAM according to the embodiment 1 of the present invention are now described.

Figure 3:
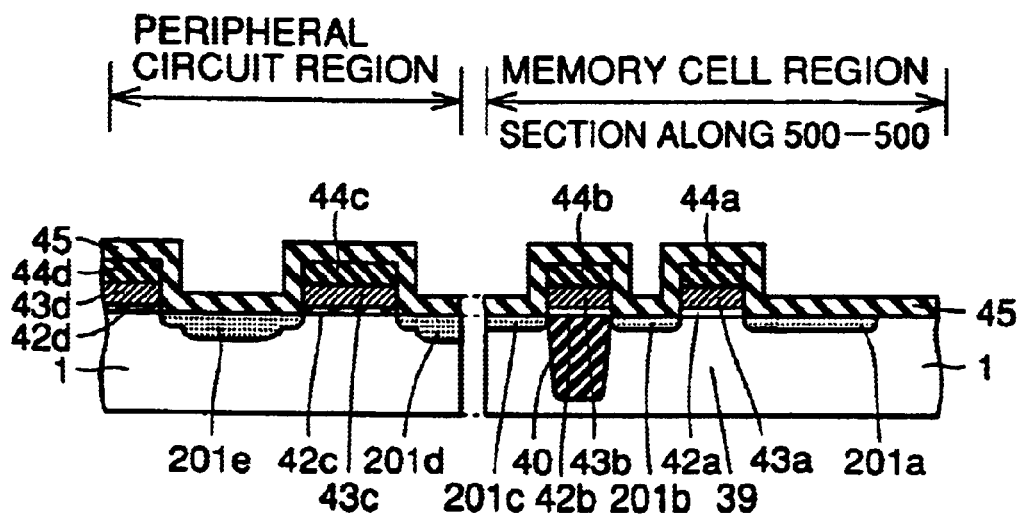
FIGS. 3 to 13 are sectional views for illustrating first to eleventh steps of a method of fabricating the DRAM according to the embodiment 1 of the present invention shown in FIG. 2.

Referring to FIG. 3, the trench isolation oxide film 40 is formed on the major surface of the semiconductor substrate 1 in the memory cell region of the DRAM according to the embodiment 1 of the present invention. An insulating film (not shown) for defining the gate insulating films 42a and 42b is formed on the major surface of the semiconductor substrate 1. A polysilicon film (not shown) is formed on this insulating film. A silicon nitride film (not shown) is formed on this polysilicon film. A resist pattern (not shown) is formed on this silicon nitride film, and thereafter employed as a mask for partially removing the insulating film, the doped polysilicon film and the silicon nitride film by anisotropic etching. Thereafter the resist pattern is removed, thereby forming the gate insulating films 42a and 42b, the gate electrodes 43a and 43b and the silicon nitride films 44a and 44b shown in FIG. 3. An impurity is injected into the active region 39 of the semiconductor substrate 1 through the silicon nitride films 44a and 44b serving as masks, thereby forming the source/drain regions 201a to 201c of the field-effect transistors. Thereafter the overall surface of the semiconductor substrate 1 is oxidized in a dry atmosphere at a temperature of not more than 900° C., thereby forming an oxide film (not shown) having a thickness of about 50 to 100 Å on the side surfaces of the silicon nitride films 44a and 44b and the gate electrodes 43a and 43b and the major surface of the semiconductor substrate 1. Thereafter the silicon nitride film 45 is formed to cover the overall surface.

Also in the peripheral circuit region, the source/drain regions 201d and 201e of the field effect transistor, the gate insulating films 42c and 42d, the gate electrodes 43c and 43d and the silicon nitride films 42c, 42d and 45 are formed on the semiconductor substrate 1 through steps similar to those carried out in the memory cell region.

Figure 4:
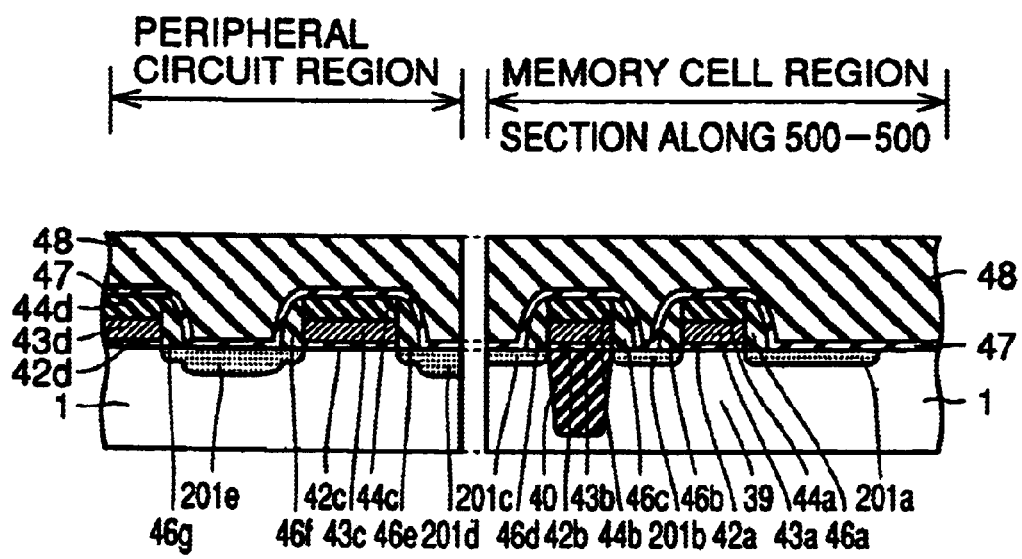

Then, the silicon nitride film 45 is partially removed by anisotropic etching, thereby forming the side walls 46a to 46g on the side surfaces of the silicon nitride films 44a to 44d, the gate electrodes 43a to 43d and the gate insulating films 42a to 42d. The non-doped silicon oxide film 47 is formed to cover the overall surface, as shown in FIG. 4. The first interlayer isolation film 48 consisting of a phosphorus-doped silicon oxide film is formed on the non-doped silicon oxide film 47. The non-doped silicon oxide film 47 and the first interlayer isolation film 48 consisting of the phosphorus-doped silicon oxide film are formed by low-pressure or ordinary-pressure CVD. While the non-doped silicon oxide film 47 and the first interlayer isolation film 48 consisting of the phosphorus-doped silicon oxide film are formed in this step, the first interlayer isolation film 48 may be formed by either material. After formation of the first interlayer isolation film 48, its surface is flattened by chemical mechanical polishing (CMP) or a reflow method.

Figure 5:
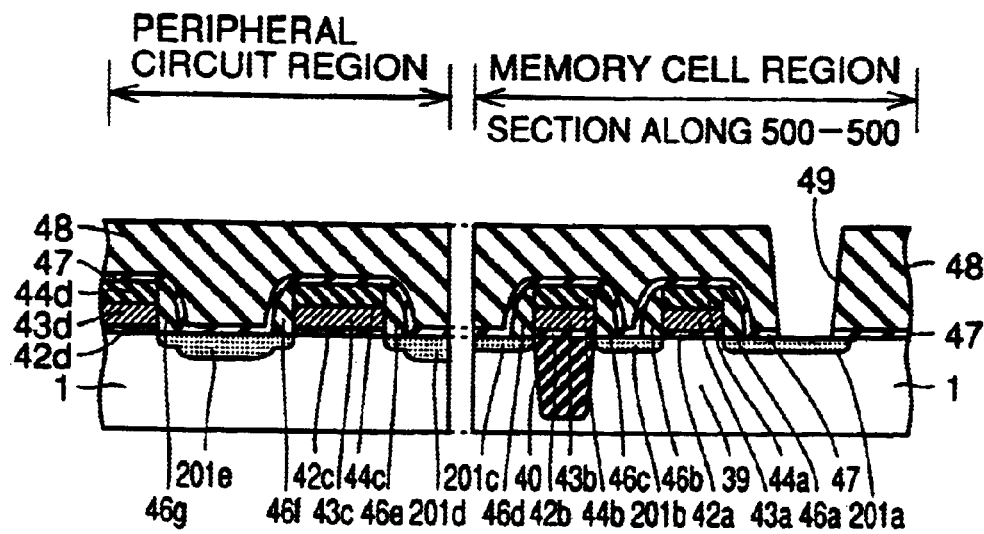

Then, a resist pattern (not shown) is formed on the first interlayer isolation film 48 and thereafter employed as a mask for partially removing the first interlayer isolation film 48 and the non-doped silicon oxide film 47 by etching, thereby forming the contact hole 49 as shown in FIG. 5. In this step, the contact hole 49 may be formed in a self-alignment manner through the silicon nitride film 44a formed on the gate electrode 43a and the side wall 46a serving as parts of the mask for etching.

Figure 6:
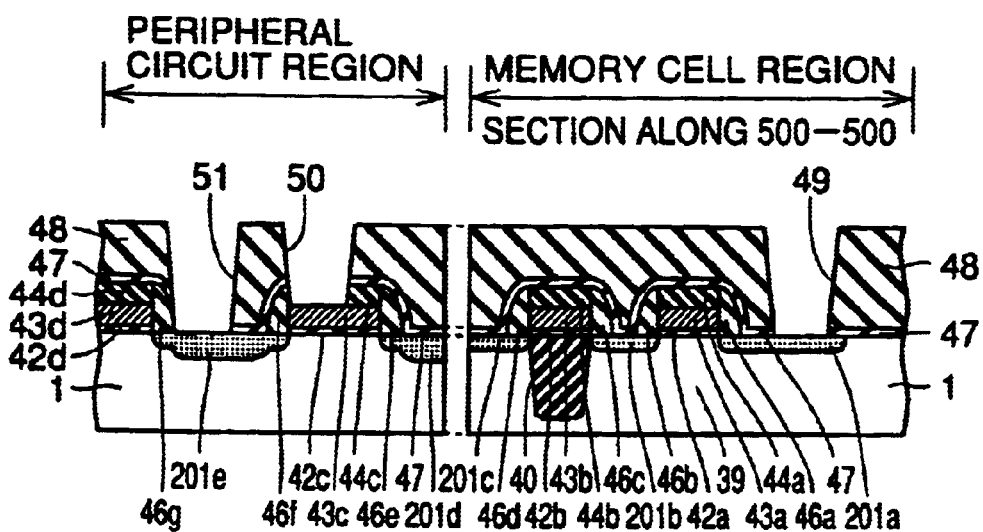

Then, a resist pattern (not shown) is formed on the first interlayer isolation film 48 in the peripheral circuit region and thereafter employed as a mask for partially removing the first interlayer isolation film 48, the non-doped silicon oxide film 47 and the silicon nitride film 44c, thereby forming the contact holes 50 and 51 as shown in FIG. 6. Thereafter the resist pattern is removed.

Figure 7:
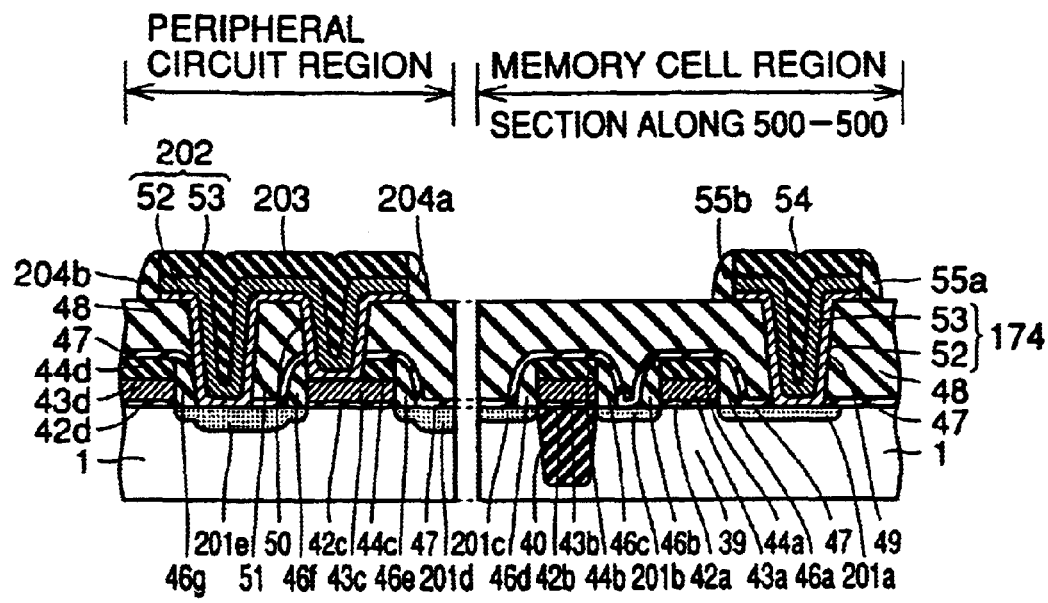

Then, a doped polysilicon film (not shown) is formed in the contact holes 49, 50 and 51 and on the first interlayer isolation film 48. A refractory metal silicide film (not shown) is formed on the doped polysilicon film. A silicon nitride film (not shown) is formed on the refractory metal silicide film. A resist pattern (not shown) is formed on the silicon nitride film, and employed as a mask for partially removing the silicon nitride film, the refractory metal silicide film and the doped polysilicon film by etching, thereby forming the doped polysilicon film 52 and the refractory metal silicide film 53 forming the bit line 174 and the silicon nitride film 54, as shown in FIG. 7. Further, the doped polysilicon film 52 and the refractory metal silicide film 53 forming the wiring layer 202 in the peripheral circuit region and the silicon nitride film 203 are formed in a similar manner. Then, a silicon nitride film (not shown) is formed to cover the overall surface and thereafter partially removed by anisotropic etching, thereby forming the side walls 55a, 55b, 204a and 204b. Thus, the structure shown in FIG. 7 is obtained.

Figure 8:
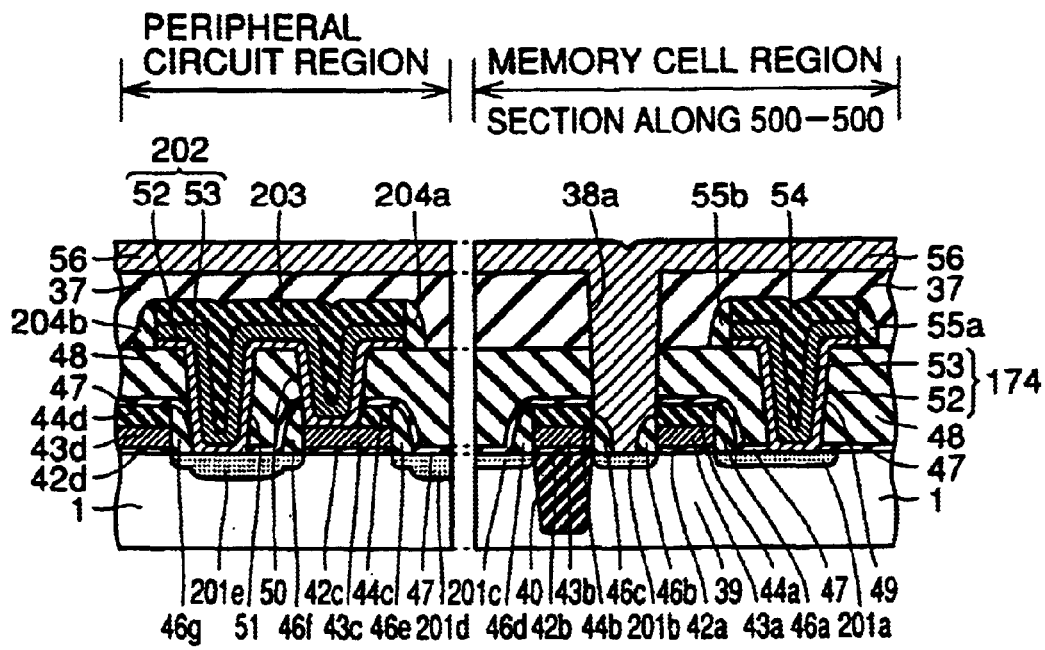

Then, the second interlayer isolation film 37 (see FIG. 8) consisting of the phosphorus-doped silicon oxide film is formed on the first interlayer isolation film 48, the silicon nitride films 54 and 203 and the side walls 55a, 55b, 204a and 204b. A resist pattern (not shown) is formed on the second interlayer isolation film 37 and thereafter employed as a mask for partially removing the second interlayer isolation film 37, the first interlayer isolation film 48 and the non-doped silicon oxide film 47 by etching, thereby forming the contact hole 38a (see FIG. 8). The contact hole 38a may be formed by reactive ion etching (hereinafter referred to as RIE). Further, the side walls 46b and 46c may be employed as parts of the mask for forming the contact hole 38a in a self-alignment manner. Thereafter the polysilicon film 56 is formed in the contact hole 38a and on the second interlayer isolation film 37 by CVD. The polysilicon film 56 may be replaced with an amorphous silicon film. Thus, the structure shown in FIG. 8 is obtained.

Figure 9:
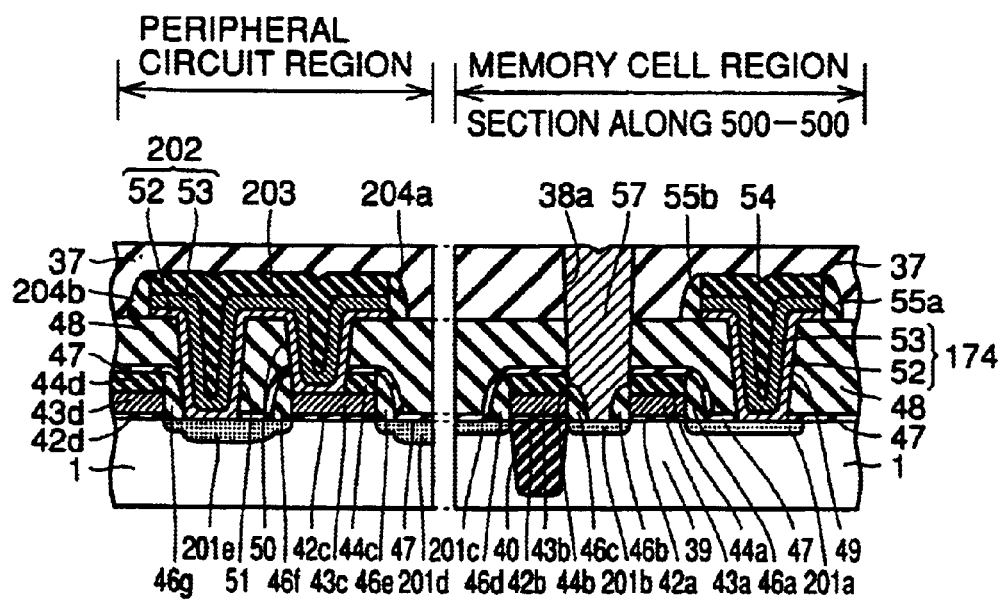

Then, the polysilicon film 56 located on the second interlayer isolation film 37 is removed by CMP or dry etching. Thus, the structure shown in FIG. 9 is obtained.

Figure 10:
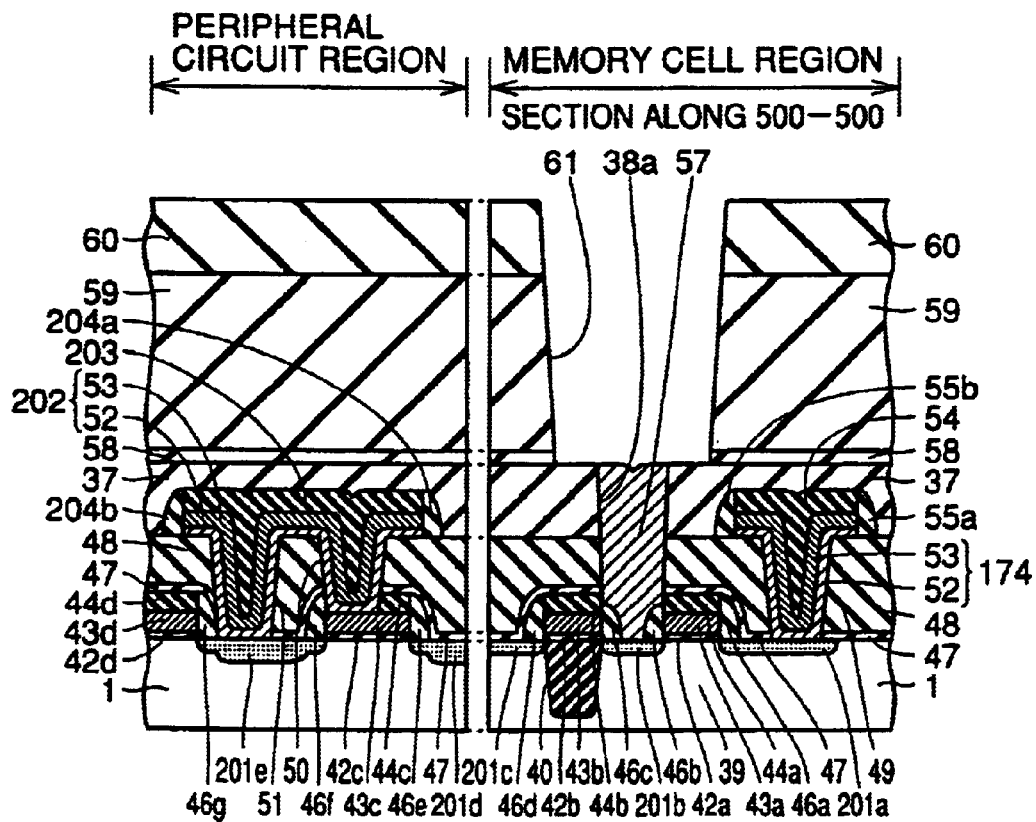

Then, the silicon nitride film 58 (see FIG. 10) is formed to cover the overall surface. The third interlayer isolation film 59 (see FIG. 10) consisting of a silicon oxide film is formed on the silicon nitride film 58. A boron-doped silicon oxide film 60 (see FIG. 10) is formed on the third interlayer isolation film 59. The boron-doped silicon oxide film 60 may be replaced with a phosphorus-doped silicon oxide film. A resist pattern (not shown) is formed on the boron-doped silicon oxide film 60 and thereafter employed as a mask for partially removing the boron-doped silicon oxide film 60 and the third interlayer isolation film 59, thereby forming an opening 61 (see FIG. 10). A part of the silicon nitride film 58 located on a bottom portion of the opening 61 is removed with a phosphoric acid solution or by dry etching. Thereafter the resist pattern is removed. Thus, the structure shown in FIG. 10 is obtained. The opening 61 may be formed by RIE.

Figure 11:
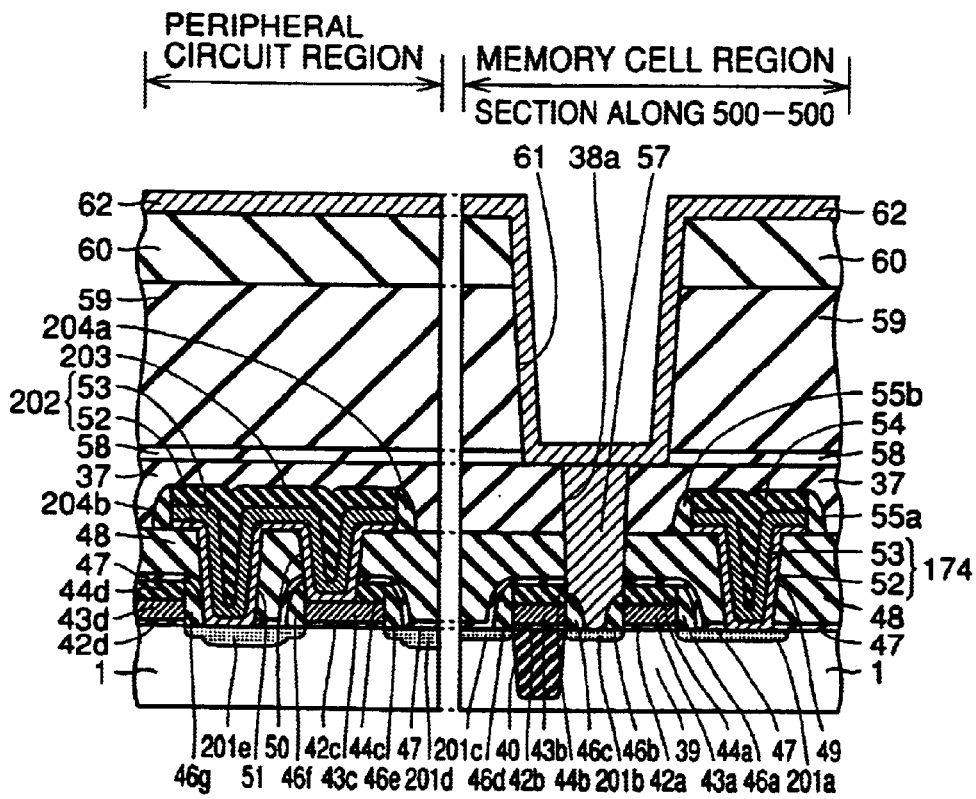

Then, a polysilicon film 62 (see FIG. 11) is formed to cover the overall surface. This polysilicon film 62 may be replaced with an amorphous silicon film. Thus, the structure shown in FIG. 11 is obtained.

Figure 12:
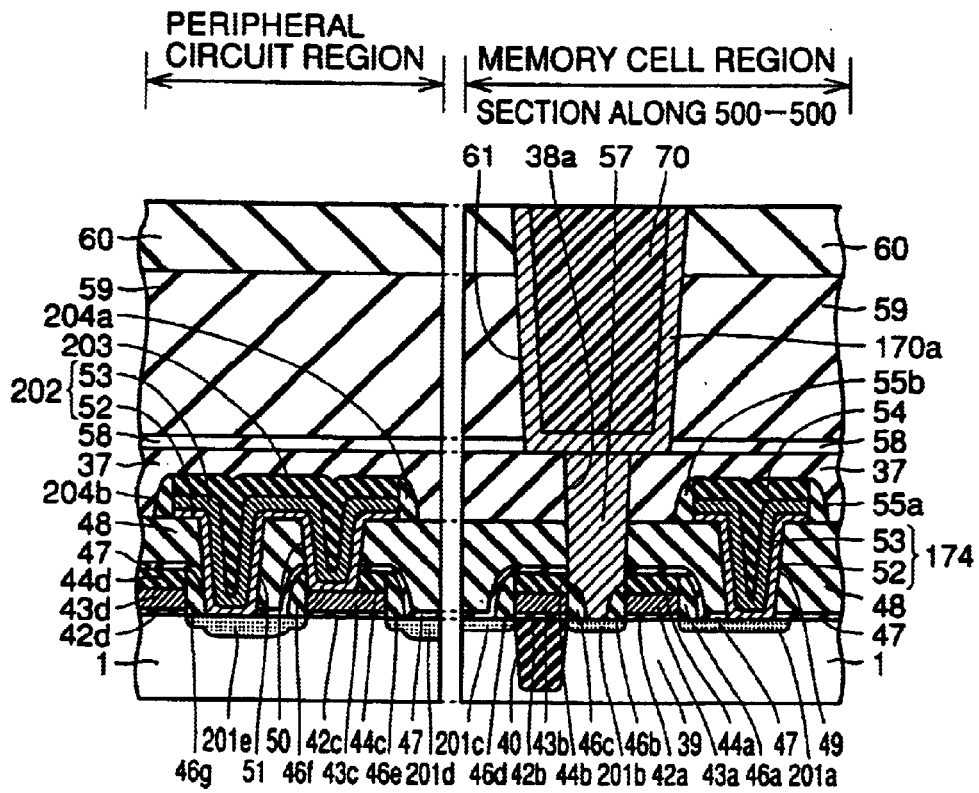

A resist 70 (see FIG. 12) is formed on the polysilicon film 62 located in the opening 61. Thereafter the polysilicon film 62 located on the boron-doped silicon oxide film 60 is removed by dry etching. Thus, the capacitor lower electrode 170a is isolated as shown in FIG. 12. The polysilicon film 62 (see FIG. 11) located on the boron-doped silicon oxide film 60 may be removed by CMP.

Figure 13:
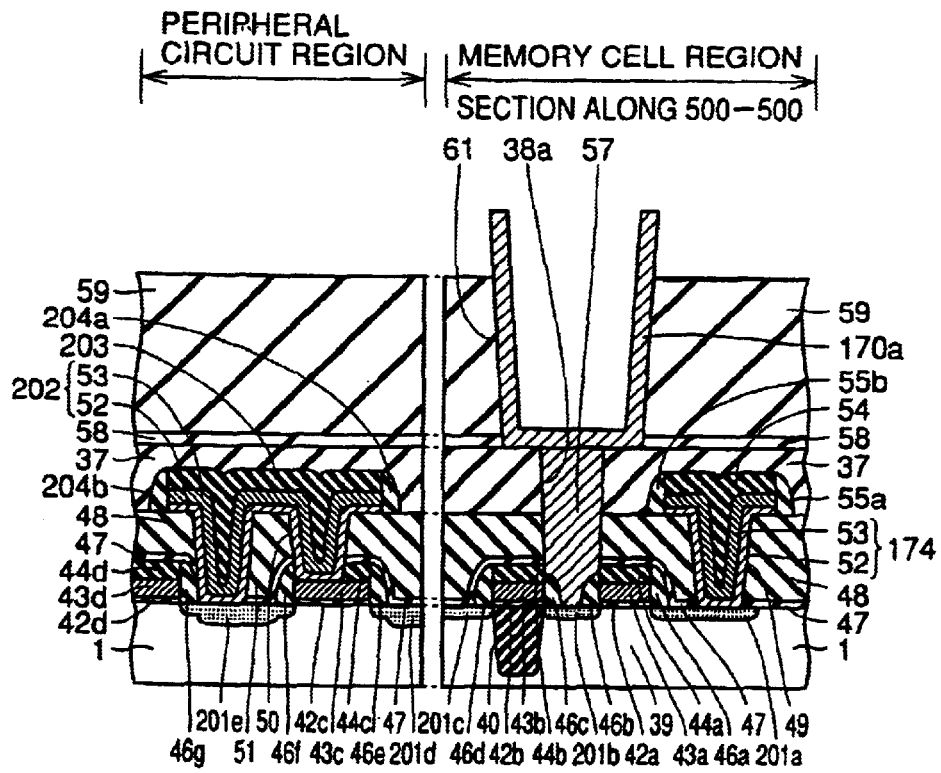

Then, the boron-doped silicon oxide film 60 is removed by vapor-phase HF, thereby obtaining the structure shown in FIG. 13. While the capacitor lower electrode 170a is prepared from polysilicon or amorphous silicon, a film consisting of a metal such as platinum or ruthenium, a refractory metal such as titanium, titanium nitride or a film consisting a plurality of layers of these materials may be employed in case of employing a high dielectric film of BST or PZT as the dielectric film 150 of the capacitor.

Thereafter the dielectric film 150 (see FIG. 2) is formed on the capacitor lower electrode 170a and the third interlayer isolation film 59. The capacitor upper electrode 151 (see FIG. 2) is formed on the dielectric film 150. The fourth interlayer isolation film 205 (see FIG. 2) is formed on the capacitor upper electrode 151 and the third interlayer isolation film 59, thereby obtaining the structure shown in FIG. 2.

Figure 14:
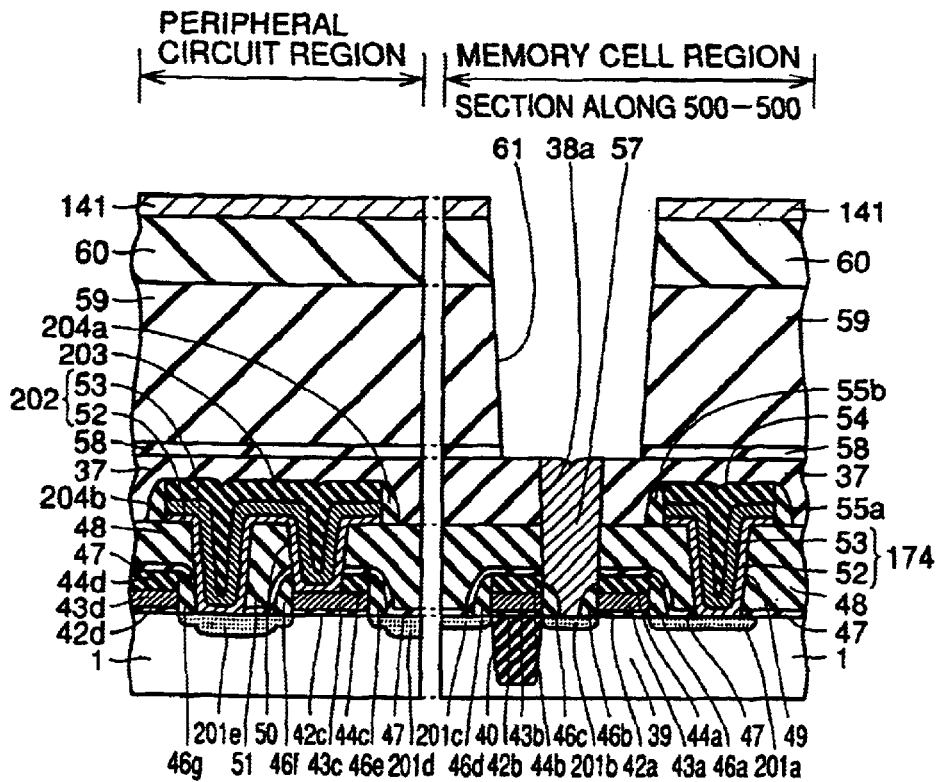
FIGS. 14 and 15 are sectional views for illustrating first and second steps of a modification of the method of fabricating the DRAM according to the embodiment 1 of the present invention shown in FIG. 2.
Figure 15:
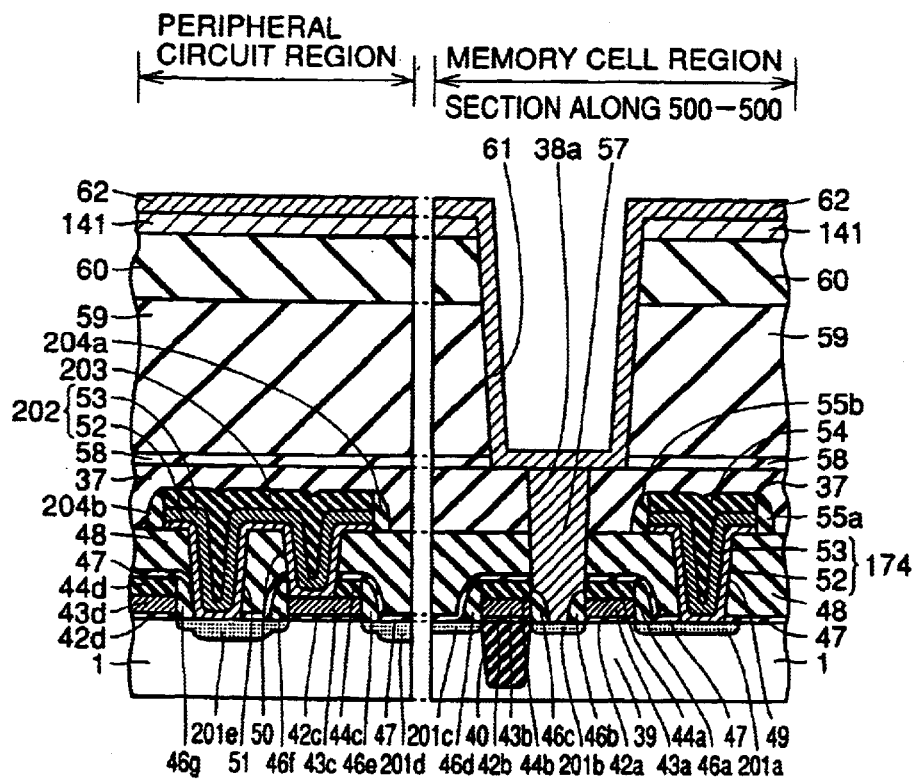

With reference to FIGS. 14 and 15, a modification of the method of fabricating the DRAM according to the embodiment 1 of the present invention is now described.

Following a fabrication step identical to the seventh step for the DRAM according to the embodiment 1 of the present invention shown in FIG. 9, the silicon nitride film 58 (see FIG. 14), the third interlayer isolation film 59 (see FIG. 14) and the boron-doped silicon oxide film 60 (see FIG. 14) are formed. Then, a polysilicon film 141 (see FIG. 14) is formed on the boron-doped silicon oxide film 60. A resist pattern (not shown) is formed on the polysilicon film 141 and employed as a mask for partially removing the polysilicon film 141 by anisotropic etching. Thereafter the resist pattern is removed. The polysilicon film 141 is employed as a mask for partially removing the boron-doped silicon oxide film 60 and the third interlayer isolation film 59, thereby forming the opening 61. The silicon nitride film 58 is removed from the bottom portion of the opening 61, thereby obtaining the structure shown in FIG. 14. A conductive film such as the polysilicon film 141 is employed as the mask for forming the opening 61 by etching, whereby a mask pattern can be formed in higher accuracy as compared with the case of employing a resist or the like for the mask. Thus, the semiconductor device can be implemented with higher density of integration.

Thereafter the polysilicon film 62 is formed in the opening 61 and on the polysilicon film 141, as shown in FIG. 15. Following this step, fabrication steps identical to those for the DRAM according to the embodiment 1 of the present invention shown in FIGS. 11 to 13 are carried out.

Figure 16:
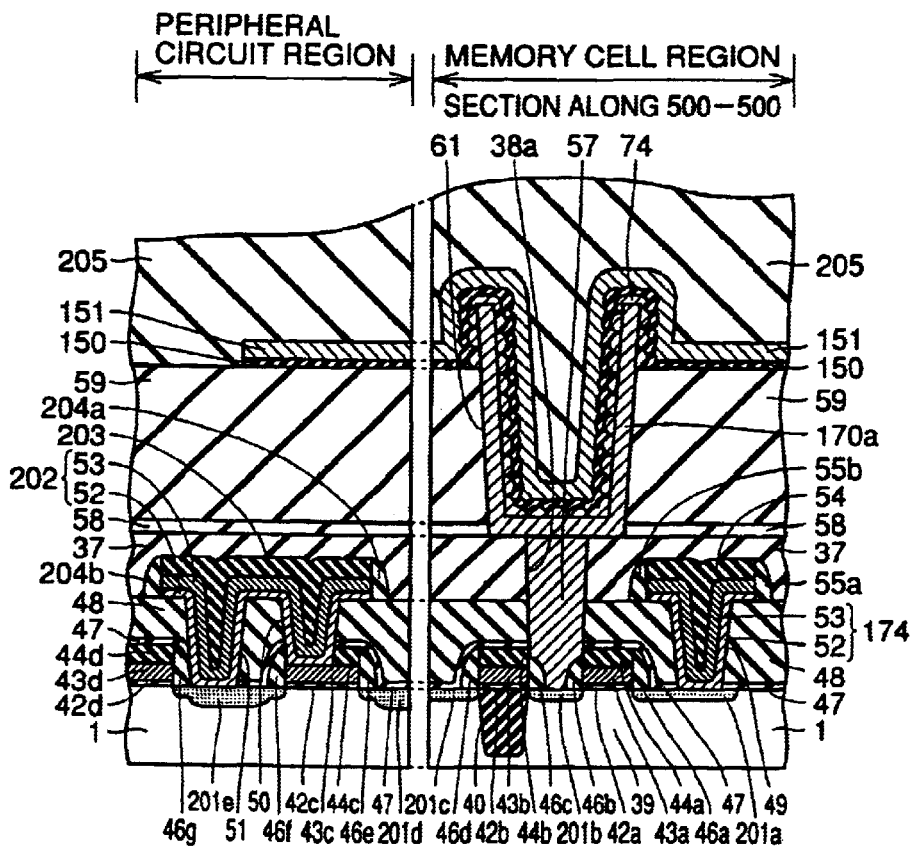
FIG. 16 is a sectional view for illustrating a first modification of the DRAM according to the embodiment 1 of the present invention.

Referring to FIG. 16, a first modification of the DRAM according to the embodiment 1 of the present invention is basically similar in structure to the DRAM according to the embodiment 1 shown in FIG. 2. In the first modification of the DRAM according to the embodiment 1 of the present invention, however, granular crystals 74 consisting of silicon are formed on surfaces of a capacitor lower electrode 170a. In order to form the granular crystals 74, the capacitor lower electrode 170a is prepared from amorphous silicon doped with phosphorus or arsenic or non-doped amorphous silicon, and nuclei of silicon are bonded to surfaces of exposed parts of the capacitor lower electrode 170a by utilizing $SiH_4$ gas as a part of atmosphere gas in a heating furnace. Thereafter $PH_3$ gas is introduced as a part of the atmosphere gas and performing annealing at a high temperature, thereby forming the granular crystals 74. In case of preparing the capacitor lower electrode 170a from non-doped amorphous silicon, phosphorus or arsenic may be introduced into the capacitor lower electrode 170a by ion implantation or a vapor phase method after forming the granular crystals 74. Due to such formation of the granular crystals 74 on the surfaces of the capacitor lower electrode 170a, the surface area of the capacitor lower electrode 170a can be increased. Thus, the capacitance of the capacitor can be increased. Therefore, the occupied area of the capacitor lower electrode 170a can be reduced while ensuring a constant capacitor capacitance. Consequently, the semiconductor device can be further refined.

In order to fabricate the first modification of the DRAM according to the embodiment 1, the granular crystals 74 are formed on the surfaces of the capacitor lower electrode 170a by the aforementioned method after a fabrication step identical to that for the DRAM according to the embodiment 1 shown in FIG. 13. Thereafter a dielectric film 150 (see FIG. 16), a capacitor upper electrode 151 (see FIG. 16) and a fourth interlayer isolation film 205 (see FIG. 16) are formed through fabrication steps identical to those for the DRAM according to the embodiment 1, thereby obtaining the structure shown in FIG. 16.

Figure 17:
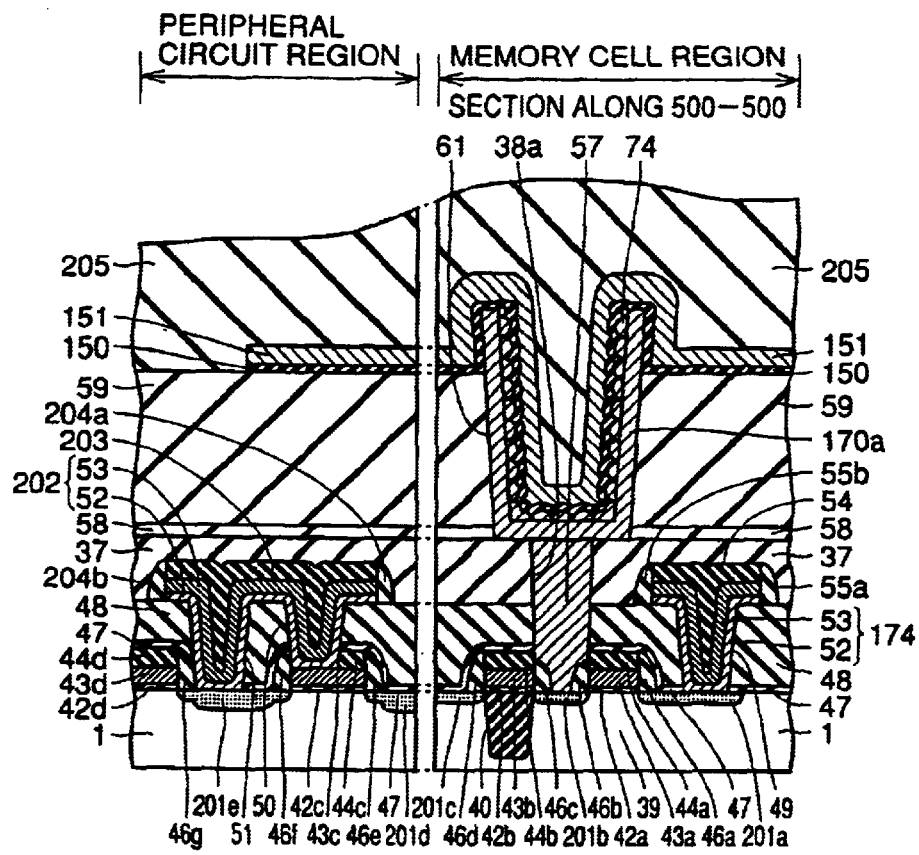
FIG. 17 is a sectional view for illustrating a second modification of the DRAM according to the embodiment 1 of the present invention.

Referring to FIG. 17, a second modification of the DRAM according to the embodiment 1 of the present invention is basically similar in structure to the DRA according to the embodiment 1 shown in FIG. 2. In the second modification, however, granular crystals 74 are formed on inner side surfaces and a bottom surface of a capacitor lower electrode 170a. Thus, the second modification of the DRAM according to the embodiment 1 is provided with the granular crystals 74 similarly to the first modification shown in FIG. 16, whereby the surface area of the capacitor lower electrode 170a can be increased. Therefore, an effect similar to that of the first modification shown in FIG. 16 can be attained.

Figure 18:
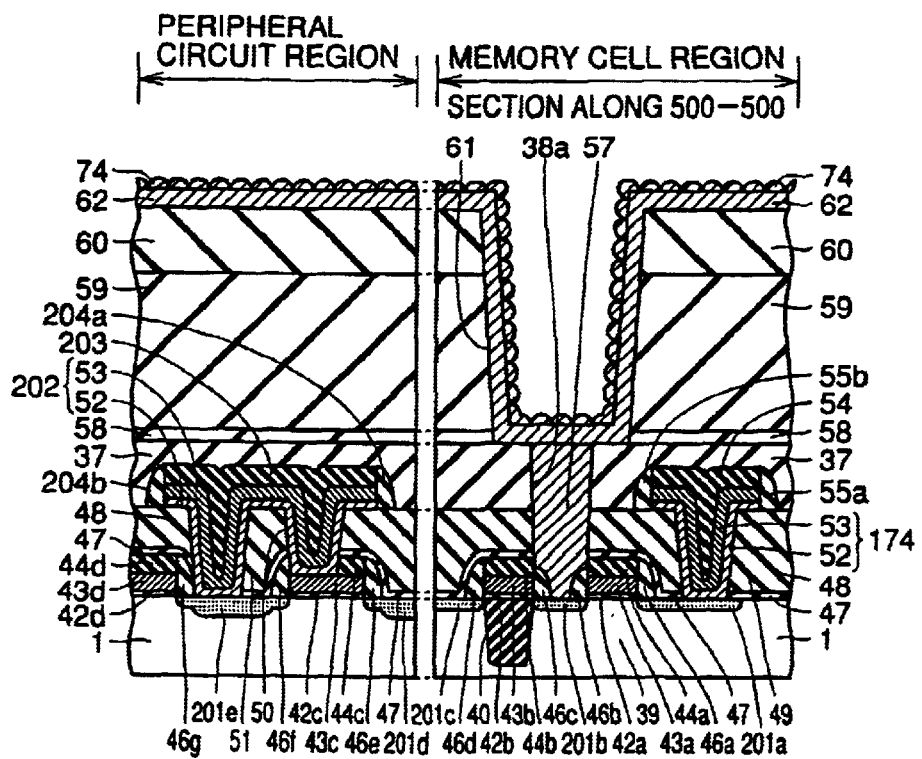
FIGS. 18 to 20 are sectional views for illustrating first to third steps of a method of fabricating the second modification of the DRAM according to the embodiment 1 of the present invention shown in FIG. 17.
Figure 19:
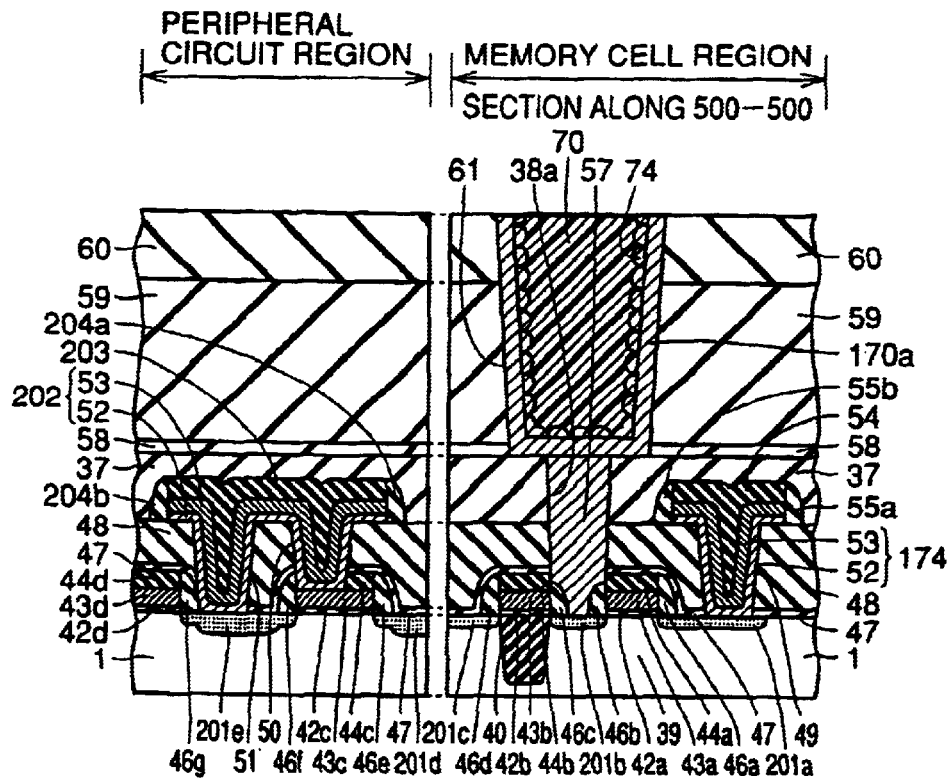
Figure 20:
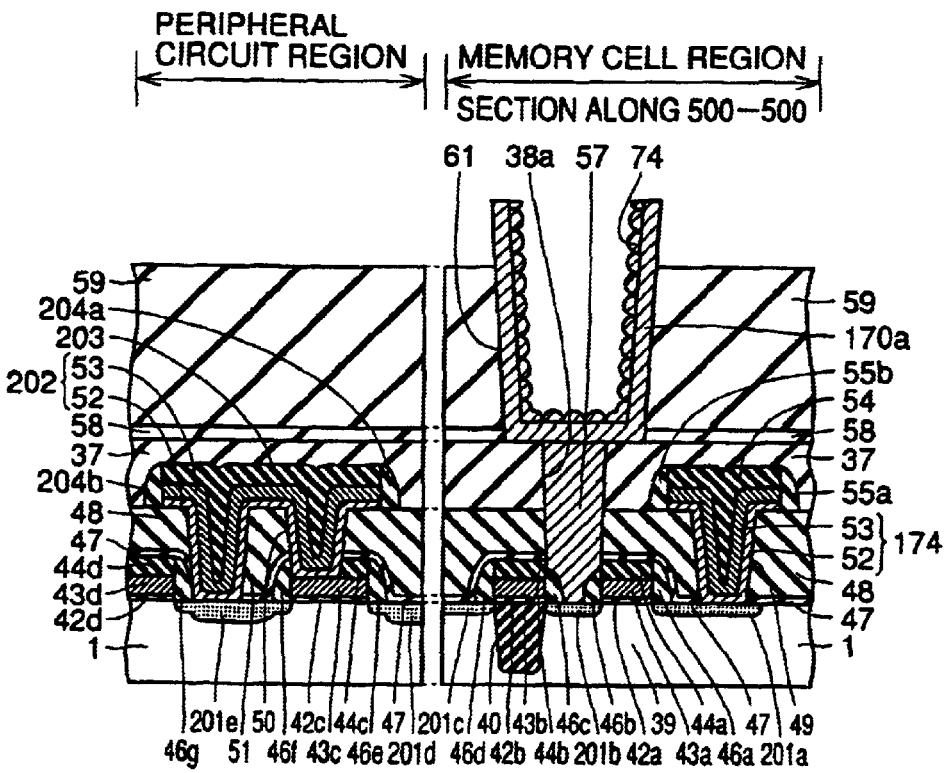

With reference to FIGS. 18 to 20, a method of fabricating the second modification of the DRAM according to the embodiment 1 of the present invention is now described.

Following a fabrication step identical to that for the DRAM according to the embodiment 1 of the present invention shown in FIG. 11, the granular crystals 74 are formed on a polysilicon film 62, as shown in FIG. 18.

Thereafter a resist 74 (see FIG. 19) is formed on the granular crystals 74 in an opening 61, and thereafter the granular crystals 74 and the polysilicon film 62 located on a boron-doped silicon oxide film 60 are removed. Thus, the structure shown in FIG. 19 is obtained.

Then, the resist 70 is removed, and the boron-doped silicon oxide film 60 is removed by vapor-phase HF. Thus, the structure shown in FIG. 20 is obtained.

Thereafter a dielectric film 150 (see FIG. 17), a capacitor upper electrode 151 (see FIG. 17) and a fourth interlayer isolation film 205 (see FIG. 17) are formed through fabrication steps similar to those for the DRAM according to the embodiment 1 of the present invention, thereby obtaining the structure shown in FIG. 17.

Figure 21:
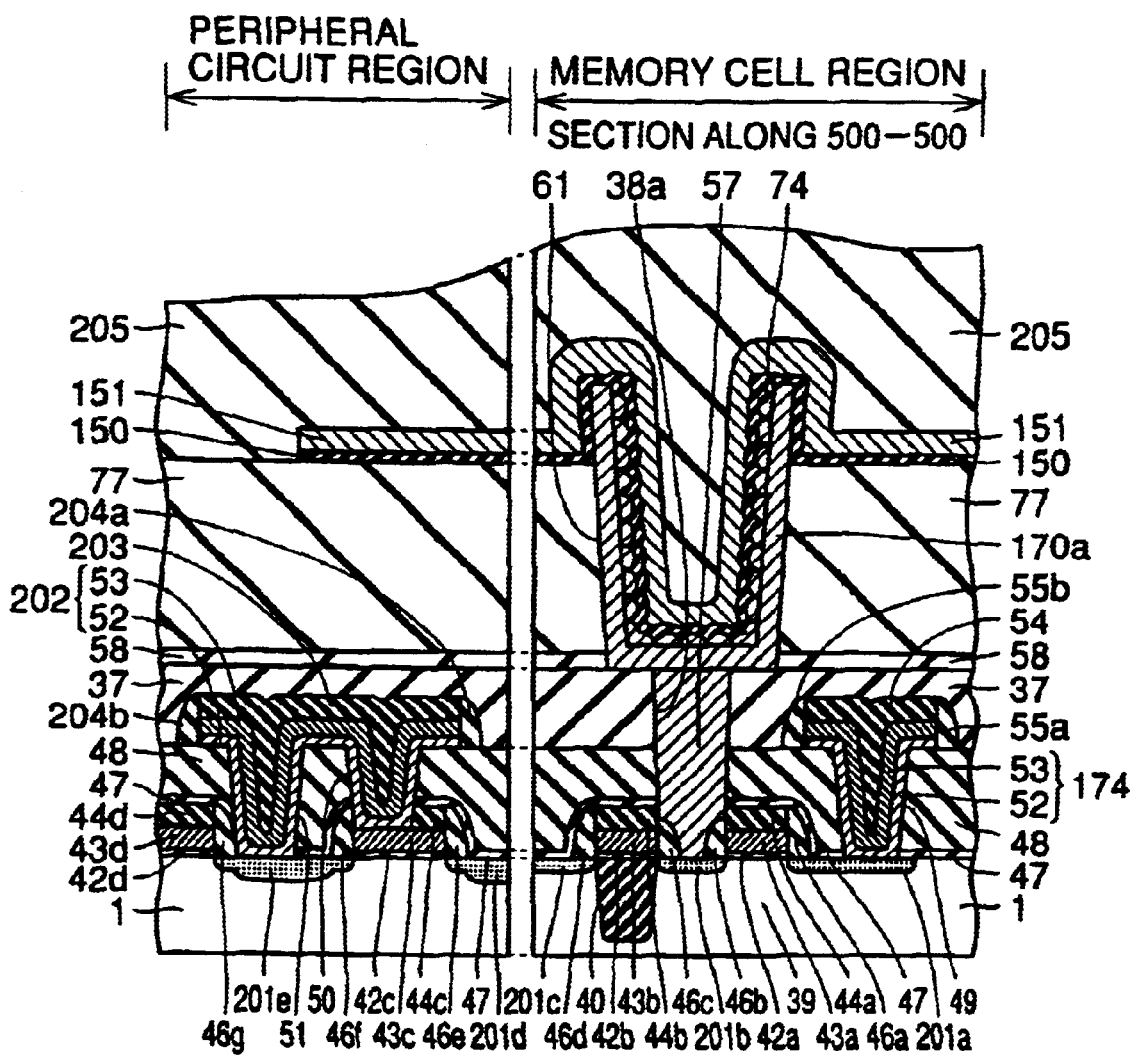
FIG. 21 is a sectional view for illustrating a third modification of the DRAM according to the embodiment 1 of the present invention.

Referring to FIG. 21, a third modification of the DRAM according to the embodiment 1 of the present invention is basically similar in structure to the second modification shown in FIG. 17. In the third modification, however, an upper portion of a third interlayer isolation film 77 is removed by etching or the like as described later, thereby obtaining the structure shown in FIG. 21.

Figure 22:
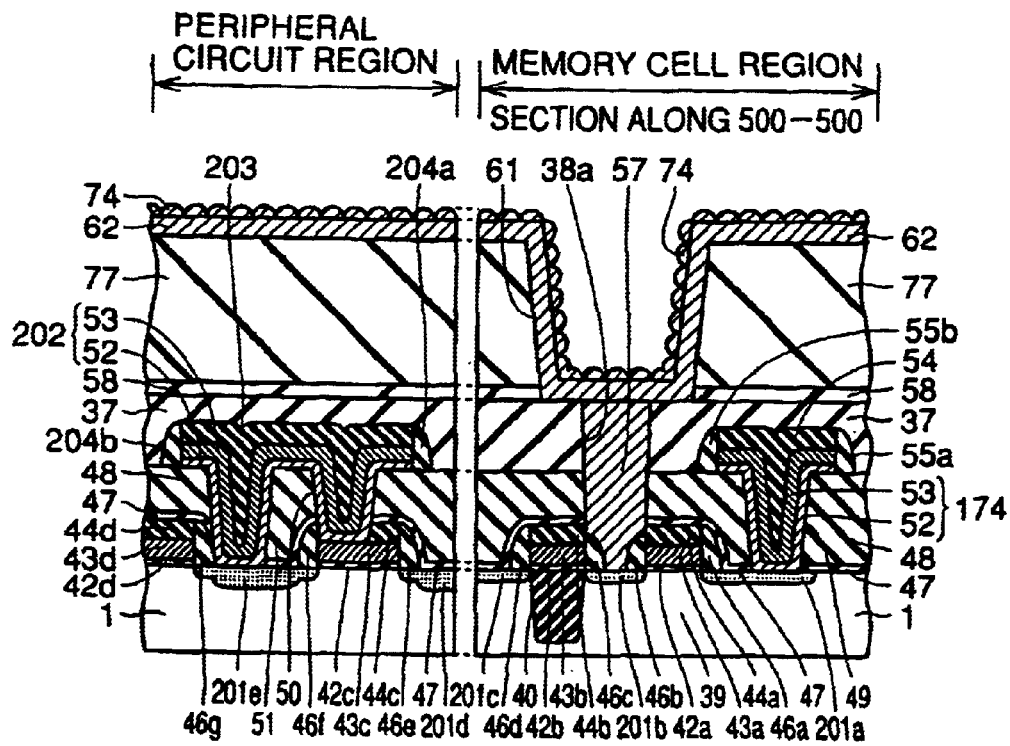
FIGS. 22 to 24 are sectional views for illustrating first to third steps of a method of fabricating the third modification of the DRAM according to the embodiment 1 of the present invention shown in FIG. 21.
Figure 23:
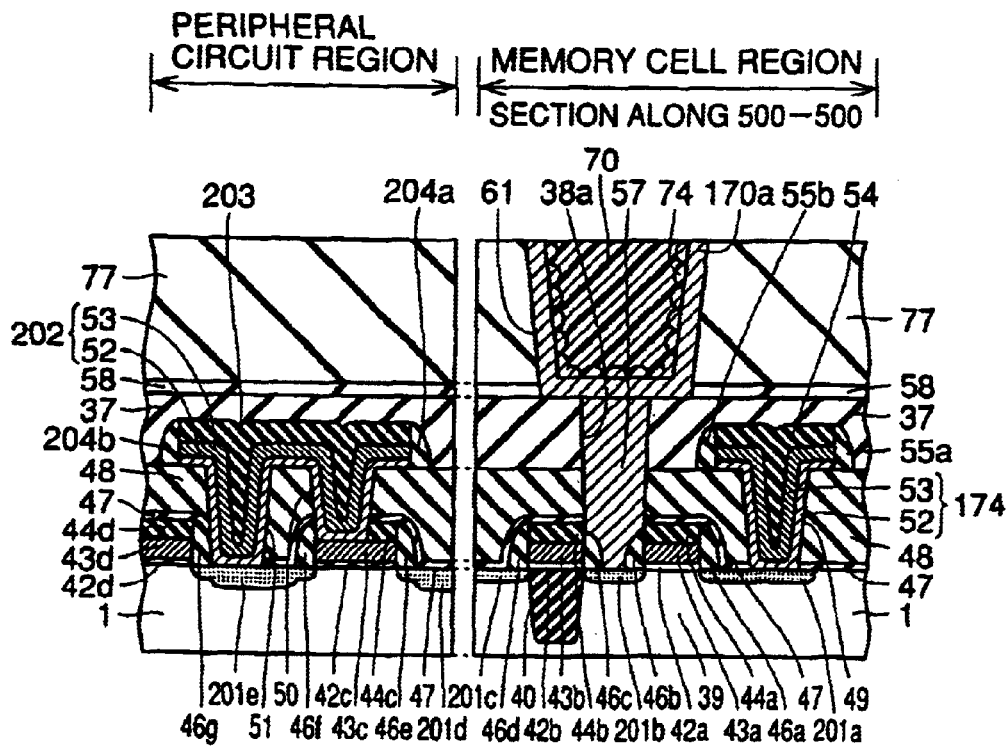
Figure 24:
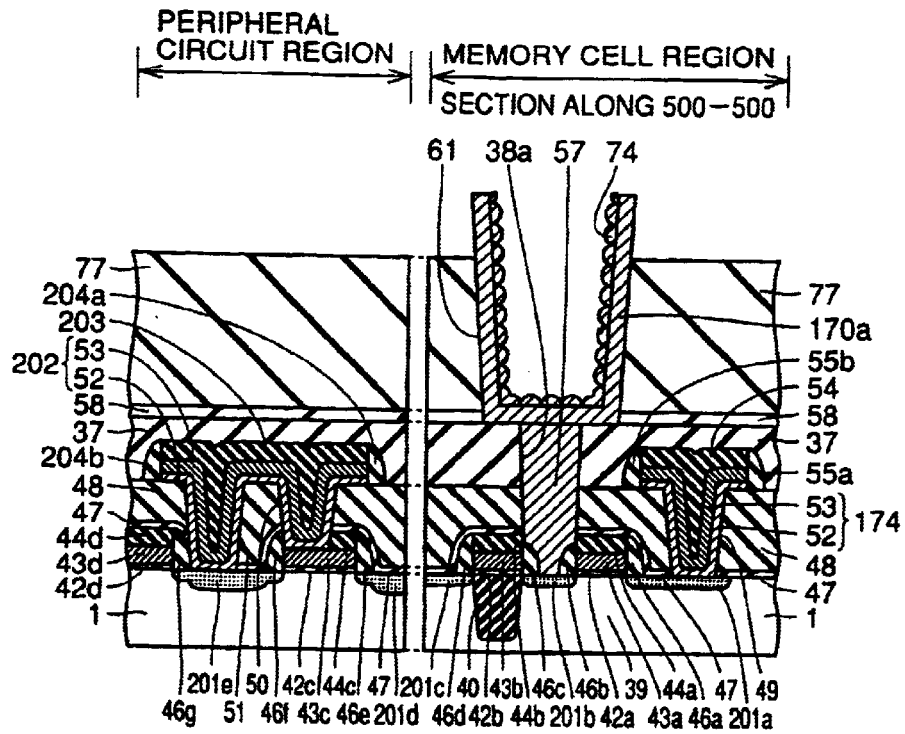

With reference to FIGS. 22 to 24, a method of fabricating the third modification of the DRAM according to the embodiment 1 of the present invention is described.

First, fabrication steps identical to those for the DRAM according to the embodiment 1 of the present invention shown in FIGS. 3 to 9 are carried out, and then a silicon nitride film 58 (see FIG. 22) is formed on a second interlayer isolation film 37 (see FIG. 22). Thereafter the third interlayer isolation film 77 (see FIG. 22) is formed on the silicon nitride film 58. A resist pattern (not shown) is formed on the third interlayer isolation film 77, and thereafter employed as a mask for partially removing the third interlayer isolation film 77 and the silicon nitride film 58, thereby forming an opening 61 (see FIG. 22). A polysilicon film 62 (see FIG. 22) is formed in the opening 61 and on the third interlayer isolation film 77. Granular crystals 74 (see FIG. 22) are formed on a surface of the polysilicon film 62. Thus, the structure shown in FIG. 22 is obtained.

Then, a resist 70 (see FIG. 23) is formed on the granular crystals 74 located in the opening 61, and thereafter the polysilicon film 62 and the granular crystals 74 located on the third interlayer isolation film 77 are removed by dry etching. Thus, the structure shown in FIG. 23 is obtained.

Then, the resist 70 is removed, and the third interlayer isolation film 77 is partially removed by an HF aqueous solution. Thus, the structure shown in FIG. 24 is obtained. The third interlayer isolation film 77 is thus partially removed by the HF aqueous solution, whereby the thickness of the removed part of the third interlayer isolation film 77 can be controlled by controlling the time for bringing the third interlayer isolation film 77 into contact with the HF aqueous solution. Thus, the areas of exposed parts can be changed in outer side surfaces of a capacitor lower electrode 170a. Consequently, it is possible to control the capacitance of the capacitor by changing the areas of the outer side surfaces of the capacitor lower electrode 170a utilized as the capacitor.

Thereafter a dielectric film 150 (see FIG. 21) and the like are formed similarly to the fabrication steps for the DRAM according to the embodiment 1, thereby obtaining the structure shown in FIG. 21.

Figure 25:
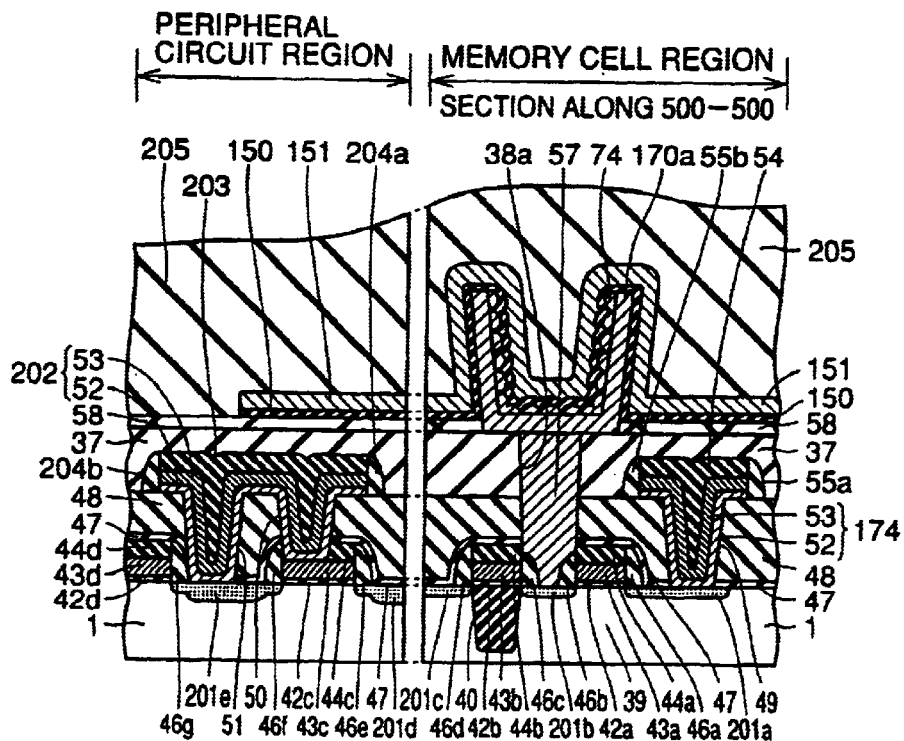
FIG. 25 is a sectional view for illustrating a fourth modification of the DRAM according to the embodiment 1 of the present invention.

Referring to FIG. 25, a fourth modification of the DRAM according to the embodiment 1 of the present invention is basically substantially similar in structure to the third modification of the DRAM according to the embodiment 1 shown in FIG. 21. In the fourth modification, however, a third interlayer isolation film 77 (see FIG. 21) is substantially entirely removed. Granular crystals 74 are formed on inner side surfaces of a capacitor lower electrode 170a, thereby lowering the vertical position of the capacitor lower electrode 170a with reference to an upper surface of a second interlayer isolation film 37. Thus, a step on an upper surface of a fourth interlayer isolation film 205 is reduced between a memory cell region and a peripheral circuit region.

Figure 26:
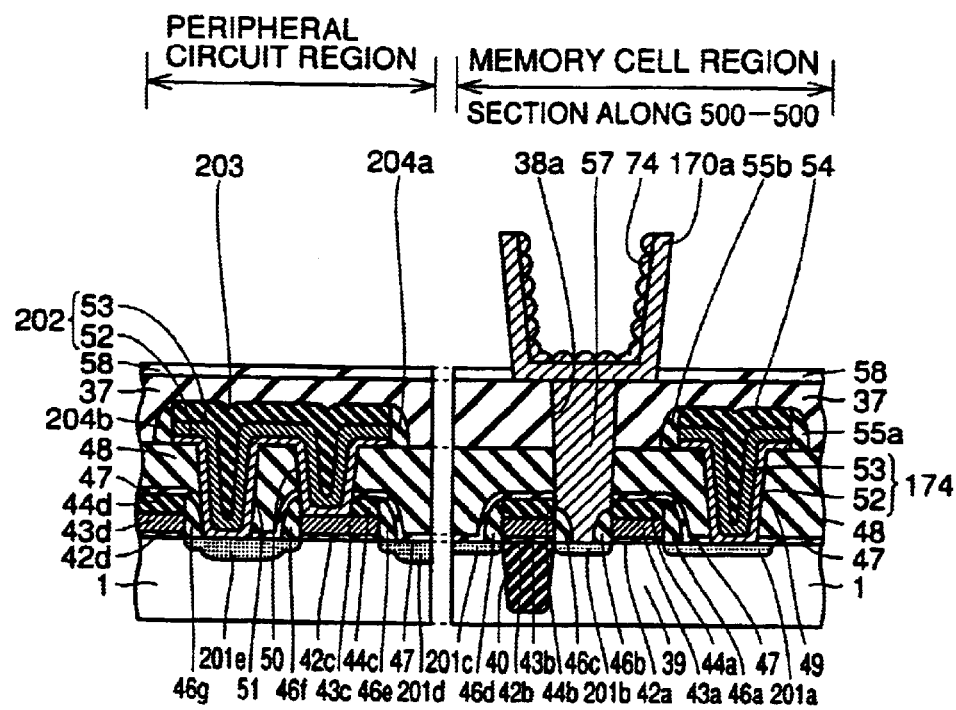
FIG. 26 is a sectional view for illustrating a first step of a method of fabricating the fourth modification of the DRAM according to the embodiment 1 shown in FIG. 25.

With reference to FIG. 26, a method of fabricating the fourth modification of the DRAM according to the embodiment 1 of the present invention is now described.

In the method of fabricating the fourth modification of the DRAM according to the embodiment 1 of the present invention, the third interlayer isolation film 77 (see FIG. 23) is substantially entirely removed by etching after a fabrication step identical to that for the third modification shown in FIG. 23. Thus, the structure shown in FIG. 26 is obtained.

Thereafter a dielectric film 150 (see FIG. 25) and the like are formed, thereby obtaining the structure shown in FIG. 25.

(Embodiment 2)

Figure 27:
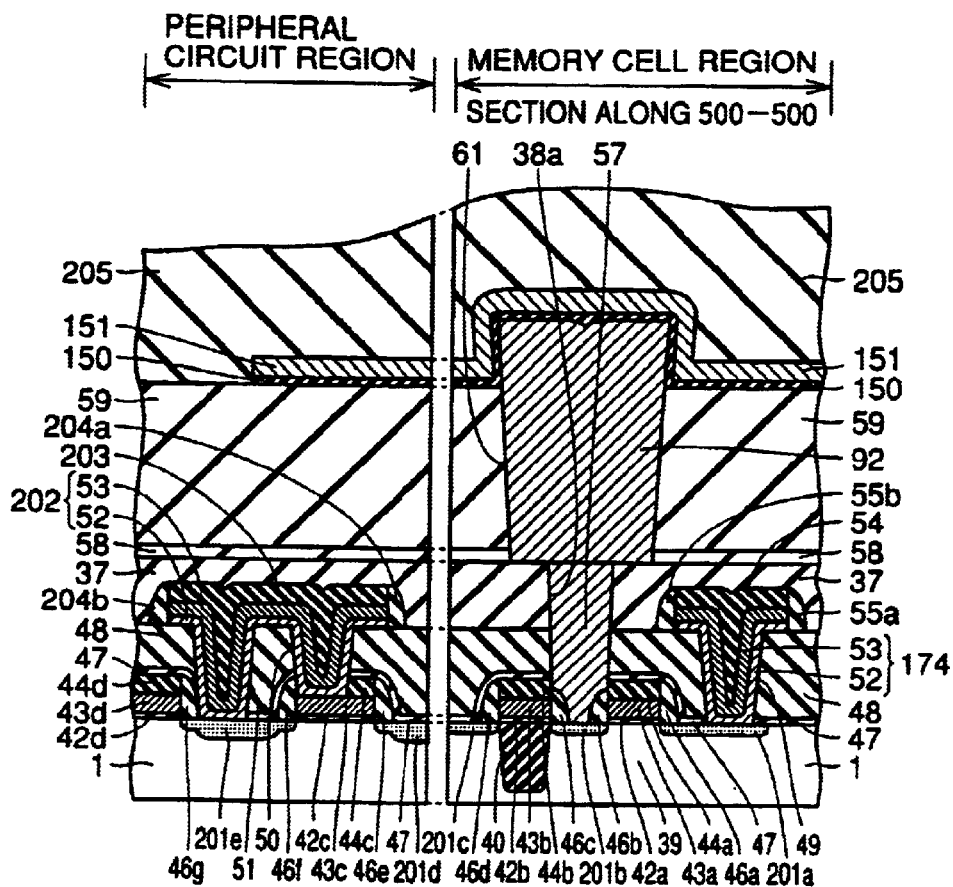
FIG. 27 is a sectional view for illustrating a DRAM according to an embodiment 2 of the present invention.

Referring to FIG. 27, a DRAM according to an embodiment 2 of the present invention is basically similar in structure to the DRAM according to the embodiment 1 of the present invention shown in FIG. 2. In the DRAM according to the embodiment 2 of the present invention, however, a capacitor lower electrode 92 is in the form of a thick film. The capacitor lower electrode 92 is partially embedded in a third interlayer isolation film 59, whereby the difference between the vertical positions of upper surfaces of the third interlayer isolation film 59 and the capacitor lower electrode 92 can be reduced as compared with the prior art. Thus, a step in an upper surface of a fourth interlayer isolation film 205 can be reduced between a memory cell region and a peripheral circuit region as compared with the prior art. Further, the surface area of the capacitor lower electrode 92 serving as a capacitor can be changed by changing the position of the upper surface of the third interlayer isolation film 59, thereby arbitrarily changing the capacitance of the capacitor.

Figure 28:
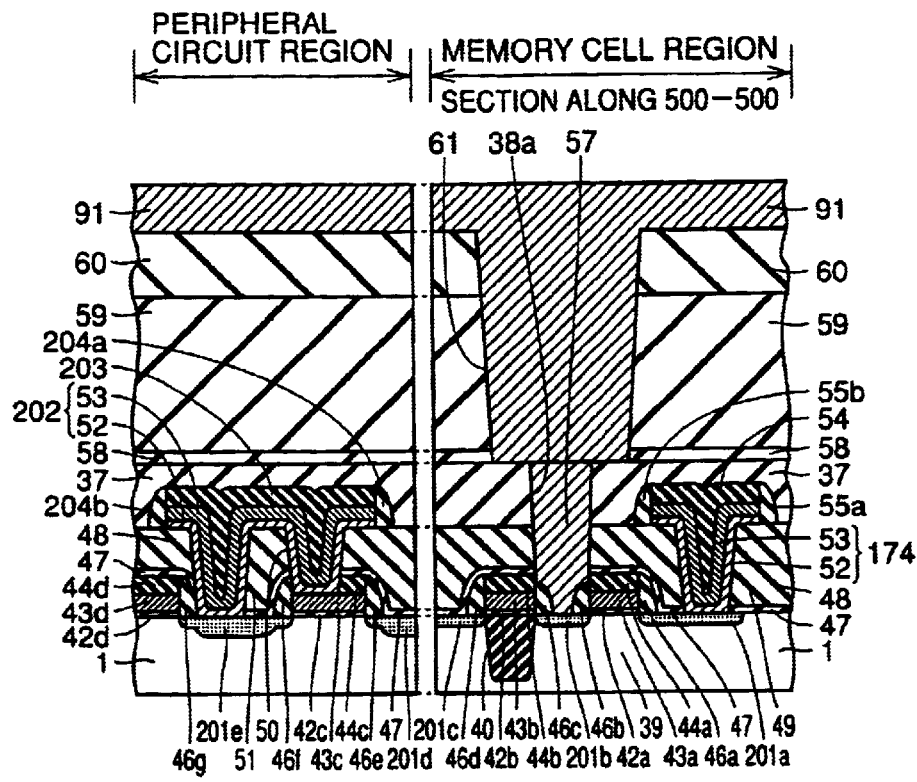
FIGS. 28 and 29 are sectional views for illustrating first and second steps of a method of fabricating the DRAM according to the embodiment 2 of the present invention shown in FIG. 27.
Figure 29:
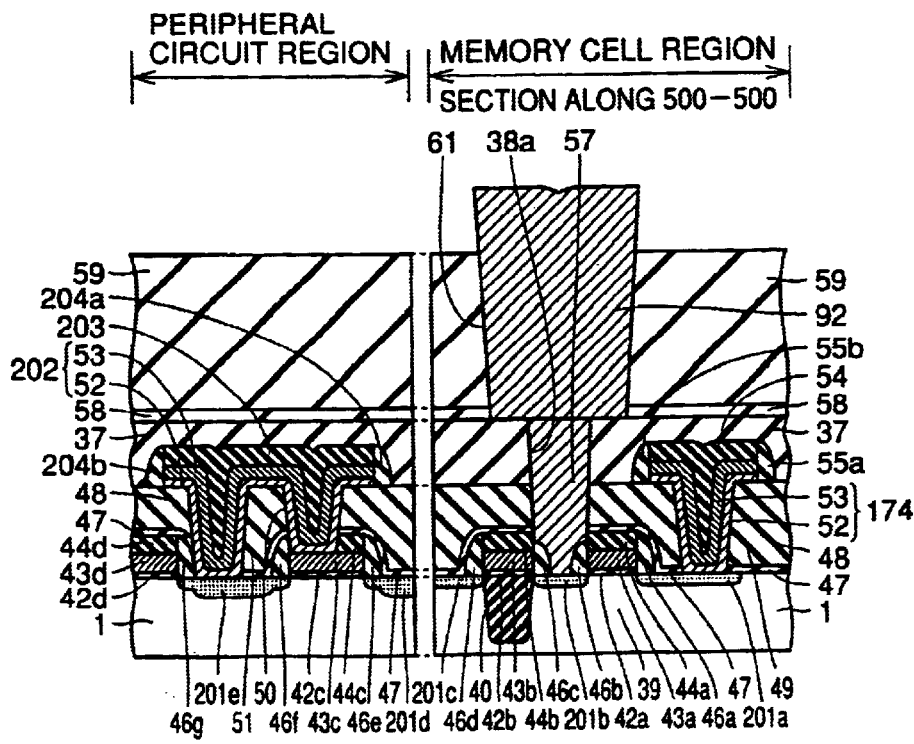

With reference to FIGS. 28 and 29, a method of fabricating the DRAM according to the embodiment 2 of the present invention is described.

First, fabrication steps identical to those for the DRAM according to the embodiment 1 of the present invention shown in FIGS. 3 to 10 are carried out, and thereafter a polysilicon film 91 is formed in an opening 61 and on a boron-doped silicon oxide film 60, as shown in FIG. 28.

Then, the polysilicon film 91 located on the boron-doped silicon oxide film 60 is removed by dry etching or CMP. Then, the boron-doped silicon oxide film 60 is removed by vapor-phase HF. Thus, the structure shown in FIG. 29 is obtained.

Thereafter a dielectric film 150 (see FIG. 27), a capacitor upper electrode 151 (see FIG. 27) and the fourth interlayer isolation film 205 (see FIG. 27) are formed, thereby obtaining the structure shown in FIG. 27. The peripheral circuit region is formed by steps identical to those for the peripheral circuit region of the DRAM according to the embodiment 1 of the present invention shown in FIGS. 3 to 13.

Figure 30:
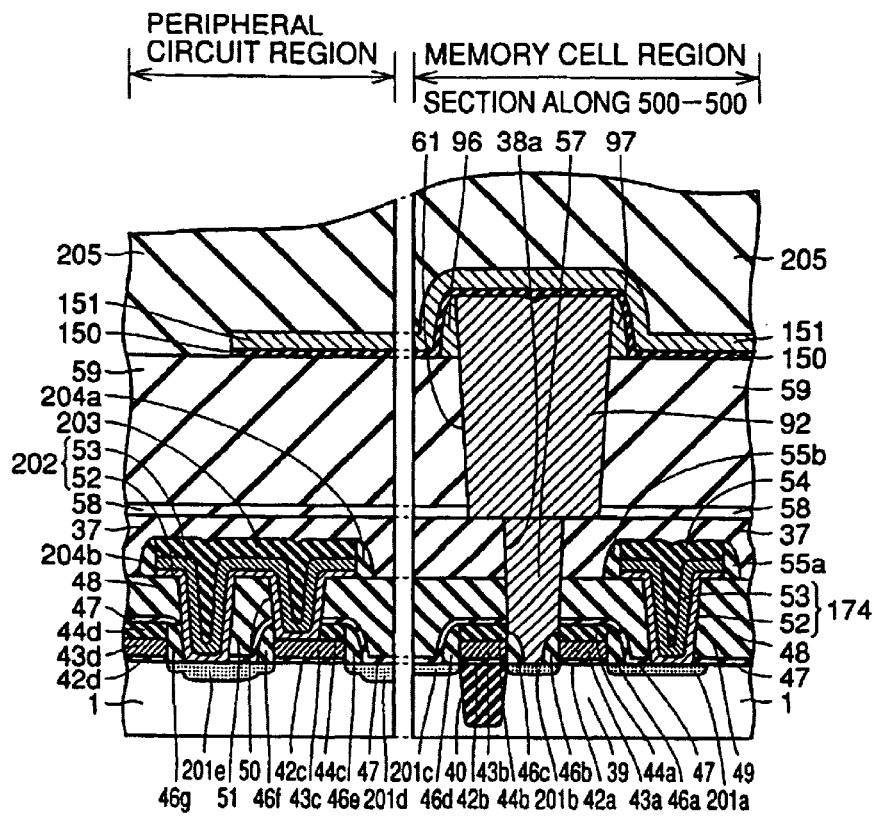
FIG. 30 is a sectional view for illustrating a first modification of the DRAM according to the embodiment 2 of the present invention.

Referring to FIG. 30, a first modification of the DRAM according to the embodiment 2 of the present invention is basically similar in structure to the DRAM according to the embodiment 2 shown in FIG. 27. In the first modification, however, side walls 96 and 97 consisting of polysilicon are formed on upper side surfaces of a capacitor lower electrode 92. Surfaces of these side walls 96 and 97 have curved parts. Therefore, the surface area of the capacitor lower electrode 92 serving as a capacitor can be increased as compared with the case of forming no side walls 96 and 97. Thus, the occupied area of the capacitor lower electrode 92 can be reduced as compared with the prior art while ensuring the capacitance of the capacitor. Consequently, the semiconductor device can be further refined.

Figure 31:
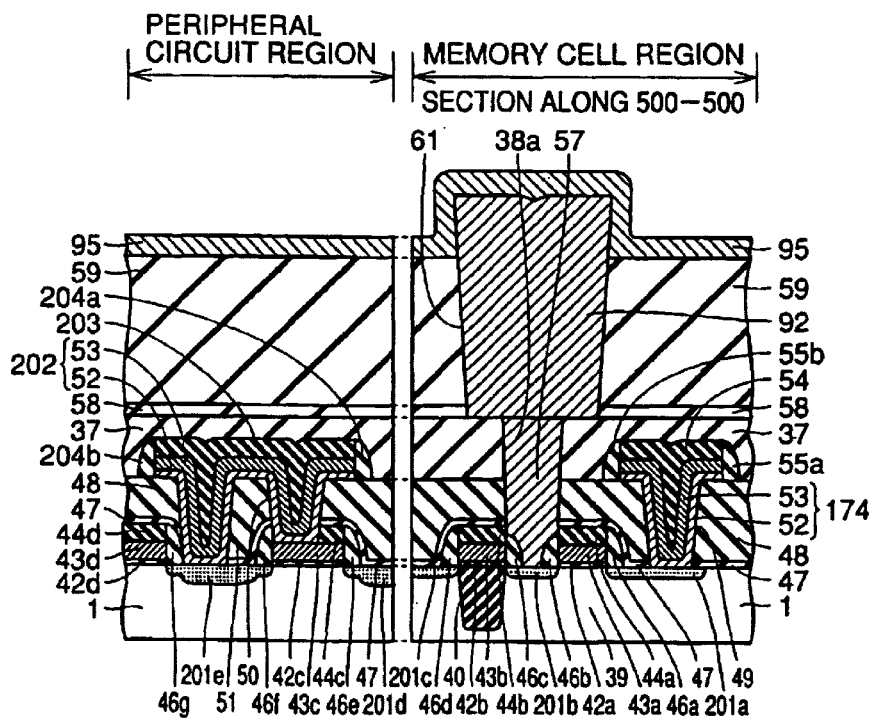
FIGS. 31 and 32 are sectional views for illustrating first and second steps of a method of fabricating the first modification of the DRAM according to the embodiment 2 of the present invention shown in FIG. 30.
Figure 32:
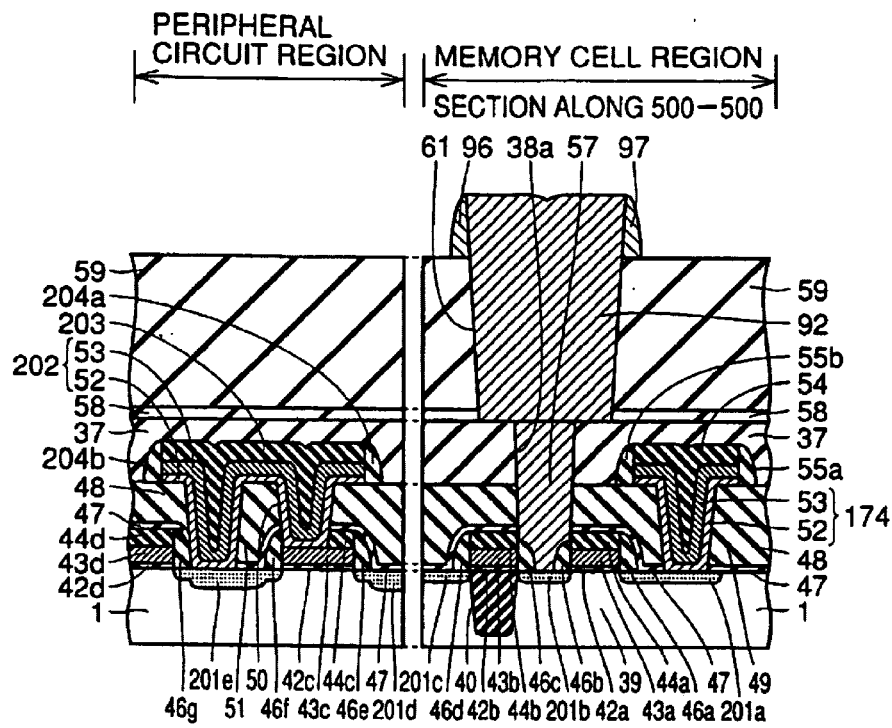

With reference to FIGS. 31 and 32, a method of fabricating the second modification of the DRAM according to the embodiment 2 of the present invention is now described.

Fabrication steps identical to those for the DRAM according to the embodiment 2 of the present invention shown in FIGS. 28 and 29 are carried out, and thereafter an amorphous silicon film 95 is formed on a third interlayer isolation film 59 and the capacitor lower electrode 92, as shown in FIG. 31.

Then, the amorphous silicon film 95 is partially removed by anisotropic etching, thereby forming the side walls 96 and 97 as shown in FIG. 32.

Thereafter a dielectric film 150 (see FIG. 30), a capacitor upper electrode 151 (see FIG. 30) and a fourth interlayer isolation film 205 (see FIG. 30) are formed, thereby obtaining the structure shown in FIG. 30.

Figure 33:
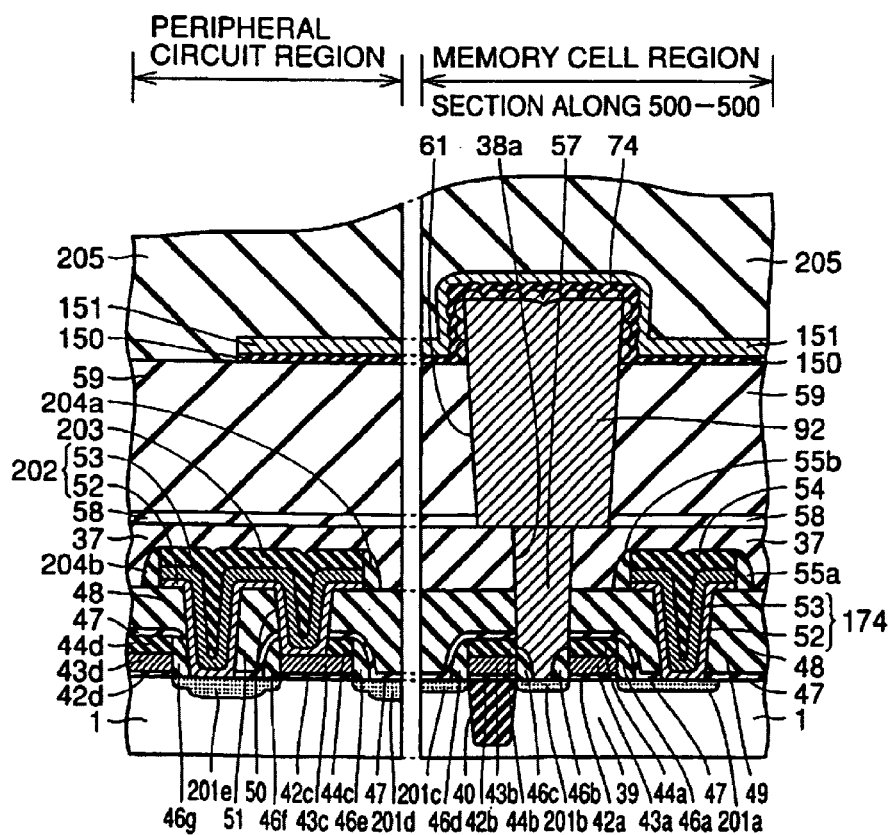
FIG. 33 is a sectional view for illustrating a second modification of the DRAM according to the embodiment 2 of the present invention.

Referring to FIG. 33, a second modification of the DRAM according to the embodiment 2 of the present invention is basically similar in structure to the DRAM according to the embodiment shown in FIG. 27. In the second modification, however, granular crystals 74 are formed on the surface of a capacitor lower electrode 92 located upward beyond a third interlayer isolation film 59. Therefore, the surface area of the capacitor lower electrode 92 can be increased without increasing its occupied area. Thus, the capacitance of the capacitor can be increased.

Figure 34:
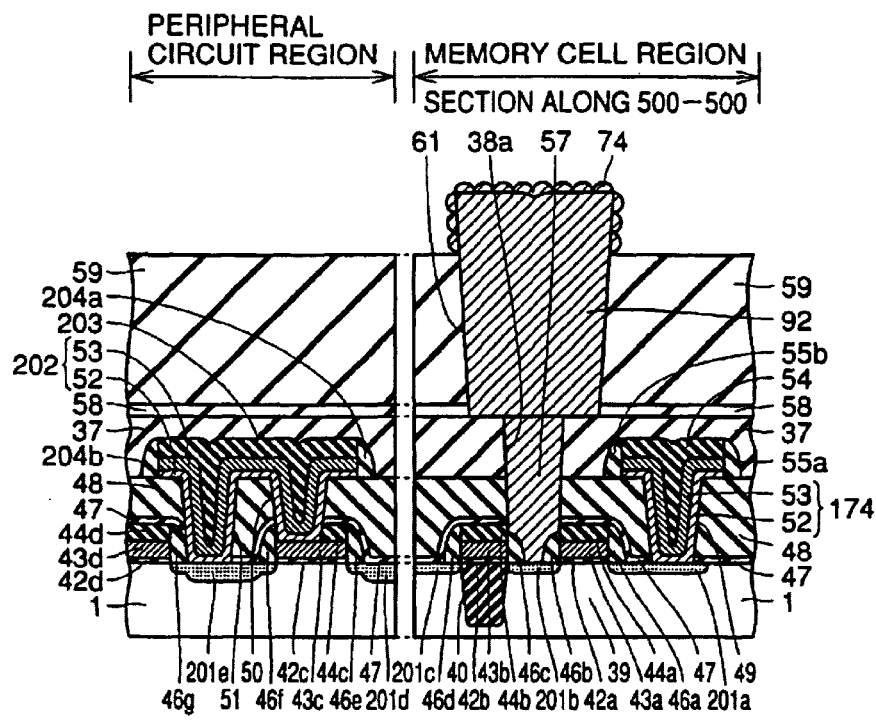
FIG. 34 is a sectional view for illustrating a first step of a method of fabricating the second modification of the DRAM according to the embodiment 2 of the present invention shown in FIG. 33.

With reference to FIG. 34, a method of fabricating the second modification of the DRAM according to the embodiment 2 of the present invention is now described.

First, fabrication steps identical to those for the DRAM according to the embodiment 2 of the present invention shown in FIGS. 28 and 29 are carried out, and thereafter the granular crystals 74 are formed on the surfaces of the capacitor lower electrode 92 as shown in FIG. 34. These granular crystals 74 are formed by a method similar to that employed in the first or second modification of the DRAM according to the embodiment 1 of the present invention.

Thereafter a dielectric film 150 (see FIG. 33) and the like are formed, thereby obtaining the structure shown in FIG. 33.

Figure 35:
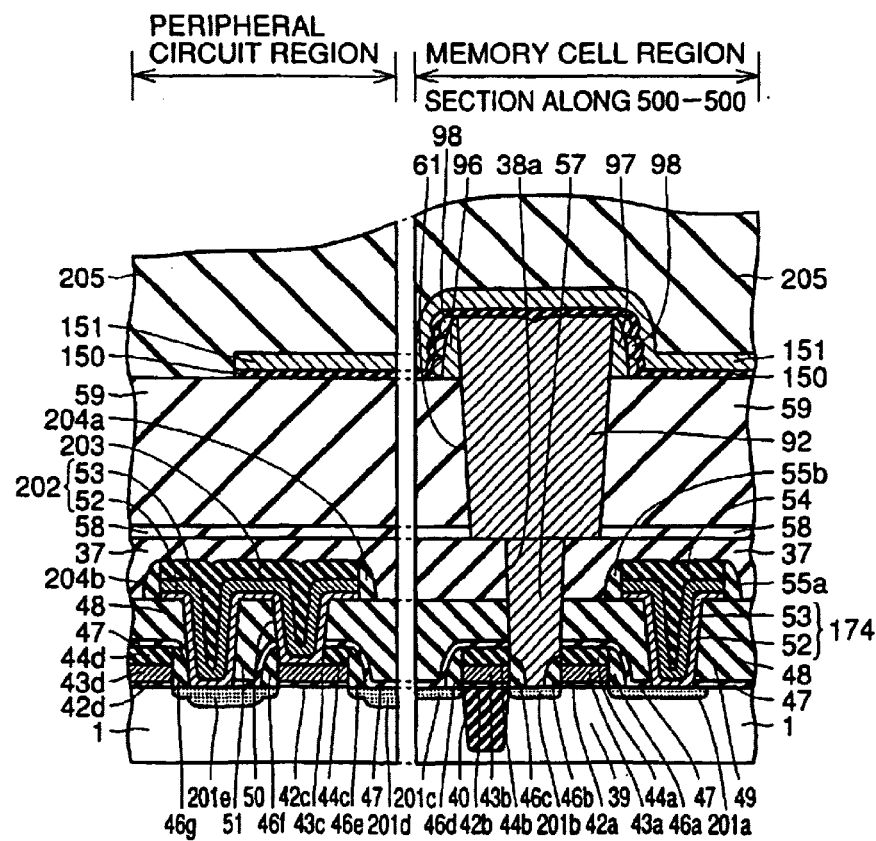
FIG. 35 is a sectional view for illustrating a third modification of the DRAM according to the embodiment 2 of the present invention.

Referring to FIG. 35, a third modification of the DRAM according to the embodiment 2 of the present invention is basically similar in structure to the first modification of the DRAM according to the embodiment 2 shown in FIG. 30. In the third modification, however, granular crystals 98 consisting of silicon are formed on surfaces of side walls 96 and 97 consisting of amorphous silicon. In the third modification, therefore, the surface area of a capacitor lower electrode 92 can be increased by formation of the side walls 96 and 97 as well as by the granular crystals 98. Thus, the capacitance of the capacitor can be further increased.

Figure 36:
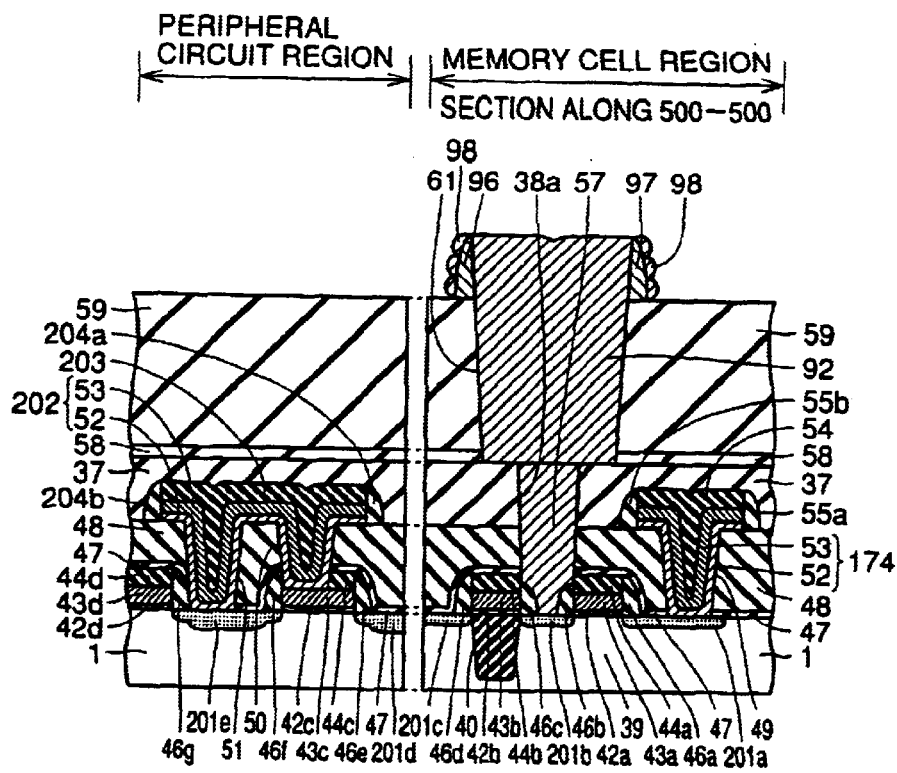
FIG. 36 is a sectional view for illustrating a first step of a method of fabricating the third modification of the DRAM according to the embodiment 2 of the present invention shown in FIG. 35.

With reference to FIG. 36, a method of fabricating the third modification of the DRAM according to the embodiment 2 of the present invention is now described.

First, fabrication steps identical to those for the first modification of the DRAM according to the embodiment 2 of the present invention shown in FIGS. 31 and 32 are carried out, and thereafter the granular crystals 98 are formed on the surfaces of the side walls 96 and 97 through a step identical to that for forming the granular crystals 74 (see FIG. 33) in the second modification of the DRAM shown in FIG. 33.

Thereafter a dielectric film 150 (see FIG. 35) and the like are formed, thereby obtaining the structure shown in FIG. 35.

Figure 37:
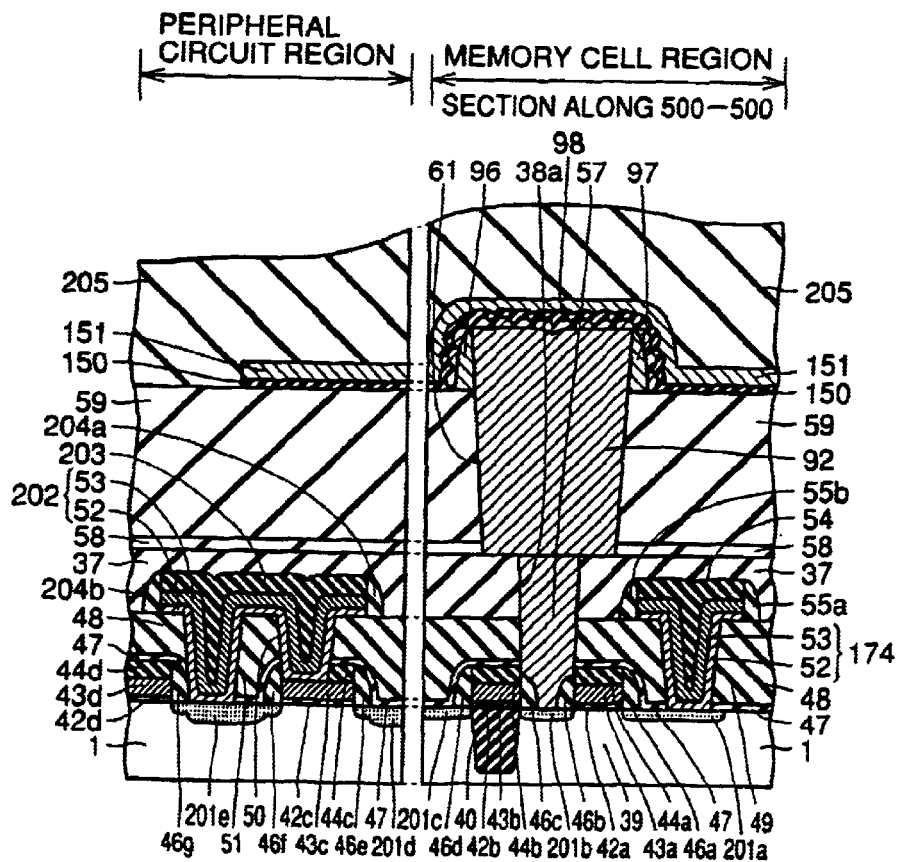
FIG. 37 is a sectional view for illustrating a fourth modification of the DRAM according to the embodiment 2 of the present invention.

Referring to FIG. 37, a fourth modification of the DRAM according to the embodiment 2 of the present invention is basically similar in structure to the first modification of the DRAM according to the embodiment 2 shown in FIG. 30. In the fourth modification, however, granular crystals 98 are formed on surfaces of a capacitor lower electrode 92 and side walls 96 and 97. Therefore, the surface area of the capacitor lower electrode 92 can be increased as compared with the case of forming no side walls 96 and 97 and granular crystals 98, thereby further increasing the capacitance of the capacitor. Thus, the occupied area of the capacitor lower electrode 92 can be reduced as compared with the prior art while ensuring a constant capacitor capacitance. Consequently, the semiconductor device can be further refined.

Figure 38:
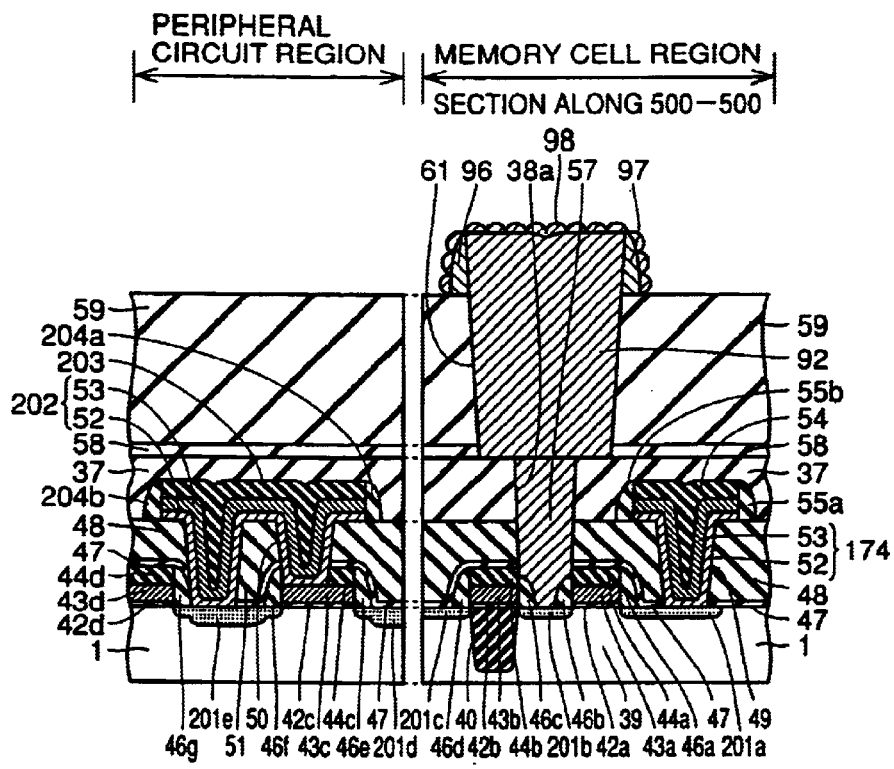
FIG. 38 is a sectional view for illustrating a first step of a method of fabricating the fourth modification of the DRAM according to the embodiment 2 of the present invention shown in FIG. 37.

With reference to FIG. 38, a method of fabricating the fourth modification of the DRAM according to the embodiment 2 of the present invention shown in FIG. 37 is now described.

First, fabrication steps identical to those for the first modification of the DRAM according to the embodiment 2 of the present invention shown in FIGS. 31 and 32 are carried out. At this time, the capacitor lower electrode 92 is prepared from amorphous silicon. Then, the granular crystals 98 are formed on the surfaces of the capacitor lower electrode 92 and the side walls 96 and 97 as shown in FIG. 38, through a step identical to that for the second modification of the embodiment 1 of the present invention shown in FIG. 18.

Thereafter a dielectric film 150 (see FIG. 37) and the like are formed, thereby obtaining the structure shown in FIG. 37.

(Embodiment 3)

Figure 39:
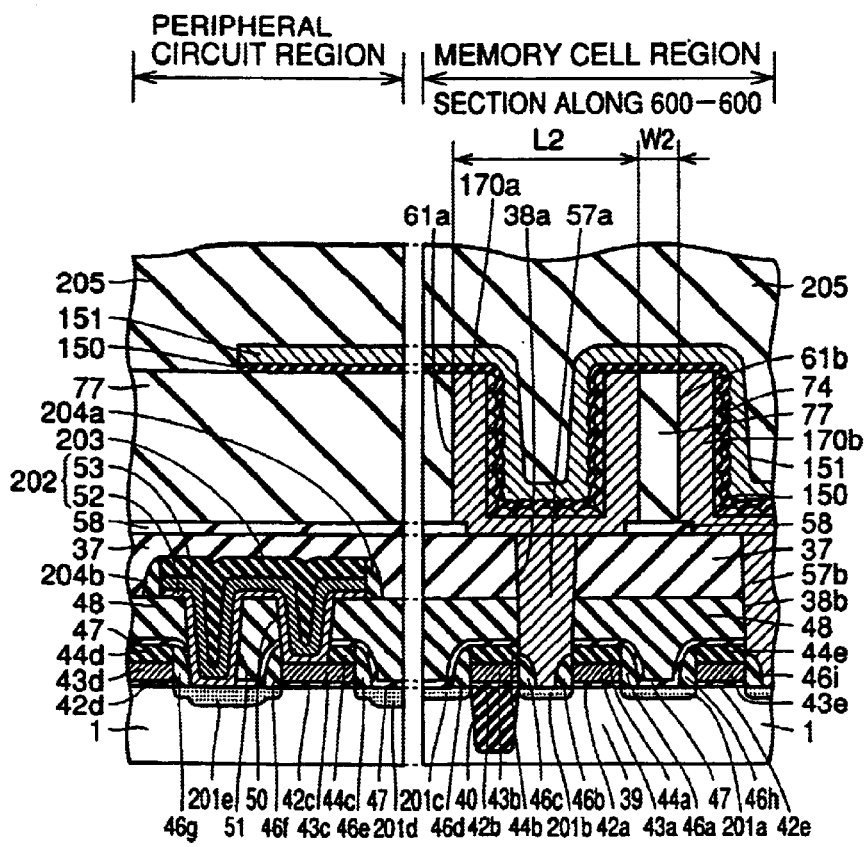
FIG. 39 is a sectional view for illustrating a DRAM according to an embodiment 3 of the present invention.

Referring to FIG. 39 showing a section taken along the line 600—600 in FIG. 1, a trench isolation oxide film 40 is formed on a major surface of a semiconductor substrate 1 to enclose an active region 39 in a memory cell region of a DRAM according to an embodiment 3 of the present invention. Source/drain regions 201a to 201c are formed on the major surface of the semiconductor substrate 1. Gate electrodes 43a, 43b and 43e are formed on channel regions adjacent to the source/drain regions 201a to 201c through gate insulating films 42a, 42b and 42e. Silicon nitride films 44a, 44b and 44e are formed on the gate electrodes 43a, 43b and 43e. Side walls 46a to 46d, 46h and 46i are formed on side surfaces of the gate insulating films 42a, 42b and 42e, the gate electrodes 43a, 43b and 43e and the silicon nitride films 44a, 44b and 44e. A non-doped silicon oxide film 47 is formed on the silicon nitride films 44a, 44b and 44e, the side walls 46a to 46d, 46h and 46i and the major surface of the semiconductor substrate 1. A first interlayer isolation film 48 is formed on the non-doped silicon oxide film 47. A second interlayer isolation film 37 is formed on the first interlayer isolation film 48. The first and second interlayer isolation films 48 and 37 and the non-doped silicon oxide film 47 are partially removed, thereby forming contact holes 38a and 38b. Plugs 57a and 57b consisting of polysilicon are formed in the contact holes 38a and 38b respectively. A silicon nitride film 58 is formed on a part of an upper surface of the second interlayer isolation film 37. Capacitor lower electrodes 170a and 170b are formed on the plugs 57a and 57b and the second interlayer isolation film 37. A third interlayer isolation film 77 is formed on sides of the capacitor lower electrodes 170a and 170b. Granular crystals 74 are formed on inner side surfaces of the capacitor lower electrodes 170a and 170b. A dielectric film 150 of a capacitor is formed on the granular crystals 74 and the third interlayer isolation film 77. A capacitor upper electrode 151 is formed on the dielectric film 150. A fourth interlayer isolation film 205 is formed on the capacitor upper electrode 151. The width W2 of a part of the third interlayer isolation film 77 located between the capacitor lower electrodes 170a and 170b is smaller than the minimum working size formable by photolithography.

A section of a peripheral circuit region of the DRAM according to the embodiment 3 of the present invention is basically similar in structure to that of the peripheral circuit region of the DRAM according to the embodiment 1 shown in FIG. 2.

In the DRAM according to the embodiment 3 of the present invention, as hereinabove described, top surfaces of the capacitor lower electrodes 170a and 170b and the upper surface of the third interlayer isolation film 77 are substantially flush with each other as shown in FIG. 39, whereby the fourth interlayer isolation film 205 can be prevented from formation of a step on its upper surface between the memory cell region and the peripheral circuit region. In case of forming a wiring layer on the fourth interlayer isolation film 205 by photolithography, therefore, the pattern of the wiring layer can be prevented from being blurred by such a step. Thus, the wiring layer can be prevented from disconnection or shorting resulting from a blurred pattern. Consequently, the semiconductor device can be implemented with higher density of integration while ensuring the capacitance of the capacitor and attaining high reliability. Further, the width W2 of the third interlayer isolation film 77 is smaller than the minimum working size formable by photolithography, whereby the interval between the capacitor lower electrodes 107a and 107b can be reduced as compared with the prior art. Consequently, the semiconductor device can be implemented with higher density of integration. Also in each of the embodiments 1 and 2, a similar effect can be attained by reducing the width of the interlayer isolation film between the capacitor lower electrodes as compared with the minimum working size formable by photolithography, similarly to the embodiment 3.

Figure 40:
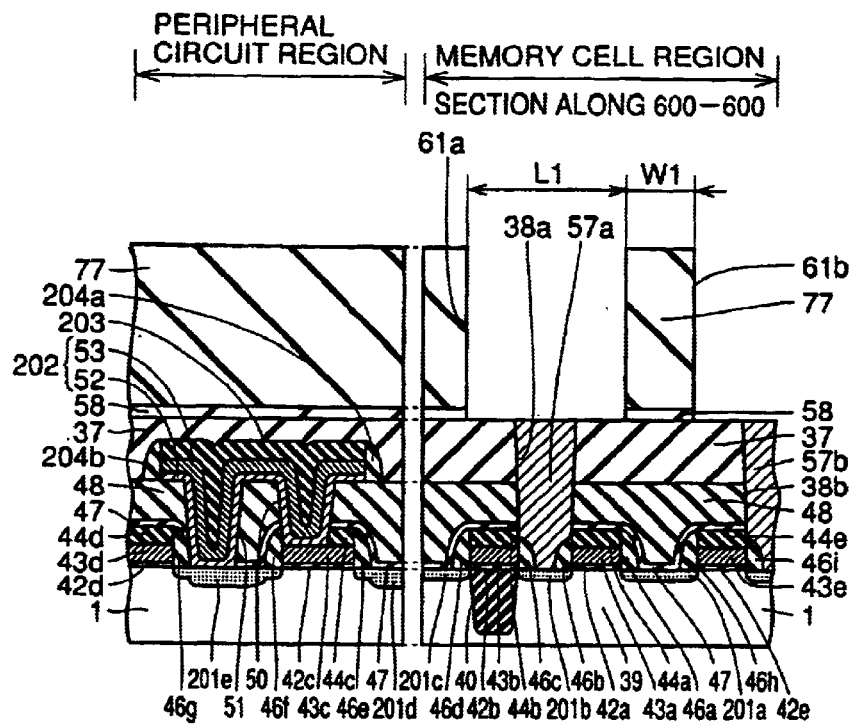
FIGS. 40 to 42 are sectional views for illustrating first to third steps of a method of fabricating the DRAM according to the embodiment 3 of the present invention shown in FIG. 39.
Figure 41:
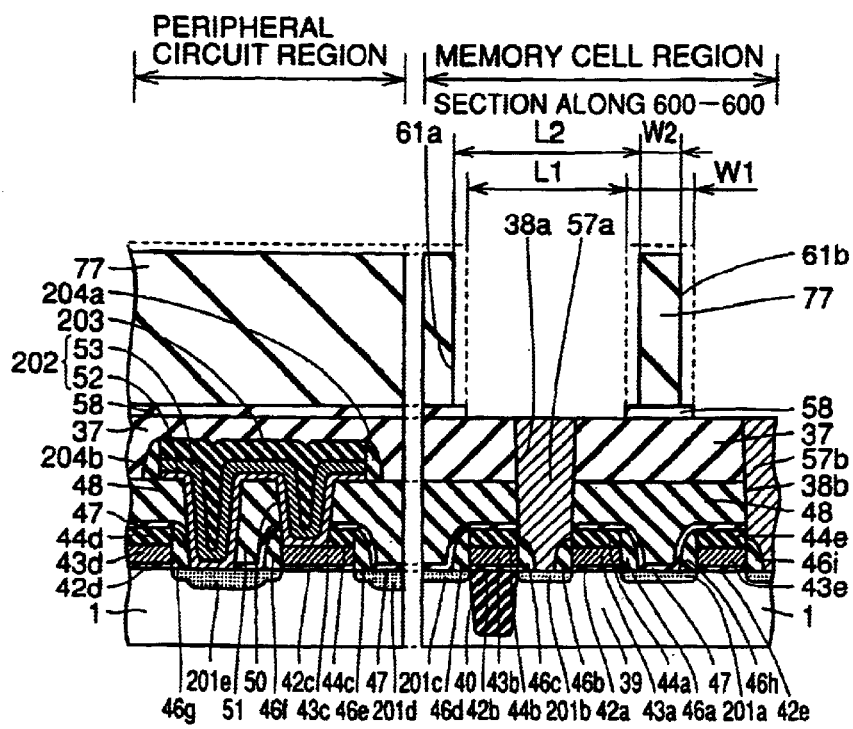
Figure 42:
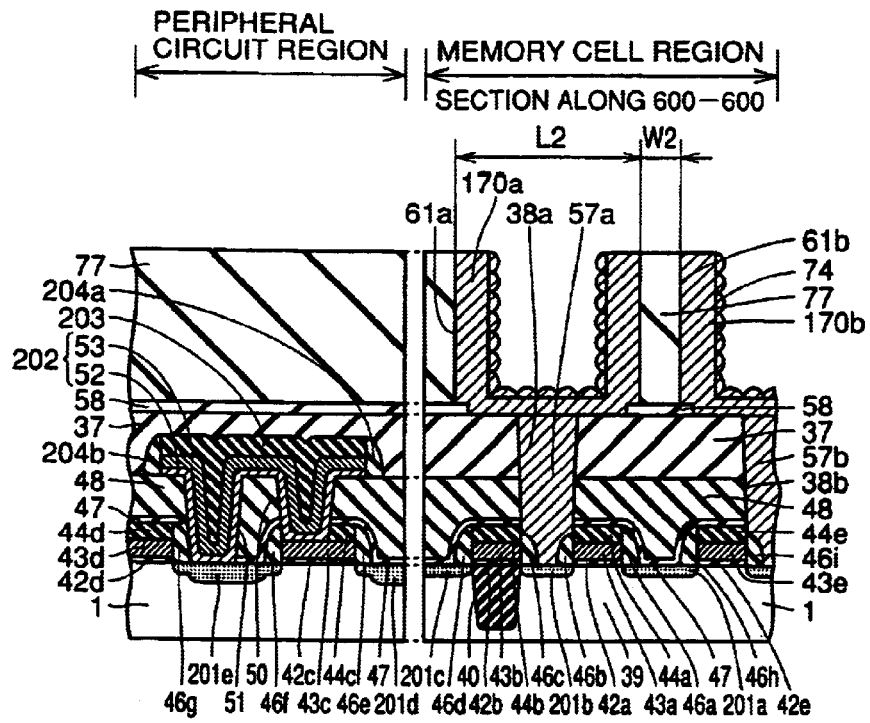

With reference to FIGS. 40 to 42, a method of fabricating the DRAM according to the embodiment 3 of the present invention is now described.

First, a trench isolation oxide film 40 (see FIG. 40) is formed on the major surface of the semiconductor substrate 1 (see FIG. 40) in the memory cell region of the DRAM according to the embodiment 3 of the present invention. A silicon oxide film (not shown) for defining the gate insulating films 42a, 42b and 42e is formed on the major surface of the semiconductor substrate 1. A polysilicon film (not shown) for defining the gate electrodes 43a, 43b and 43e is formed on the silicon oxide film. A silicon nitride film (not shown) is formed on the polysilicon film. A resist pattern is formed on the silicon nitride film and employed as a mask for etching the silicon nitride film, the polysilicon film and the silicon oxide film, thereby forming the gate insulating films 42a, 42b and 42e, the gate electrodes 43a, 43b and 43e and the silicon nitride films 44a, 44b and 44e (see FIG. 40). A silicon nitride film (not shown) is formed to cover the overall surface, and thereafter anisotropically etched for forming the side walls 46a to 46d, 46h and 46i (see FIG. 40). Then, a non-doped silicon oxide film 47 (see FIG. 40) is formed to cover the overall surface. The first interlayer isolation film 48 (see FIG. 40) consisting of a phosphorus-doped silicon oxide film is formed on the non-doped silicon oxide film 47. The second interlayer isolation film 37 (see FIG. 40) is formed on the first interlayer isolation film 48. A resist pattern is formed on the second interlayer isolation film 37 and thereafter employed as a mask for partially removing the first and second interlayer isolation films 48 and 37 and the non-doped silicon oxide film 47, thereby forming the contact holes 38a and 38b (see FIG. 40). The plugs 57a and 57b consisting of polysilicon are formed in the contact holes 38a and 38b. The silicon nitride film 58 (see FIG. 40) is formed on the second interlayer isolation film 37 and the plugs 57a and 57b. The third interlayer isolation film 77 consisting of a silicon oxide film is formed on the silicon nitride film 58. A resist pattern is formed on the third interlayer isolation film 77 and thereafter employed as a mask for partially removing the third interlayer isolation film 77 and the silicon nitride film 58, thereby forming openings 61a and 61b. Thus, the structure shown in FIG. 40 is obtained. It is assumed that symbol L1 denotes the width of the opening 61a, and symbol W1 denotes the width of the part of the third interlayer isolation film 77 located between the openings 61a and 61b.

Then, a surface of the third interlayer isolation film 77 is partially removed by wet etching with an aqueous solution of alkali or acid. Thus, the width of the opening 61a increases from L1 to L2 (see FIG. 41), while the width of the part of the third interlayer isolation film 77 located between the openings 61a and 61b reduces from W1 to W2 (see FIG. 41). Thus, the structure shown in FIG. 41 is obtained.

Then, an amorphous silicon film (not shown) is formed on the third interlayer isolation film 77 and in the openings 61a and 61b through fabrication steps identical to those for the third modification of the DRAM according to the embodiment 1 of the present invention shown in FIGS. 22 and 23. Then, granular crystals 74 (see FIG. 42) are formed on the amorphous silicon film. The amorphous silicon film and the granular crystals 74 located on the upper surface of the third interlayer isolation film 77 are removed by dry etching or the like, thereby obtaining the structure shown in FIG. 42.

Thereafter a dielectric film 150 (see FIG. 39) and the like are formed on the granular crystals 74 and the third interlayer isolation film 77, thereby obtaining the structure shown in FIG. 39. The peripheral circuit region is formed through fabrication steps identical to those for the peripheral circuit region of the DRAM according to the embodiment 1 of the present invention shown in FIGS. 3 to 13.

Figure 43:
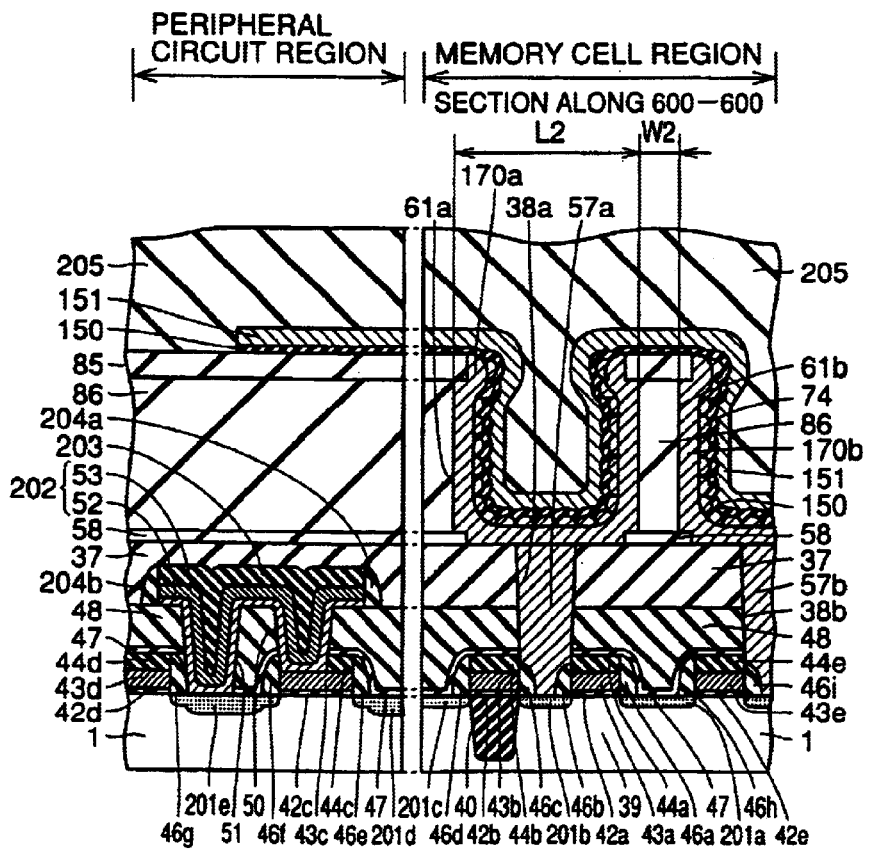
FIG. 43 is a sectional view for illustrating a first modification of the DRAM according to the embodiment 3 of the present invention.

Referring to FIG. 43, a first modification of the DRAM according to the embodiment 3 of the present invention is basically similar in structure to the DRAM according to the embodiment 3 shown in FIG. 39. In the first modification of the DRAM according to the embodiment 3 of the present invention shown in FIG. 43, however, a non-doped silicon oxide film 85 and a boron-doped silicon oxide film 86 form a third interlayer isolation film. Thus, the third interlayer isolation film has a two-layer structure, whereby the widths of openings 61a and 61b can be increased by etching only the boron-doped silicon oxide film 86 by vapor-phase HF without etching the upper non-doped silicon oxide film 85 in a fabrication step described later. Thus, the upper surface of the third interlayer isolation film can be prevented from being removed by etching in the step of increasing the widths of the openings 61a and 61b and reducing the width of a part of the third interlayer isolation film located therebetween. Thus, the vertical positions of side surfaces of capacitor lower electrodes 170a and 170b thereafter formed can be prevented from lowering. Consequently, the surface areas of the capacitor lower electrodes 170a and 170b can be prevented from being reduced, thereby preventing reduction of the capacitance of the capacitor.

Figure 44:
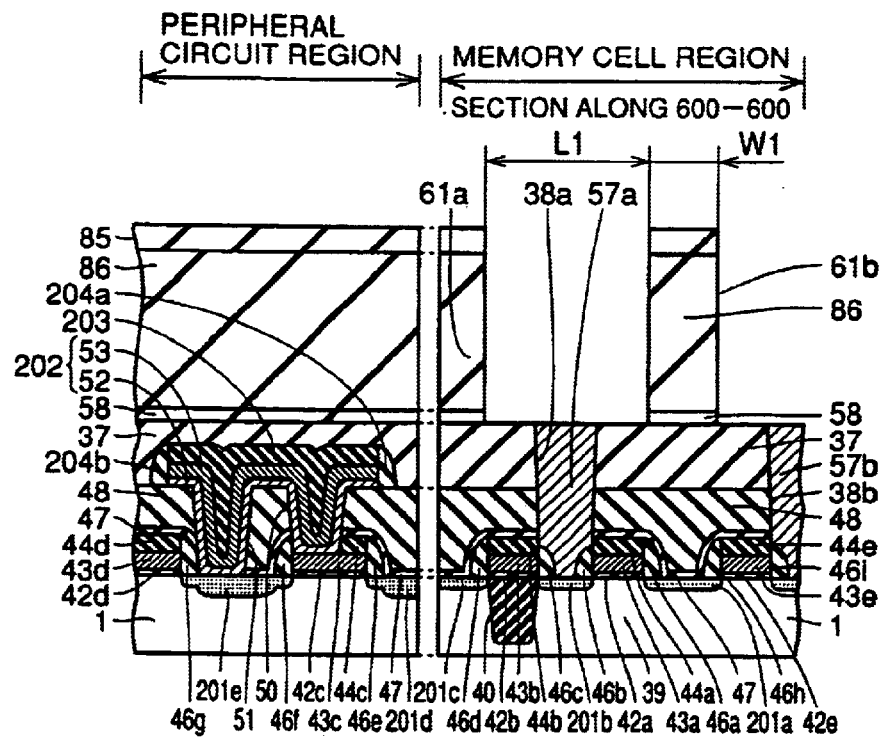
FIGS. 44 to 46 are sectional views for illustrating first to third steps of a method of fabricating the first modification of the DRAM according to the embodiment 3 of the present invention shown in FIG. 43.
Figure 45:
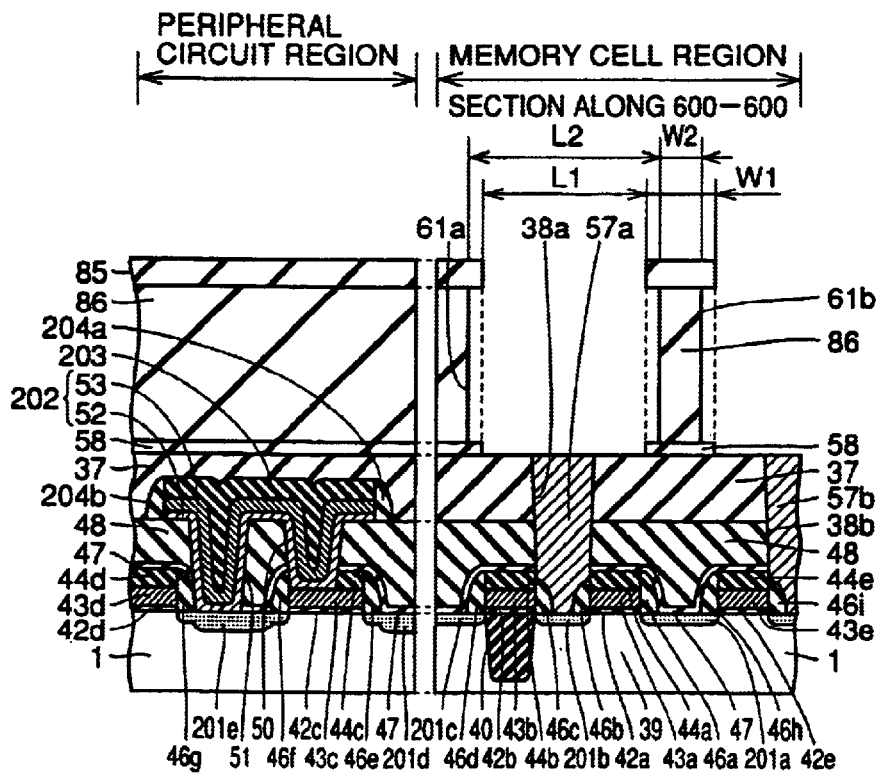
Figure 46:
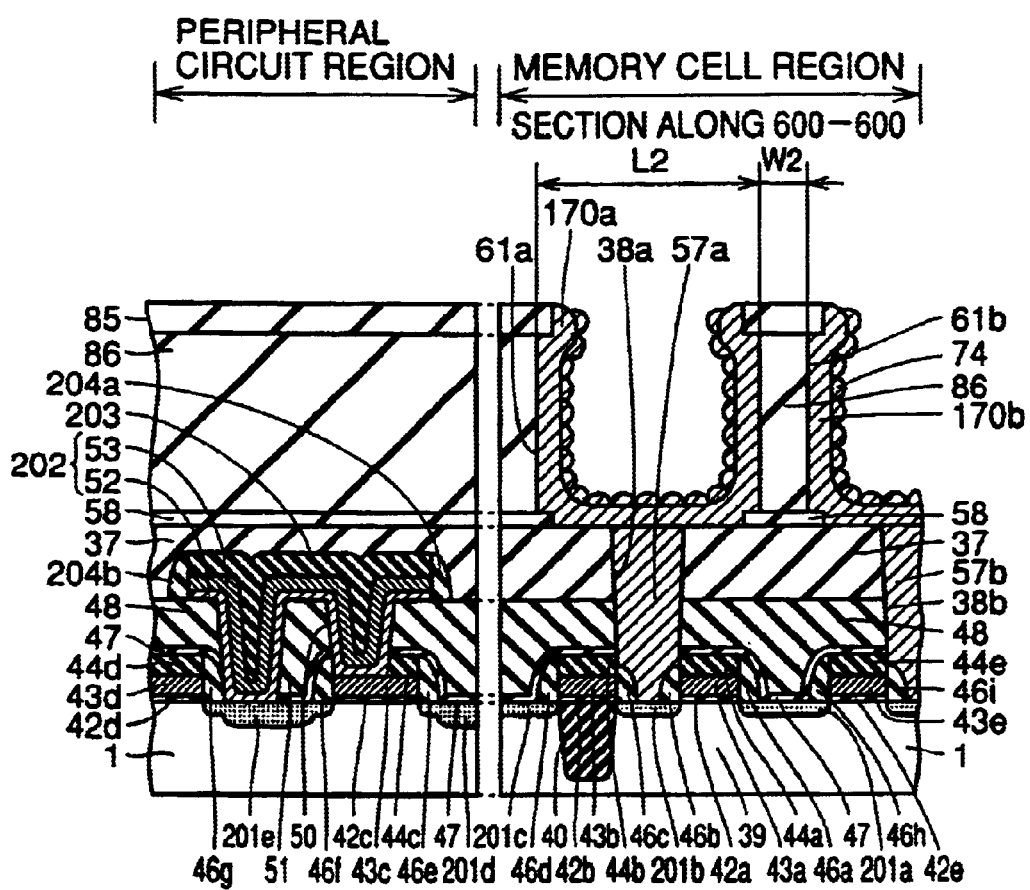

With reference to FIGS. 44 to 46, a method of fabricating the first modification of the DRAM according to the embodiment 3 of the present invention is now described.

First, the structure shown in FIG. 44 is obtained by a fabrication step basically similar to that for the DRAM according to the embodiment 3 shown in FIG. 40. While the third interlayer isolation film 77 has a one-layer structure in the step shown in FIG. 40, the boron-doped silicon oxide film 86 is formed on a silicon nitride film 58 and thereafter the non-doped silicon oxide film 85 is formed on the boron-doped silicon oxide film 86 to form the interlayer isolation film in the step shown in FIG. 44. It is assumed that symbol L1 denotes the width of the opening 61a and symbol W1 denotes the width of the part of the third interlayer isolation film located between the openings 61a and 61b.

Then, only side surfaces of the boron-doped silicon oxide film 86 are removed by etching through vapor-phase HF, as shown in FIG. 45. Thus, the width of the opening 61a increases from L1 to L2, so that the width of the part of the third interlayer isolation film located between the openings 61a and 61b can be reduced to W2 from the initial width W1.

Then, the capacitor lower electrodes 170a and 170b and the granular crystals 74 are formed in the openings 61a and 61b as shown in FIG. 46, through a step identical to that for forming the capacitor lower electrodes 170a and 170b (see FIG. 42) and the granular crystals 74 (see FIG. 42) for the DRAM according to the embodiment 3 of the present invention shown in FIG. 42.

Thereafter a dielectric film 150 (see FIG. 43) and the like are formed, thereby obtaining the structure shown in FIG. 43.

Figure 47:
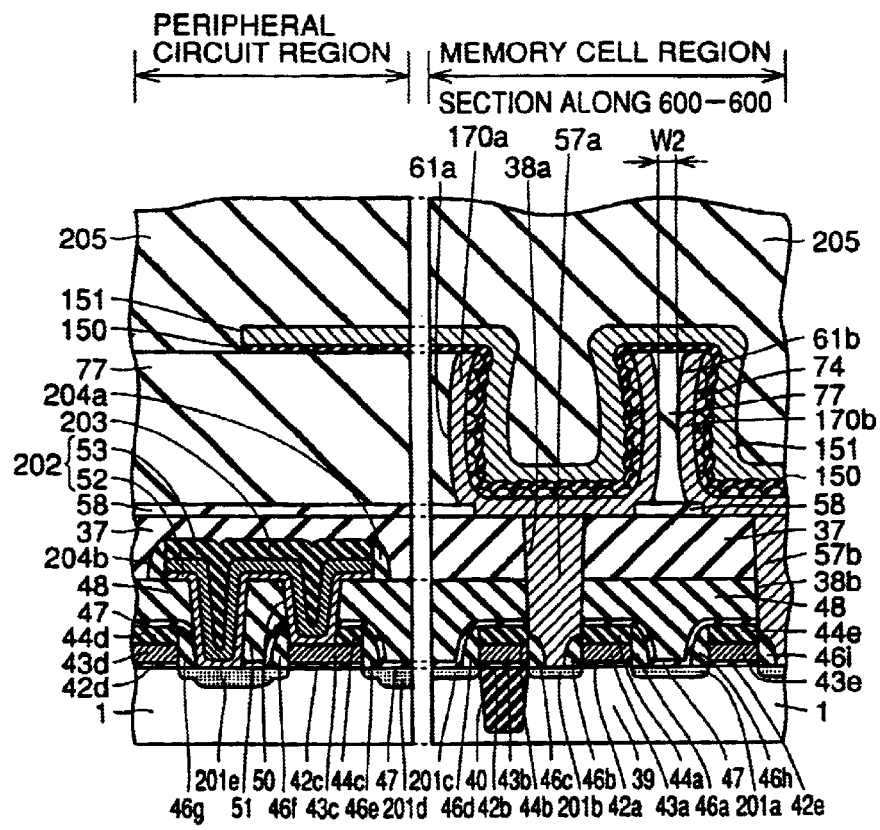
FIG. 47 is a sectional view for illustrating a second modification of the DRAM according to the embodiment 3 of the present invention.

Referring to FIG. 47, a second modification of the DRAM according to the embodiment 3 of the present invention is basically similar in structure to the DRAM according to the embodiment 3 shown in FIG. 39. In the second modification of the DRAM according to the embodiment 3 of the present invention shown in FIG. 47, however, side surfaces of capacitor lower electrodes 170a and 170b have curved planes. Therefore, the surface areas of the side surfaces of the capacitor lower electrodes 170a and 170b can be increased as compared with the capacitor lower electrodes 170a and 170b having flat side surfaces shown in FIG. 39. Thus, the occupied area of the capacitor can be reduced as compared with the prior art while ensuring a constant capacitor capacitance, whereby the semiconductor device can be further refined.

Figure 48:
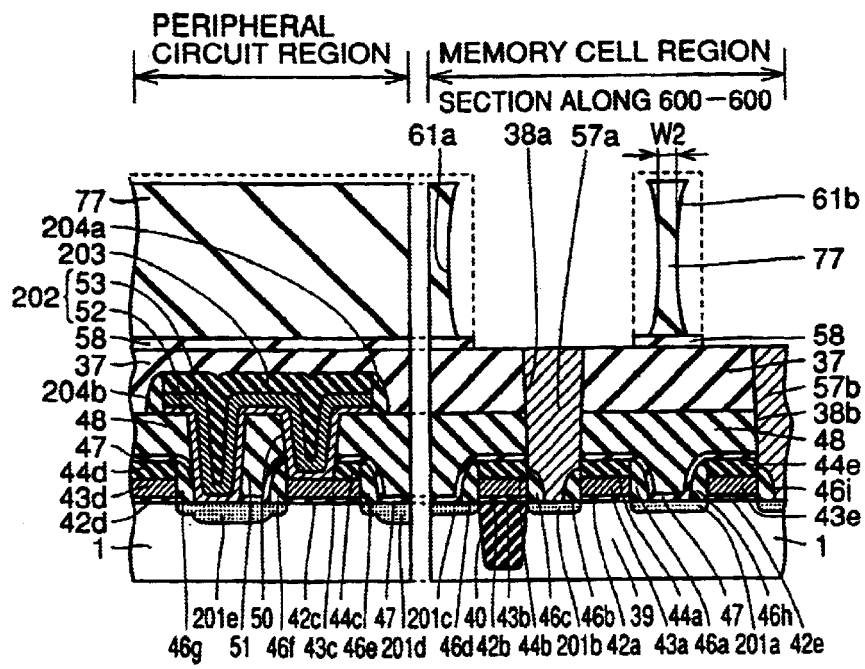
FIGS. 48 and 49 are sectional views for illustrating first and second steps of a method of fabricating the second modification of the DRAM according to the embodiment 3 of the present invention shown in FIG. 47.
Figure 49:
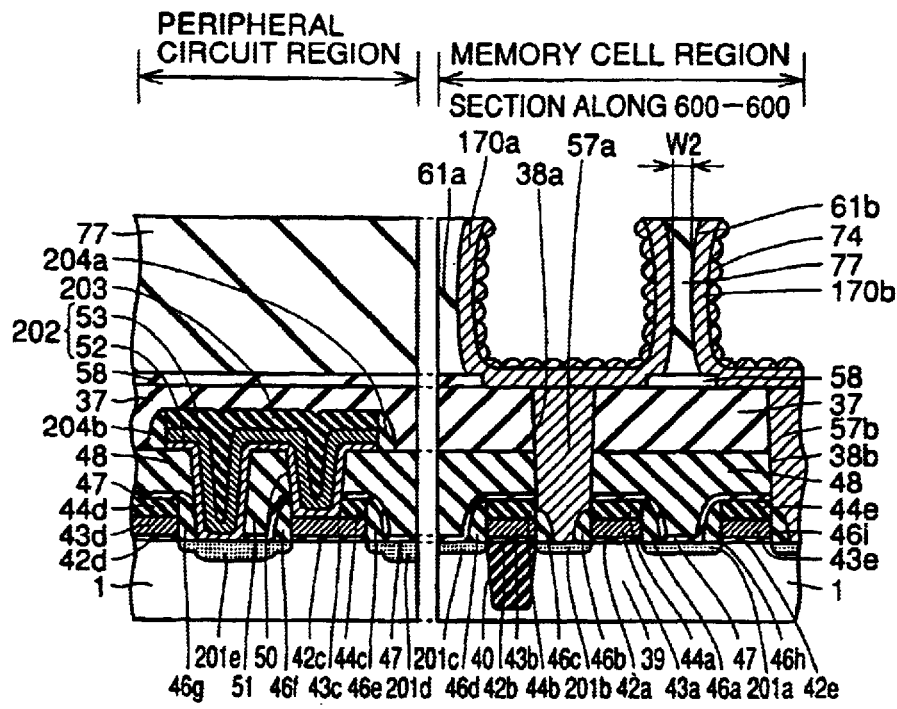

With reference to FIGS. 48 and 49, a method of fabricating the second modification of the DRAM according to the embodiment 3 of the present invention is now described.

First, a fabrication step identical to the first step of fabricating the DRAM according to the embodiment 3 shown in FIG. 40 is carried out. However, a third interlayer isolation film 77 (see FIG. 48) is dry-etched under a high-pressure atmosphere. Thus, the side surfaces of the third interlayer isolation film 77 located in the openings 61a and 61b can be formed to have curved planes. In this etching step, the volume of etching gas mixed into the atmosphere gas for forming films for protecting the side surfaces of the third interlayer isolation film 77 may be reduced. The etching gas employed in this etching step may be prepared from $CHF_3/CF_4$ gas. In this case, it is effective to increase the flow rate of $CF_4$ for forming the curved planes, and it is also effective to mix gas of $O_2$ or the like.

Then, the capacitor lower electrodes 170a and 170b and granular crystals 74 are formed in the openings 61a and 61b as shown in FIG. 49, similarly to the fabrication step for the DRAM according to the embodiment 3 of the present invention shown in FIG. 42.

Thereafter a dielectric film 150 (see FIG. 47) and the like are formed, thereby obtaining the structure shown in FIG. 47. The formation of the curved planes on the side surfaces of the capacitor lower electrodes 170a and 170b can be applied to the capacitor lower electrode 170a of the DRAM according to the embodiment 1 shown in FIGS. 1 to 26 as well as to the cylindrical capacitor lower electrode 92 of the DRAM according to the embodiment 2, to attain similar effects.

(Embodiment 4)

Figure 50:
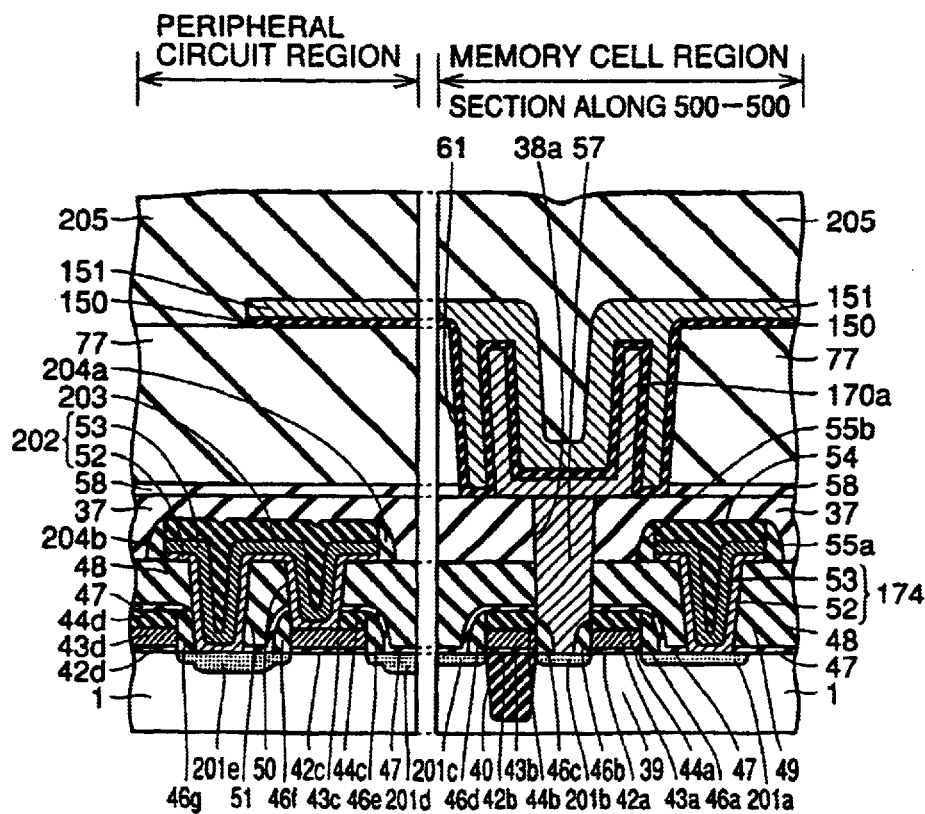
FIG. 50 is a sectional view for illustrating the structure of a DRAM according to an embodiment 4 of the present invention.

FIG. 50 shows a section of a memory cell region taken along the line 500—500 in the typical plan view of the memory cell region of the DRAM shown in FIG. 1. A DRAM according to an embodiment 4 of the present invention shown in FIG. 50 is basically similar in structure to the DRAM according to the embodiment 1 shown in FIG. 2. In the DRAM according to the embodiment 4, however, clearances are defined between a capacitor lower electrode 170a and a third interlayer isolation film 77 in a fabrication step described later, so that a dielectric film 150 and a capacitor upper electrode 151 are formed in these clearances. Further, an upper surface of the third interlayer isolation film 77 is formed to be substantially flush with a top surface of the capacitor lower electrode 170a. Thus, the clearances are defined between the capacitor lower electrode 170a and the third interlayer isolation film 77 in the fabrication step described later in the DRAM according to the embodiment 4 of the present invention, whereby side surfaces of the capacitor lower electrode 170a can be utilized as a capacitor. Thus, the capacitance of the capacitor can be increased without changing the shape of the capacitor lower electrode 170a.

Further, the third interlayer isolation film 77 is formed to extend from the memory cell region to a peripheral circuit region. In case of forming a fourth interlayer isolation film on the capacitor upper electrode 151 in the memory cell region and the peripheral circuit region, therefore, no step is formed on an upper surface of the fourth interlayer isolation film between the memory cell region and the peripheral circuit region. In addition, the clearances are defined only on the side surfaces of the capacitor lower electrode 170a in the fabrication step described later, whereby a bottom surface of the capacitor lower electrode 170a is regularly in contact with the second interlayer isolation film 37 regardless of the clearances. In a step of cleaning a semiconductor substrate provided with the clearances, therefore, the bottom surface of the capacitor lower electrode 170a is in contact with the second interlayer isolation film 37, which serves as a reinforcing member against a physical impact. Thus, the capacitor lower electrode 170a is prevented from breaking by a physical impact in the aforementioned cleaning step or the like.

The structure shown in the embodiment 4 can be applied to the embodiments 1 to 3, to attain similar effects.

With reference to FIGS. 51 to 55, a method of fabricating the DRAM according to the embodiment 4 of the present invention is now described.

Figure 51:
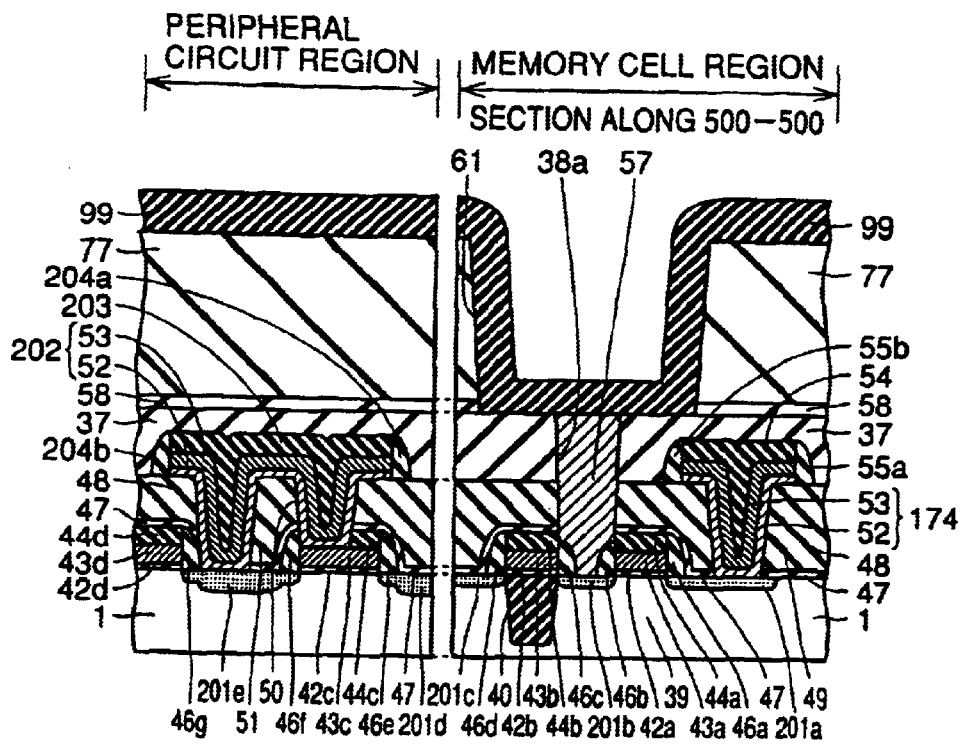
FIGS. 51 to 55 are sectional views for illustrating first to fifth steps of a method of fabricating the DRAM according to the embodiment 4 of the present invention shown in FIG. 50.

First, fabrication steps identical to those for the DRAM according to the embodiment 1 of the present invention shown in FIGS. 3 to 9 are carried out, and a silicon nitride film 58 (see FIG. 51) and the third interlayer isolation film 77 (see FIG. 51) are formed on a second interlayer isolation film 37 (see FIG. 51). A resist pattern (not shown) is formed on the third interlayer isolation film 77, and thereafter employed as a mask for partially removing the third interlayer isolation film 77 by anisotropic etching, thereby forming an opening 61 (see FIG. 51). The silicon nitride film 58 is removed from a bottom portion of the opening 61 by etching. Alternatively, the width of the opening 61 may be increased by etching, similarly to the fabrication step for the DRAM according to the embodiment 3 of the present invention shown in FIG. 39. In this case, an effect similar to that of the embodiment 3 can be attained. Thereafter a silicon nitride film 99 (see FIG. 51) is formed on the third interlayer isolation film 77 and in the opening 61. Thus, the structure shown in FIG. 51 is obtained. Alternatively, the silicon nitride film 99 may be formed on the third interlayer isolation film 77 and in the opening 61 without removing the silicon nitride film 58 from the bottom portion of the opening 61.

Figure 52:
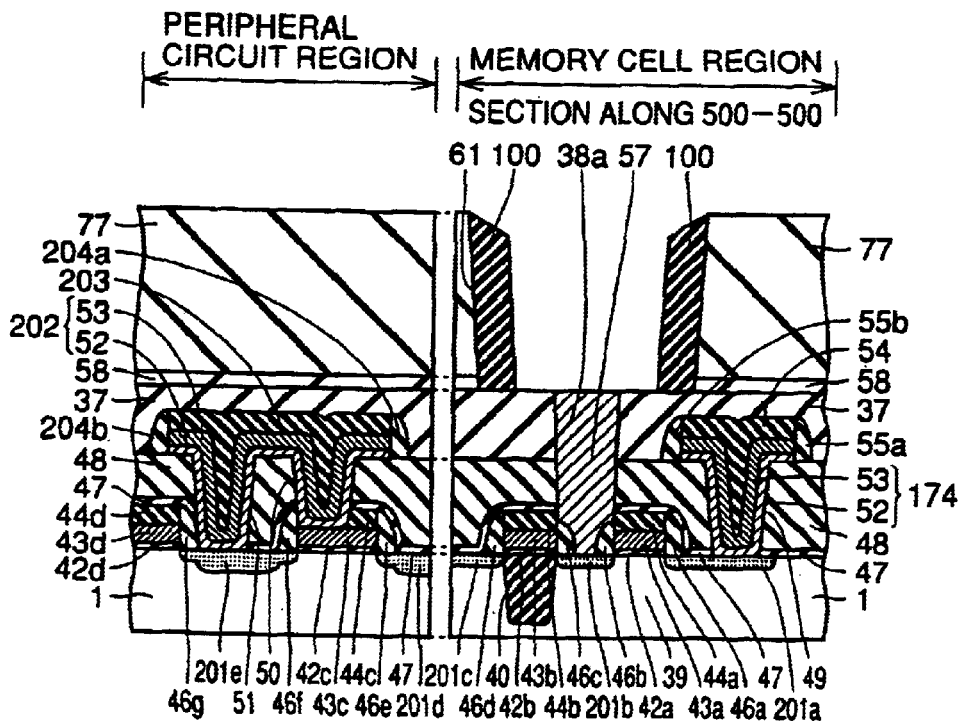

Then, the silicon nitride film 99 is partially removed by anisotropic etching for forming side walls 100 consisting of silicon nitride films in the opening 61, thereby obtaining the structure shown in FIG. 52.

Figure 53:
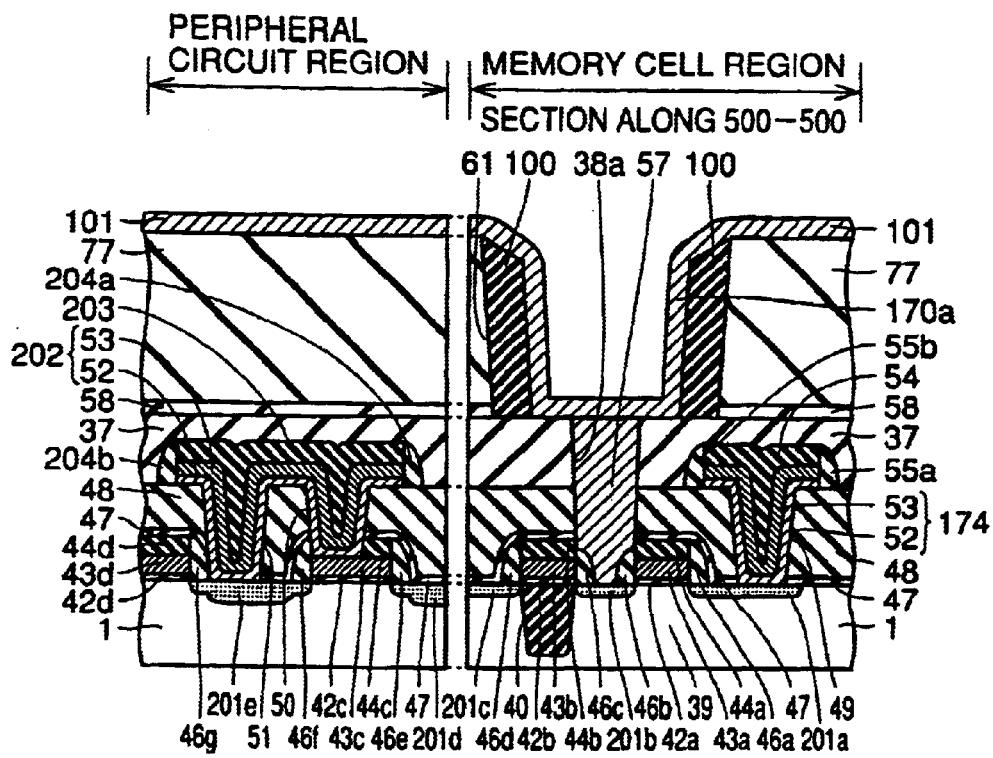

Then, a conductor film 101 of polysilicon or amorphous silicon is formed on the third interlayer isolation film 77 and in the opening 61, as shown in FIG. 53.

Figure 54:
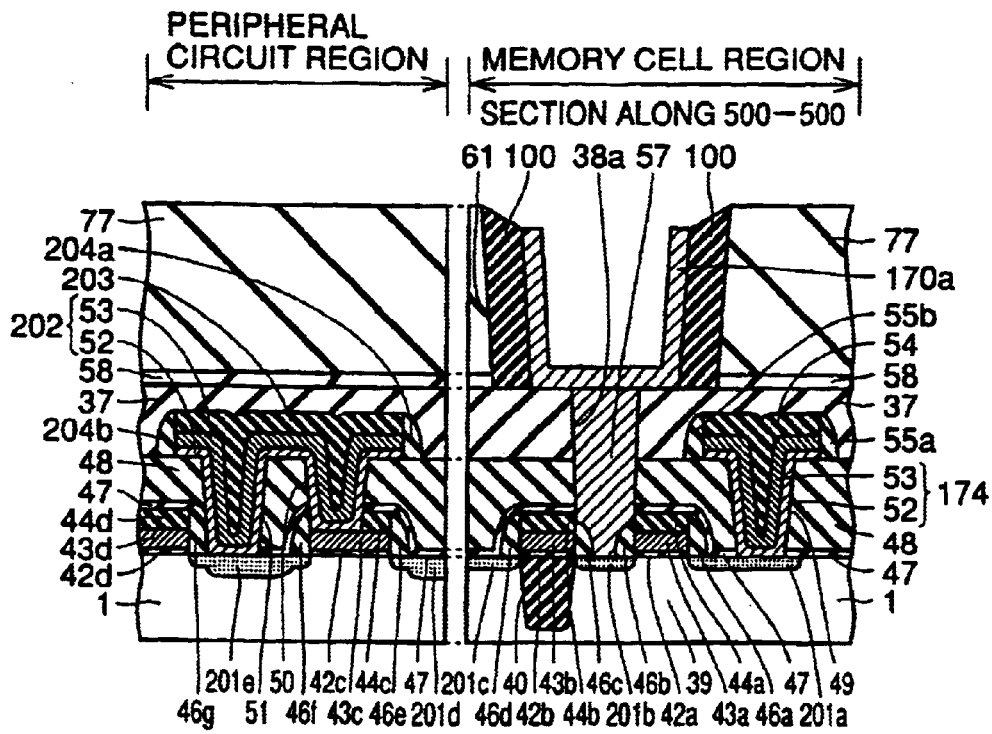

Then, a part of the conductor film 101 located on the third interlayer isolation film 77 is removed by etching or the like, similarly to the embodiment 1. Thus, the structure shown in FIG. 54 is obtained. Through this step, the capacitor lower electrode 170a is isolated every bit.

Figure 55:
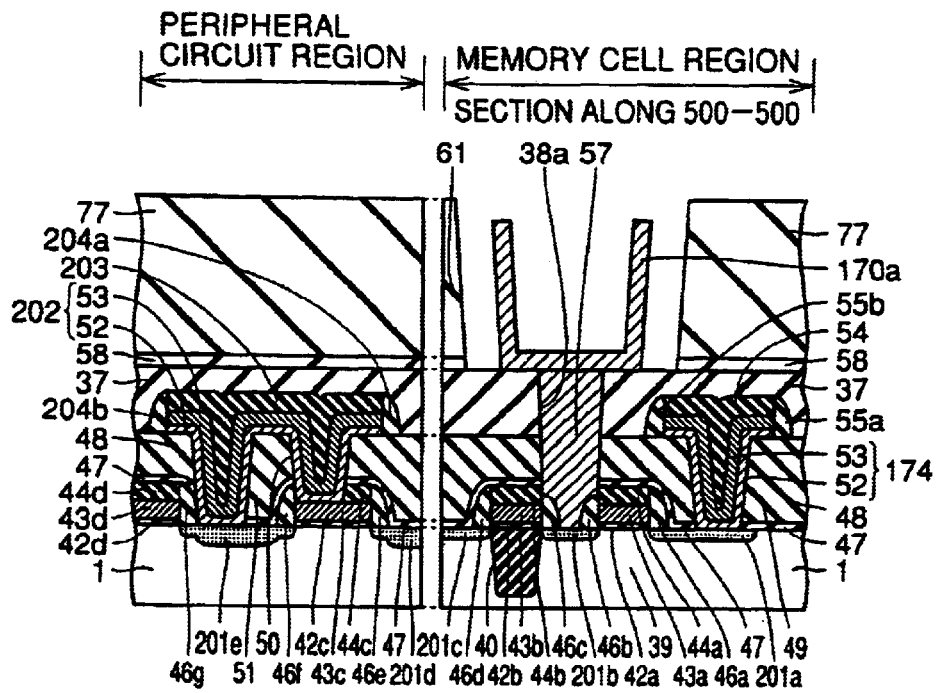

Then, the side walls 100 consisting of silicon nitride films are selectively removed by etching, thereby defining the clearances between the capacitor lower electrode 170a and the third interlayer isolation film 77. Thus, the structure shown in FIG. 55 is obtained.

Thereafter a dielectric film 150 (see FIG. 50) and the like are formed, thereby obtaining the structure shown in FIG. 50. The peripheral circuit region is formed through fabrication steps identical to those for the peripheral circuit region of the DRAM according to the embodiment 1 of the present invention shown in FIGS. 3 to 13.

Figure 56:
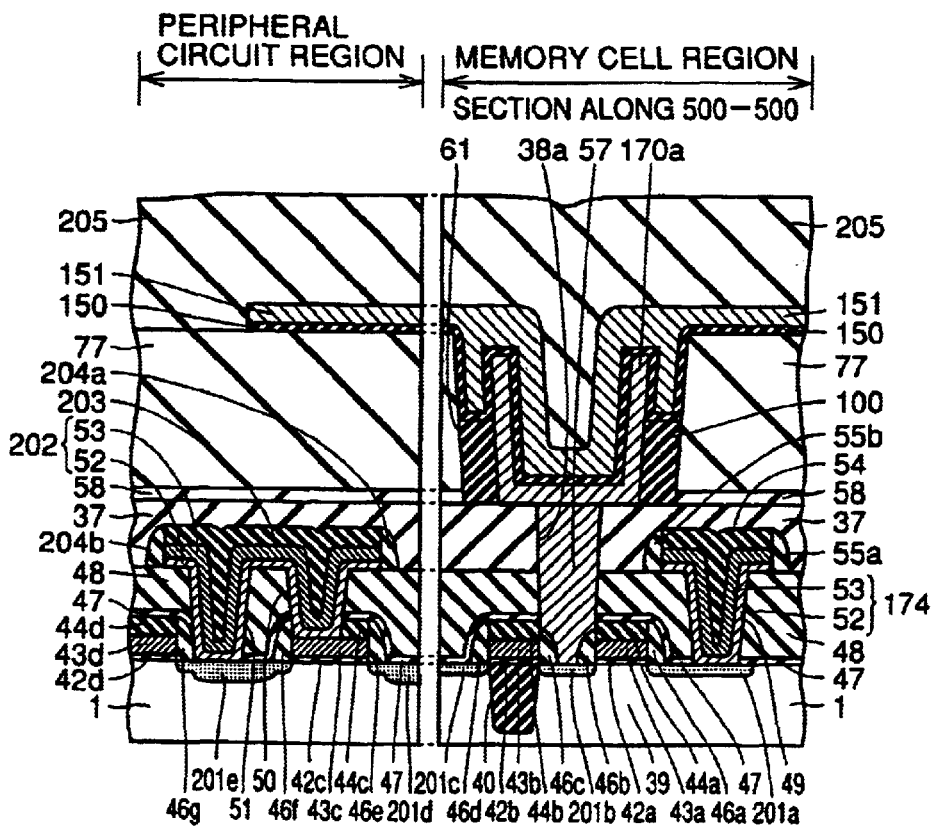
FIG. 56 is a sectional view for illustrating a first modification of the DRAM according to the embodiment 4 of the present invention.

Referring to FIG. 56, a first modification of the DRAM according to the embodiment 4 of the present invention is basically similar in structure to the DRAM according to the embodiment 4 shown in FIG. 50. In the first modification, however, a capacitor is formed while partially leaving side walls 100 consisting of silicon nitride films located between a capacitor lower electrode 170a and a third interlayer isolation film 77. The side walls 100 are so partially left that the surface area of outer side surfaces of the capacitor lower electrode 170a serving as the capacitor can be changed by changing the amount of the left side walls 100. Thus, the capacitance of the capacitor can be changed without changing the structure of the capacitor lower electrode 170a. Further, the remaining parts of the side walls 100 also serve as parts of a reinforcing member against a physical impact, whereby the capacitor lower electrode 170a can be further effectively prevented from breaking by a physical impact in a cleaning step or the like.

Figure 57:
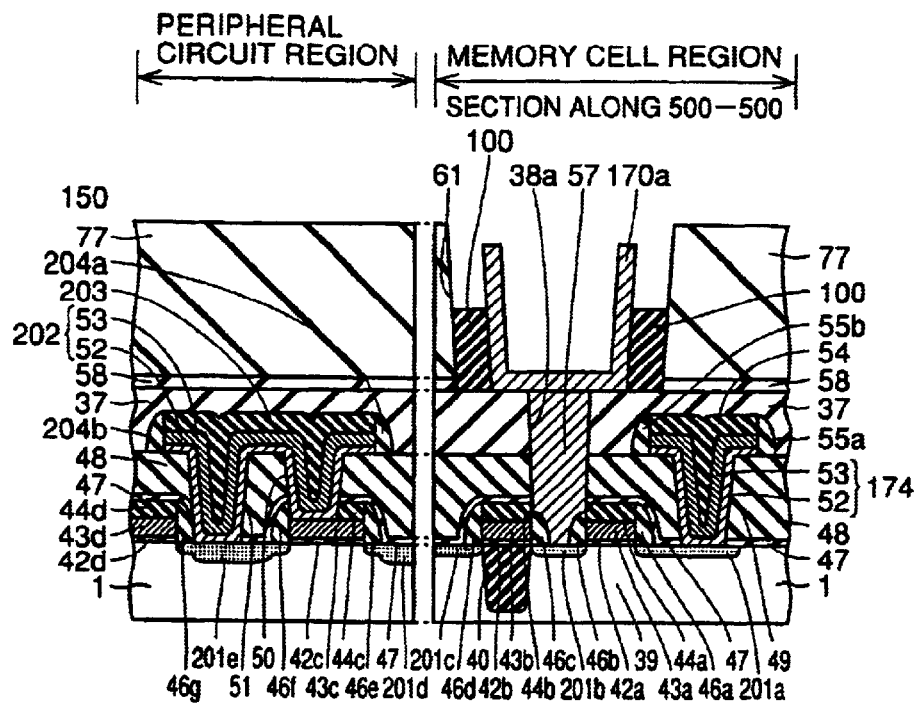
FIG. 57 is a sectional view for illustrating a first step of a method of fabricating the first modification of the DRAM according to the embodiment 4 of the present invention shown in FIG. 56.

With reference to FIG. 57, a method of fabricating the first modification of the DRAM according to the embodiment 4 of the present invention is now described.

First, fabrication steps identical to those for the DRAM according to the embodiment 4 of the present invention shown in FIGS. 51 to 54 are carried out, and thereafter the side walls 100 are partially removed by etching to be partially left, as shown in FIG. 57. In case of employing wet etching, only parts of the side walls 100 can be removed by controlling the time for dipping the same in an etching solution.

Thereafter a dielectric film 150 (see FIG. 56) and the like are formed, thereby obtaining the structure shown in FIG. 56.

Figure 58:
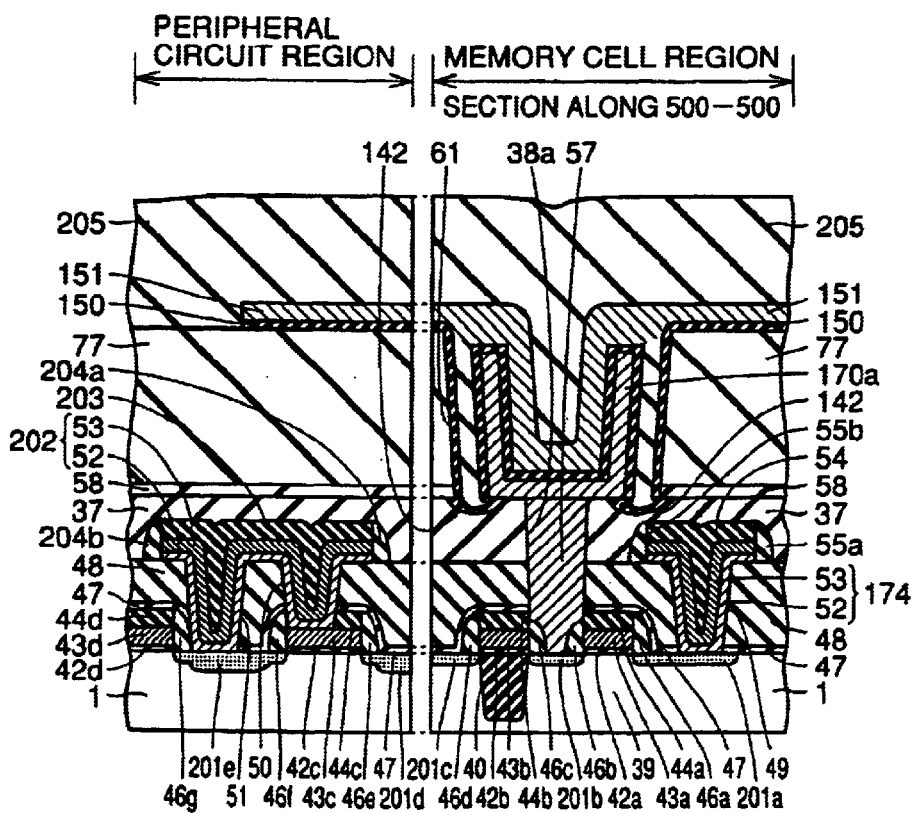
FIG. 58 is a sectional view for illustrating a second modification of the DRAM according to the embodiment 4 of the present invention.

Referring to FIG. 58, a second modification of the DRAM according to the embodiment 4 of the present invention is basically similar in structure to the DRAM according to the embodiment 4 shown in FIG. 50. In the second modification of the DRAM according to the embodiment 4 of the present invention shown in FIG. 58, however, clearances located between a capacitor lower electrode 170a and a third interlayer isolation film 77 are so defined as to partially expose a bottom surface of the capacitor lower electrode 170a in a fabrication step described later. Thus, the exposed part of the bottom surface of the capacitor lower electrode 170a also serves as a capacitor due to formation of a dielectric film 150 and the like thereon. Thus, the capacitance of the capacitor can be further increased.

Figure 59:
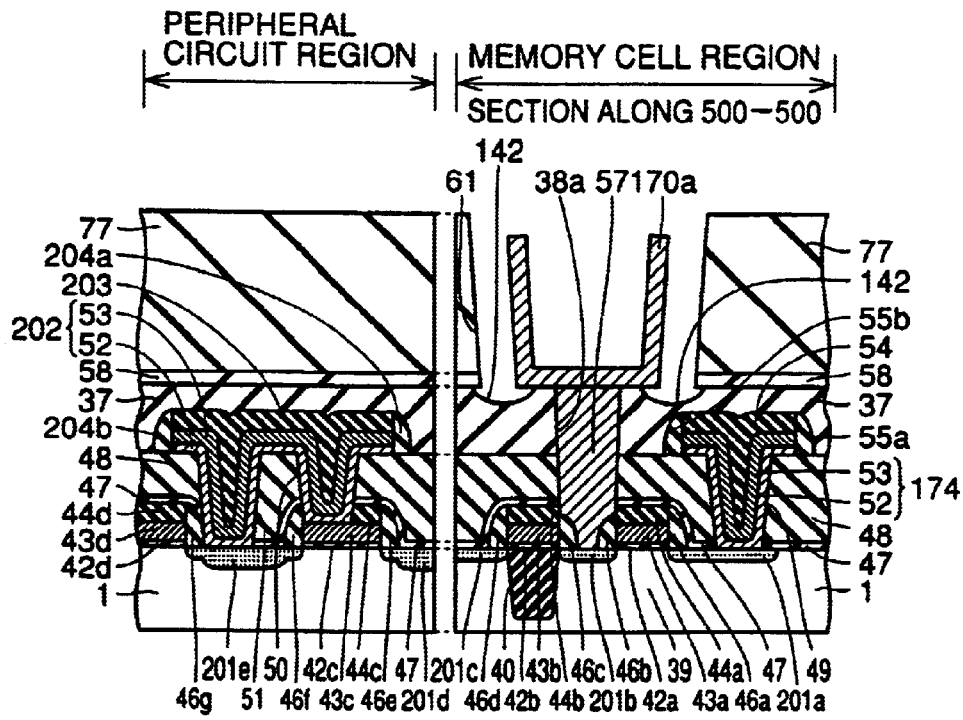
FIG. 59 is a sectional view for illustrating a first step of a method of fabricating the second modification of the DRAM according to the embodiment 4 of the present invention shown in FIG. 58.

With reference to FIG. 59, a method of fabricating the second modification of the DRAM according to the embodiment 4 of the present invention is now described.

First, fabrication steps identical to those for the DRAM according to the embodiment 4 of the present invention shown in FIGS. 51 to 54 are carried out, thereafter side walls 100 (see FIG. 54) located between the capacitor lower electrode 170a and the third interlayer isolation film 77 are removed by etching, and thereafter etching is performed to partially remove a second interlayer isolation film 37 located under the side walls 100. Thus, clearances can be defined to expose outer side surfaces and the part of the bottom surface of the capacitor lower electrode 170a. The remaining part of the bottom surface of the capacitor lower electrode 170a is in contact with the second interlayer isolation film 37 at this time, whereby the second interlayer isolation film 37 serves as a reinforcing member for preventing the capacitor lower electrode 170a from breaking or the like against a physical impact in a cleaning step or the like which is thereafter carried out.

Then, the dielectric film 150 (see FIG. 58) and the like are formed, thereby obtaining the structure shown in FIG. 58.

Figure 60:
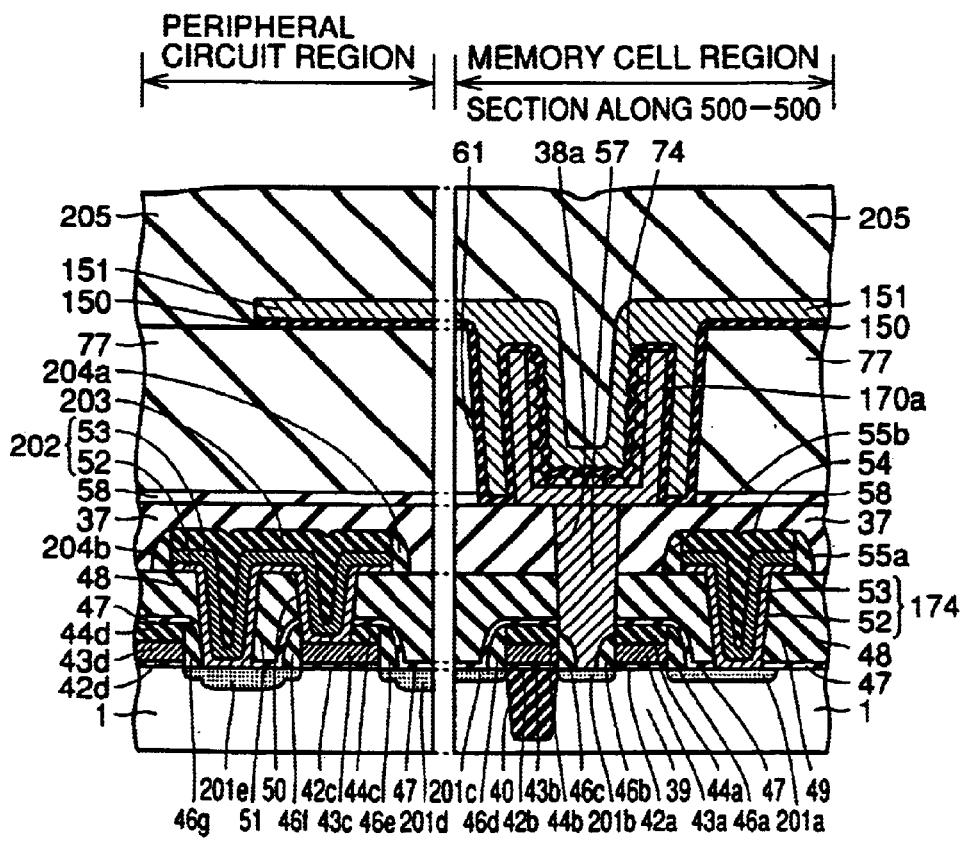
FIG. 60 is a sectional view for illustrating a third modification of the DRAM according to the embodiment 4 of the present invention.

Referring to FIG. 60, a third modification of the DRAM according to the embodiment 4 of the present invention is basically similar in structure to the DRAM according to the embodiment 4 shown in FIG. 50. In the third modification of the DRAM according to the embodiment 4 of the present invention, however, granular crystals 74 are formed on inner side surfaces of a capacitor lower electrode 170a. Therefore, the surface area of the capacitor lower electrode 170a can be increased without increasing its occupied area, thereby increasing the capacitance of the capacitor. Consequently, the occupied area of the capacitor lower electrode 170a can be reduced while ensuring a constant capacitor capacitance. Thus, the semiconductor device can be refined.

Figure 61:
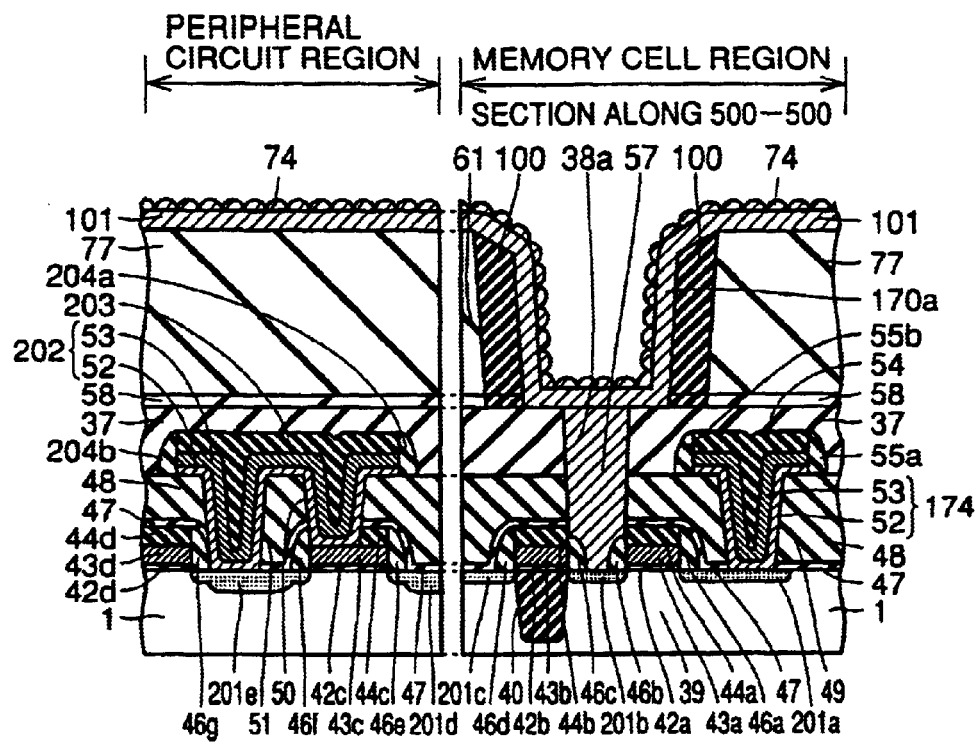
FIGS. 61 to 63 are sectional views for illustrating first to third steps of a method of fabricating the third modification of the DRAM according to the embodiment 4 of the present invention shown in FIG. 60.
Figure 62:
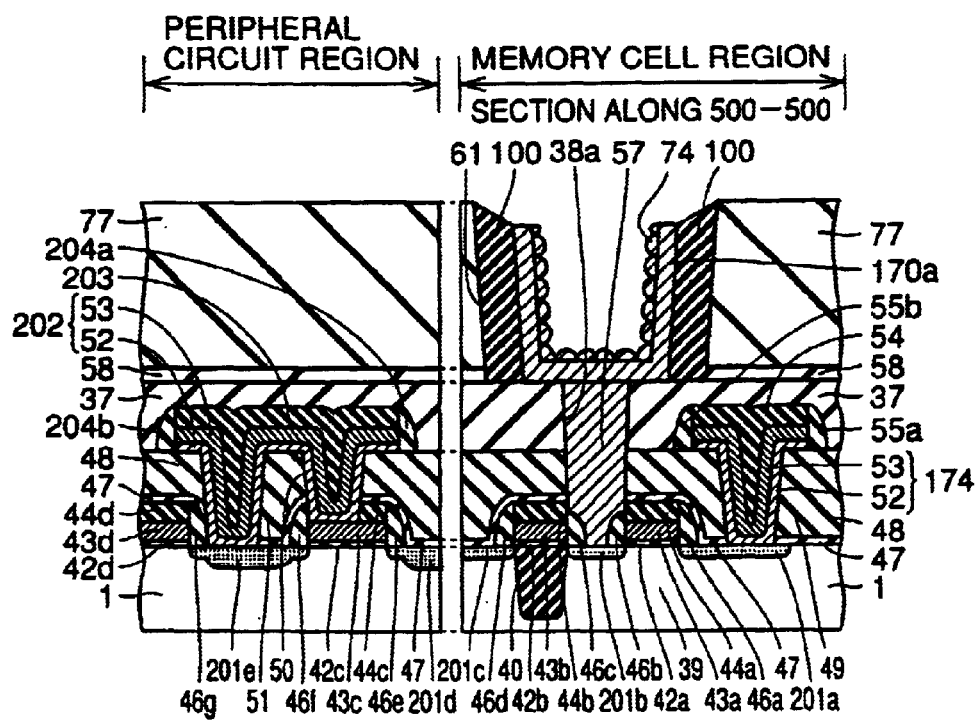
Figure 63:
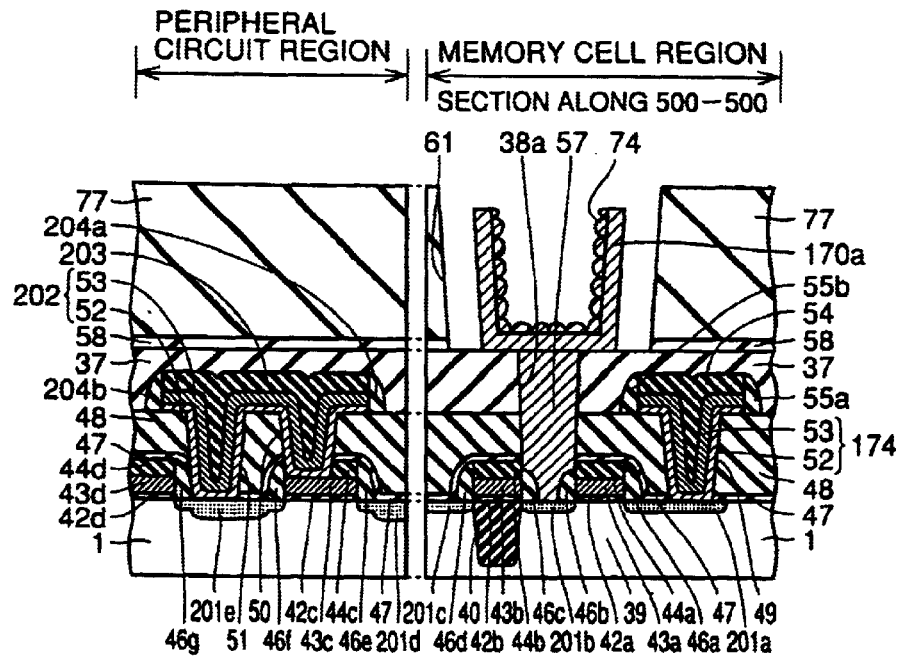

With reference to FIGS. 61 to 63, a method of fabricating the third modification of the DRAM according to the embodiment 4 of the present invention is now described.

First, fabrication steps identical to those for the DRAM according to the embodiment 4 of the present invention shown in FIGS. 51 to 53 are carried out, and thereafter the granular crystals 74 are formed on a conductor film 101 through a step similar to that employed in the embodiment 1 or the like. Thus, the structure shown in FIG. 61 is obtained.

Then, the conductor film 101 and the granular crystals 74 located on a third interlayer isolation film 77 are removed by etching, as shown in FIG. 62. CMP may be employed at this time.

Then, side walls 100 are removed from the interior of an opening 61 by etching, thereby defining clearances between the capacitor lower electrode 170a and the third interlayer isolation film 77, as shown in FIG. 63.

Thereafter a dielectric film 150 (see FIG. 60) of the capacitor and the like are formed, thereby obtaining the structure shown in FIG. 60.

Figure 64:
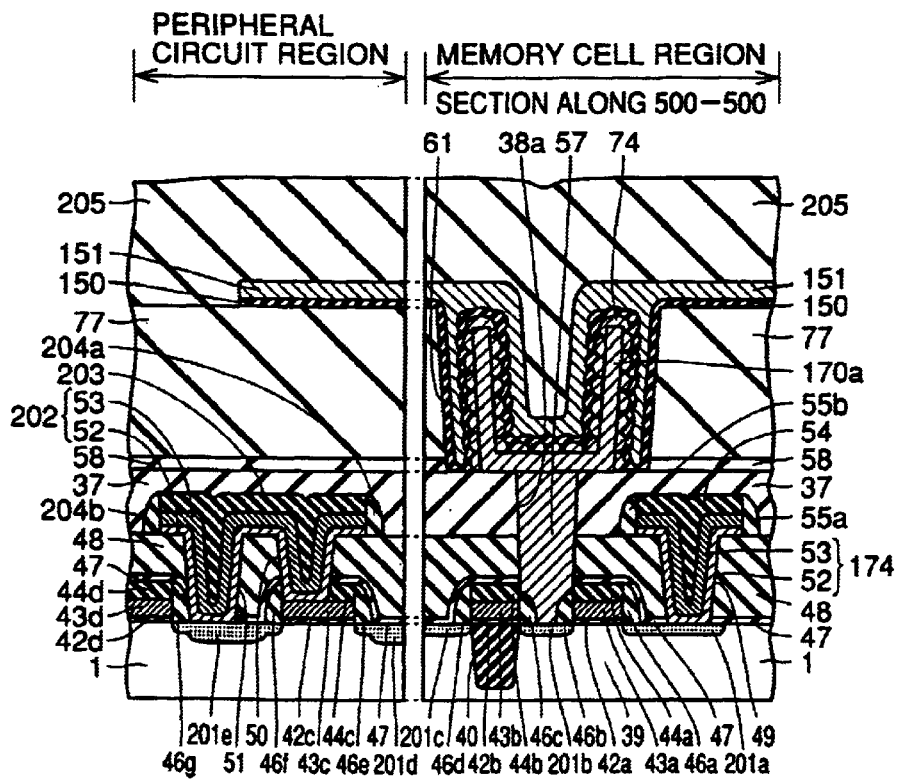
FIG. 64 is a sectional view for illustrating a fourth modification of the DRAM according to the embodiment 4 of the present invention.

Referring to FIG. 64, a fourth modification of the DRAM according to the embodiment 4 of the present invention is basically similar in structure to the DRAM according to the embodiment 4 shown in FIG. 50. In the fourth modification of the DRAM according to the embodiment 4 of the present invention, however, granular crystals 74 are formed on overall inner and outer side surfaces of a capacitor lower electrode 170a. Therefore, the surface area of the capacitor lower electrode 170a can be further increased without increasing its occupied area. Thus, the occupied area of the capacitor lower electrode 170a can be further reduced as compared with the prior art while ensuring a constant capacitor capacitance. Consequently, the semiconductor device can be further refined.

After forming an opening 61, the width thereof may be increased by etching similarly to the embodiment 3, thereby reducing the width of a third interlayer isolation film 77 located between the capacitor lower electrode 170a and another capacitor lower electrode to be smaller than the minimum working size formable by photolithography. Thus, the semiconductor device can be implemented with higher density of integration.

Figure 65:
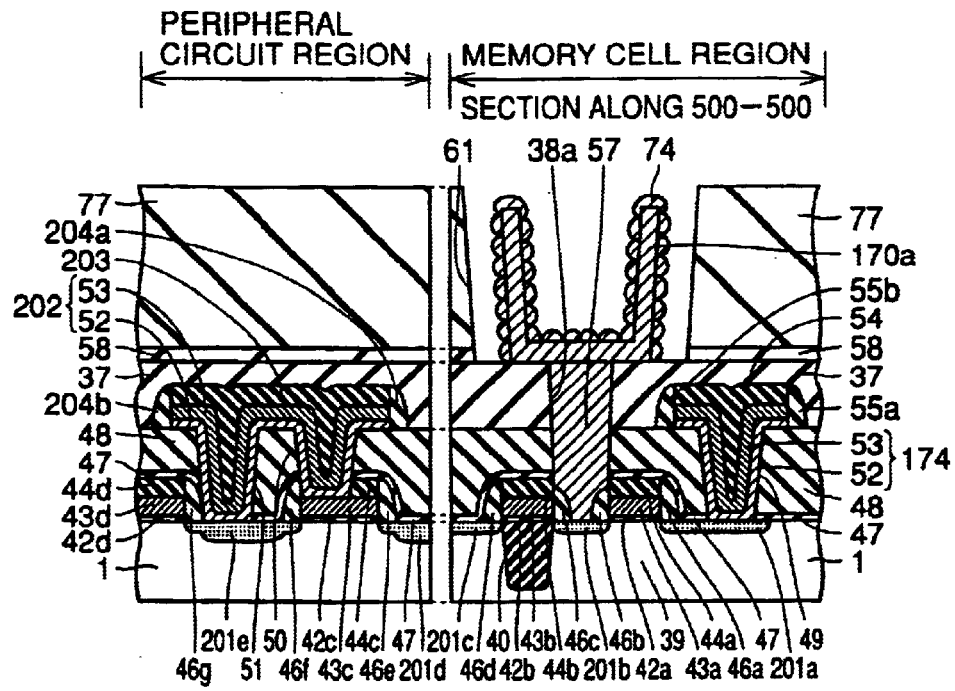
FIG. 65 is a sectional view for illustrating a first step of a method of fabricating the fourth modification of the DRAM according to the embodiment 4 of the present invention shown in FIG. 64.

With reference to FIG. 65, a method of fabricating the fourth modification of the DRAM according to the embodiment 4 of the present invention shown in FIG. 64 is now described.

First, fabrication steps identical to those for the DRAM according to the embodiment 4 of the present invention shown in FIGS. 51 to 55 are carried out. Thereafter the granular crystals 74 (see FIG. 65) are formed on the surfaces of the capacitor lower electrode 170a through a step identical to that employed in the embodiment 1 of the present invention. Thus, the structure shown in FIG. 65 is obtained.

Thereafter a dielectric film 150 (see FIG. 64) and the like are formed, thereby obtaining the structure shown in FIG. 64.

The first to fourth modifications of the embodiment 4 may be applied to the embodiments 1 to 3, to attain similar effects.

(Embodiment 5)

Figure 66:
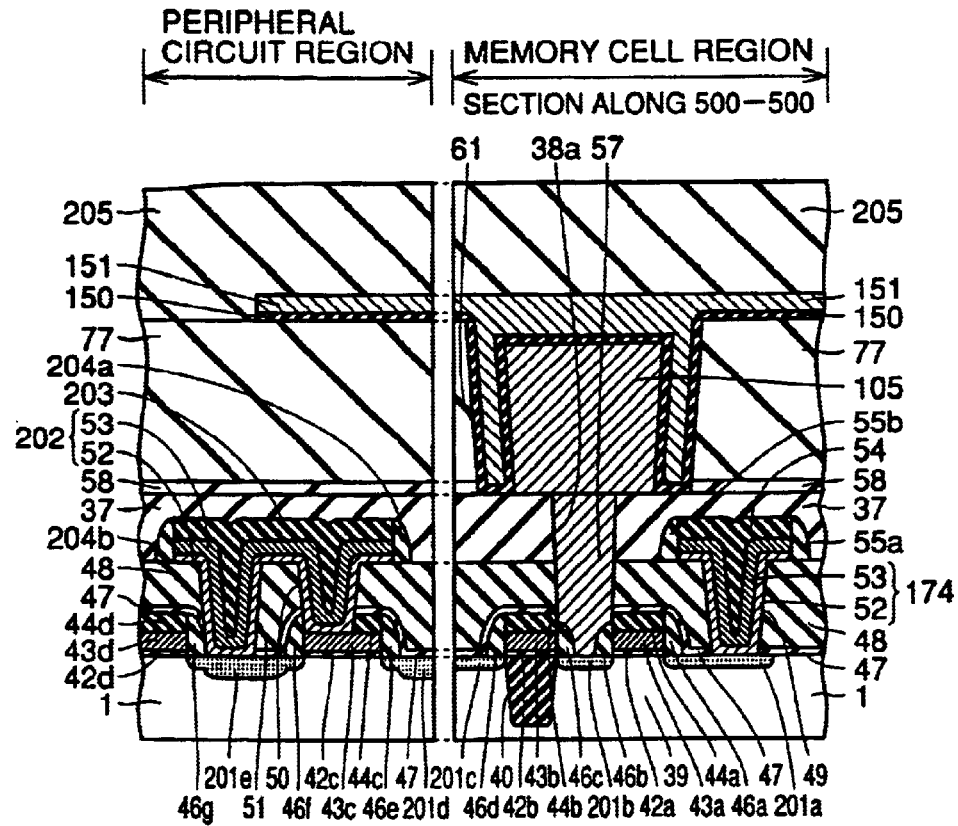
FIG. 66 is a sectional view for illustrating the structure of a DRAM according to an embodiment 5 of the present invention.

Referring to FIG. 66, A DRAM according to an embodiment 5 of the present invention is basically similar in structure to the DRAM according to the embodiment 4 shown in FIG. 50. However, a capacitor lower electrode 105 of the DRAM according to the embodiment 5 is in the form of a thick film. In the DRAM according to the embodiment 5 of the present invention, clearances are defined between side surfaces of the capacitor lower electrode 105 and a third interlayer isolation film 77 for forming a dielectric film 150 and a capacitor upper electrode 151 on the side surfaces of the capacitor lower electrode 105, whereby the capacitance of the capacitor can be increased. Further, the clearances are defined only between the side surfaces of the capacitor lower electrode 105 and the third interlayer isolation film 77 in a fabrication step described later, whereby a bottom surface of the capacitor lower electrode 105 can be brought into contact with a second interlayer isolation film 37 while defining such clearances. When a semiconductor substrate provided with this semiconductor device is cleaned in the state defining the clearances, therefore, the second interlayer isolation film 37 which is in contact with the bottom surface of the capacitor lower electrode 105 serves as a reinforcing member for preventing the capacitor lower electrode 105 from partial breaking caused by physical vibration in the cleaning step or the like.

Further, the capacitor lower electrode 105 is embedded in the third interlayer isolation film 77, whereby no step is caused on an upper surface of a fourth interlayer isolation film 205 between a memory cell region and a peripheral circuit region or the like. In case of forming a wiring layer consisting of aluminum or the like on the fourth interlayer isolation film 205 by photolithography, therefore, the pattern of the wiring layer is prevented from being blurred by such a step on the upper surface of the fourth interlayer isolation film 205. Thus, the wiring layer is prevented from disconnection or shorting resulting from a blurred pattern. Consequently, the semiconductor device can be implemented with higher density of integration while ensuring the capacitance of the capacitor and attaining high reliability.

In the embodiment 5, the width of an opening 61 may be increased by etching, for reducing the width of a part of the third interlayer isolation film 77 located between the capacitor lower electrode 105 and another capacitor lower electrode to be smaller than the minimum working size formable by photolithography. Thus, the interval between the capacitor lower electrode 105 and the other capacitor lower electrode can be reduced as compared with the prior art. Consequently, the semiconductor device can be implemented with higher density of integration.

Figure 67:
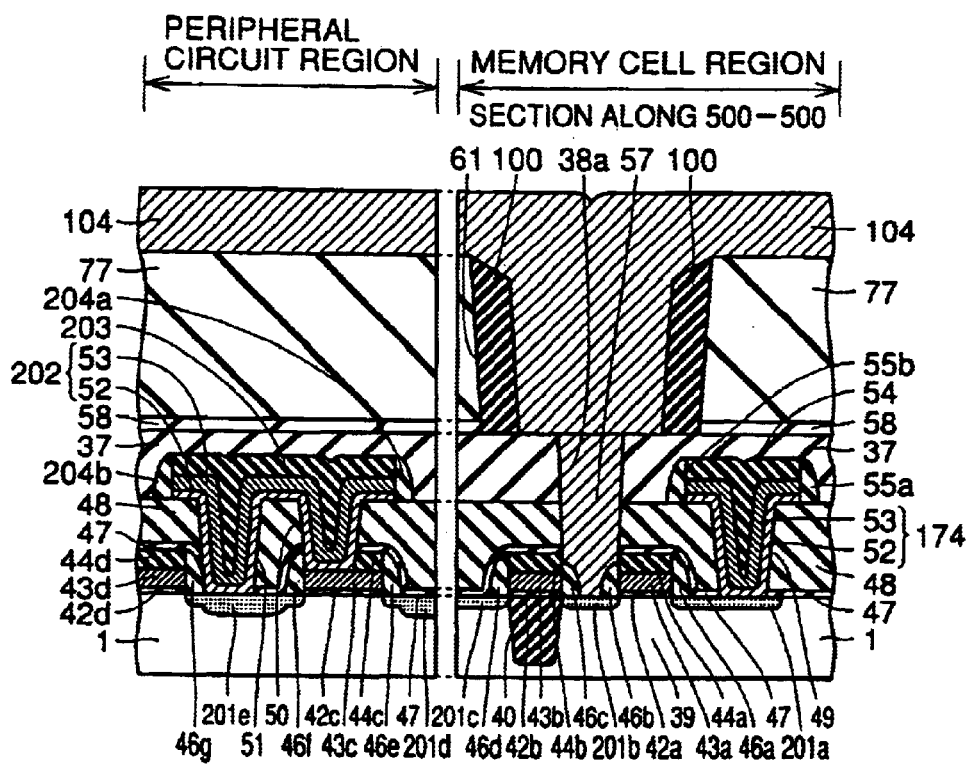
FIGS. 67 to 69 are sectional views for illustrating first to third steps of a method of fabricating the DRAM according to the embodiment 5 of the present invention shown in FIG. 66.
Figure 68:
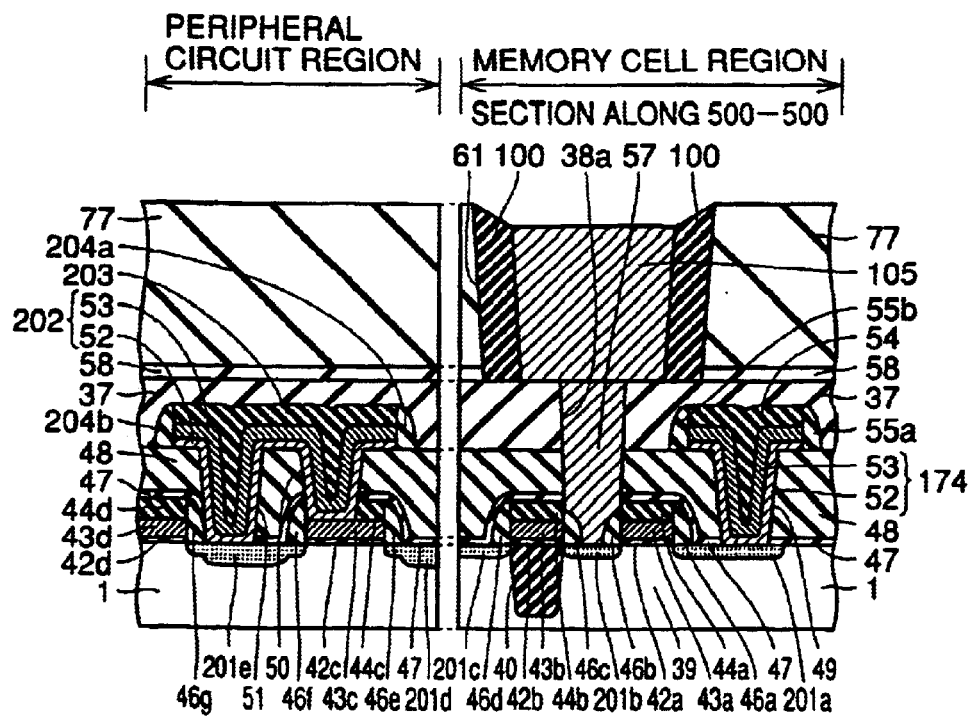
Figure 69:
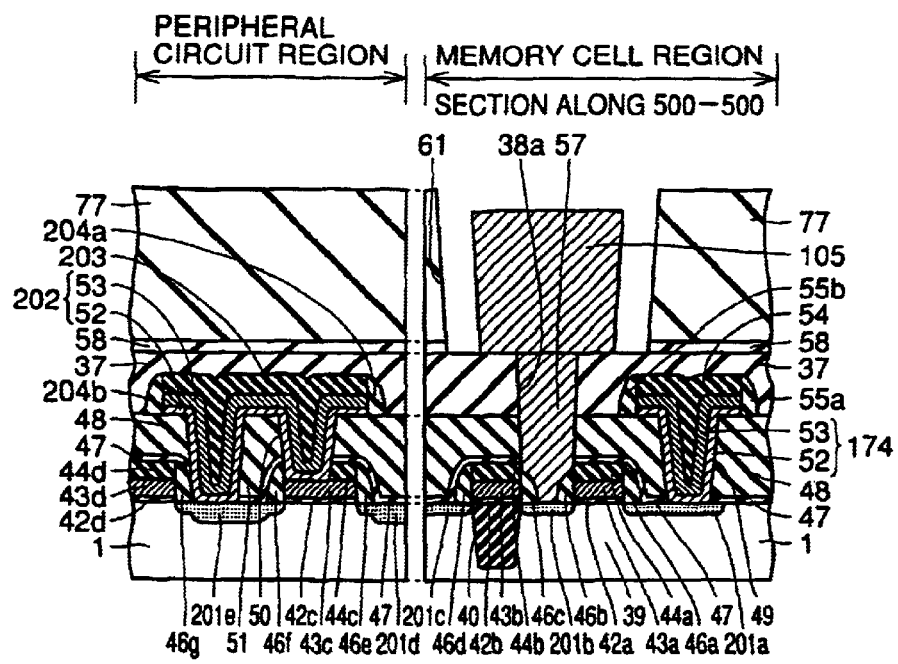

With reference to FIGS. 67 to 69, a method of fabricating the DRAM according to the embodiment 5 of the present invention is now described.

First, fabrication steps identical to those for the DRAM according to the embodiment 4 of the present invention shown in FIGS. 51 and 52 are carried out, and thereafter a dielectric film 104 consisting of amorphous silicon or the like is formed on the third interlayer isolation film 77 and in the opening 61, as shown in FIG. 67.

Then, a part of the dielectric film 104 located on the third interlayer isolation film 77 is removed by dry etching or CMP, thereby obtaining the structure shown in FIG. 68. Thus, the capacitor lower electrode 105 is formed.

Then, side walls 100 (see FIG. 68) are removed by etching as shown in FIG. 69, thereby defining the clearances between the capacitor lower electrode 105 and the third interlayer isolation film 77.

Thereafter the dielectric film 150 (see FIG. 66) and the like are formed on the surfaces of the capacitor lower electrode 105 and the third interlayer isolation film 77, thereby obtaining the structure shown in FIG. 66. The peripheral circuit region is formed through fabrication steps identical to those for the peripheral circuit region of the DRAM according to the embodiment 1 shown in FIGS. 3 to 13.

Figure 70:
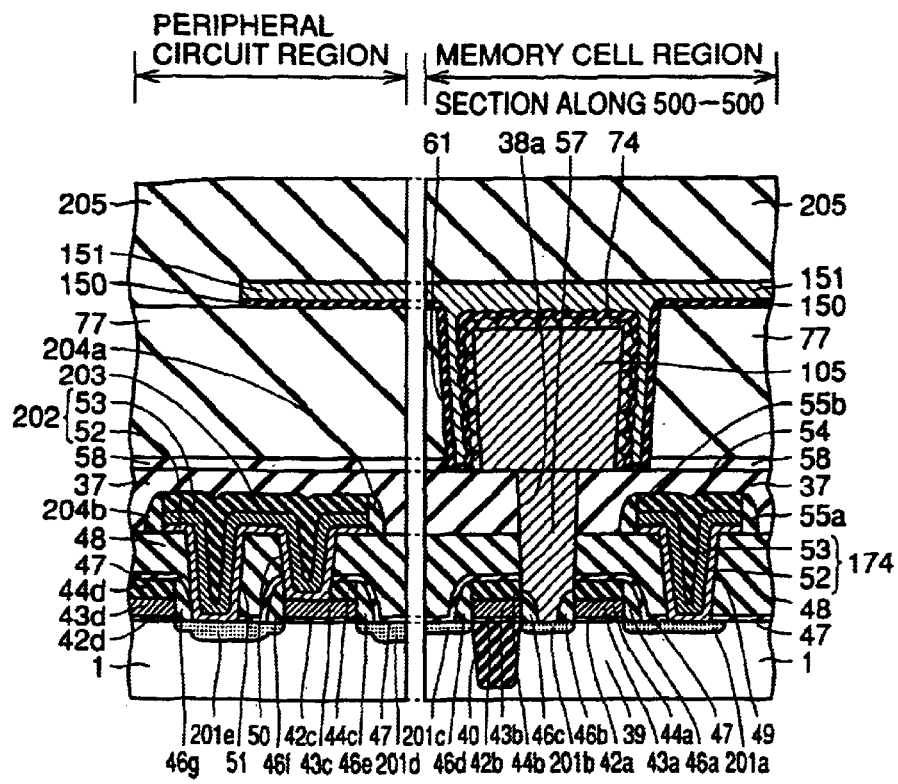
FIG. 70 is a sectional view showing a modification of the DRAM according to the embodiment 5 of the present invention.

Referring to FIG. 70, a modification of the DRAM according to the embodiment 5 of the present invention is basically similar in structure to the DRAM according to the embodiment 5 shown in FIG. 66. In the modification of the DRAM according to the embodiment 5 of the present invention, however, granular crystals 74 are formed on surfaces of a capacitor lower electrode 105. In addition to the effect of the DRAM according to the embodiment 5 of the present invention shown in FIG. 66, therefore, the surface area of the capacitor lower electrode 105 can be increased without increasing its occupied area. Thus, the capacitance of the capacitor can be increased. Therefore, the occupied area of the capacitor lower electrode 105 can be reduced as compared with the prior art while ensuring a constant capacitor capacitance. Consequently, the semiconductor device can be further refined.

Figure 71:
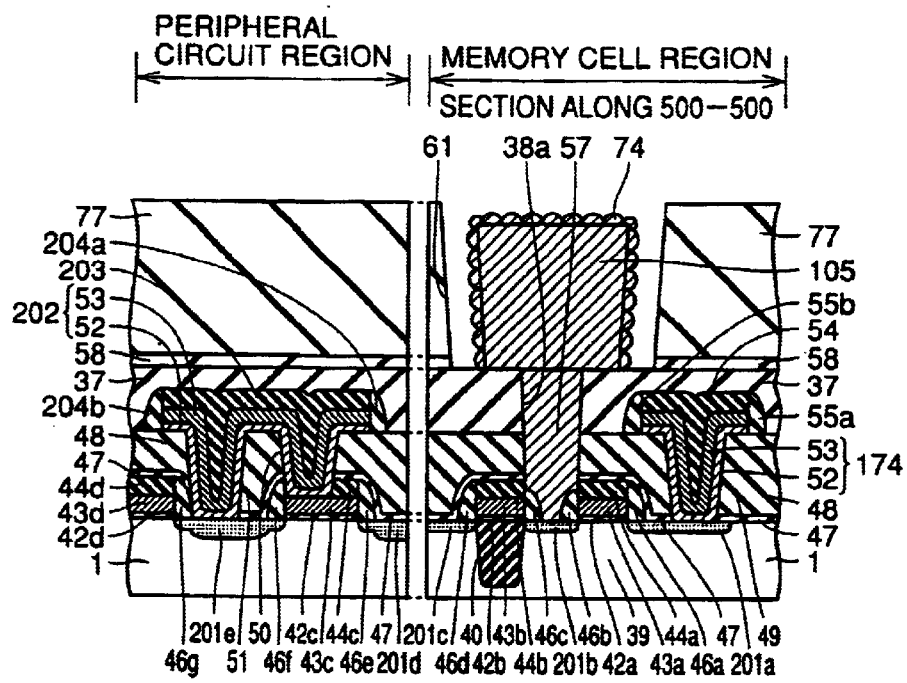
FIG. 71 is a sectional view for illustrating a first step of a method of fabricating the modification of the DRAM according to the embodiment 5 of the present invention shown in FIG. 70.

With reference to FIG. 71, a method of fabricating the modification of the DRAM according to the embodiment 5 of the present invention is now described.

First, fabrication steps identical to those for the DRAM according to the embodiment 5 of the present invention shown in FIGS. 67 to 69 are carried out, and thereafter the granular crystals 74 are formed on the surfaces of the capacitor lower electrode 105, as shown in FIG. 71. These granular crystals 74 are formed through a step similar to that for forming the granular crystals 74 in the DRAM according to the embodiment 1.

Thereafter a dielectric film 150 (see FIG. 70) and the like are formed on a third interlayer isolation film 77 and the surfaces of the capacitor lower electrode 105, thereby obtaining the structure shown in FIG. 70.

(Embodiment 6)

Figure 72:
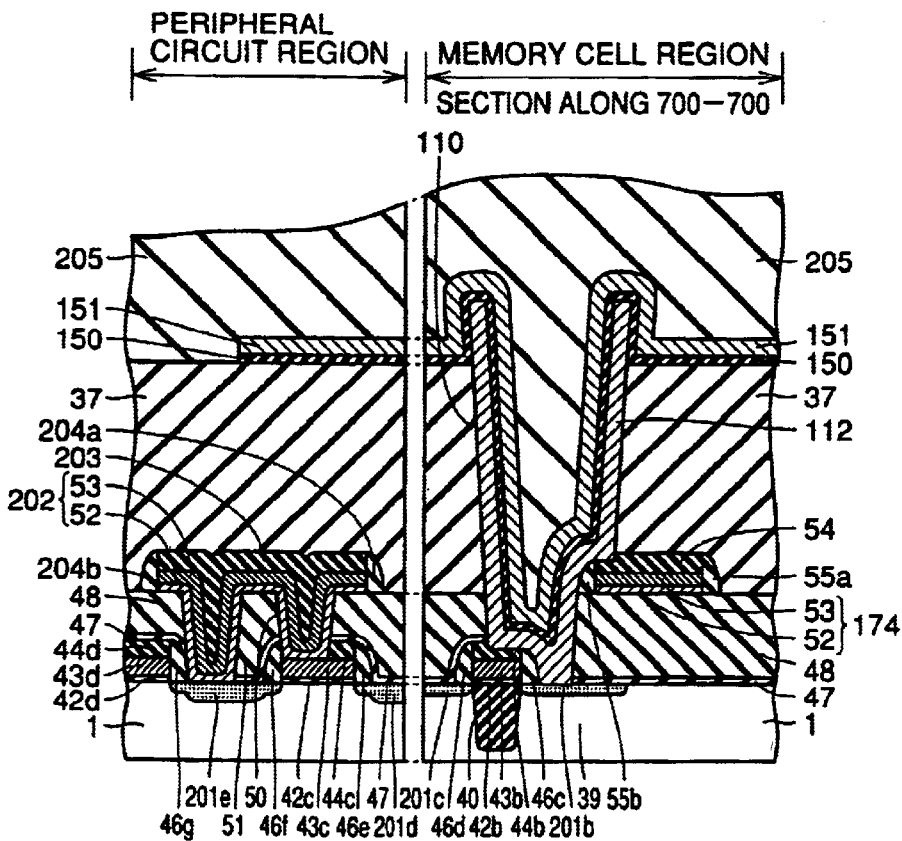
FIG. 72 is a sectional view for illustrating the structure of a DRAM according to an embodiment 6 of the present invention.

FIG. 72 is a sectional view of a DRAM according to an embodiment 6 of the present invention taken along the line 700—700 in the typical plan view of the memory cell region of the DRAM shown in FIG. 1.

Referring to FIG. 72, a trench isolation oxide film 40 is formed on a major surface of a semiconductor substrate 1 to enclose an active region 39 in the memory cell region of the DRAM according to the embodiment 6 of the present invention. Source/drain regions 201b and 201c are formed on the major surface of the semiconductor substrate 1. Further, a gate electrode 43b is formed on the major surface of the semiconductor substrate 1 through a gate insulating film 42b. A silicon nitride film 44b is formed on the gate electrode 43b. Side walls 46c and 46d consisting of silicon nitride films are formed on side surfaces of the silicon nitride film 44b, the gate electrode 43b and the gate insulating film 42b. A non-doped silicon oxide film 47 is formed on the silicon nitride film 44b, the side walls 46c and 46d and the major surface of the semiconductor substrate 1. A first interlayer isolation film 48 is formed on the non-doped silicon oxide film 47. A bit line 174 consisting of a doped polysilicon film 52 and a refractory metal silicide film 53 is formed on the first interlayer isolation film 48. Side walls 55a and 55b consisting of silicon nitride films are formed on side surfaces of the silicon nitride film 54 and the bit line 174. A second interlayer isolation film 37 is formed on the silicon nitride film 54, the side walls 55a and 55b and the first interlayer isolation film 48. The first and second interlayer isolation films 48 and 37 and the non-doped silicon oxide film 47 are partially removed, thereby forming an opening 110. The second interlayer isolation film 37 is formed to extend from the memory cell region to a peripheral circuit region. A capacitor lower electrode 112 consisting of amorphous silicon or polysilicon is formed in the opening 110 to partially extend upwardly beyond the second interlayer isolation film 37. A dielectric film 150 is formed on the capacitor lower electrode 112 and the second interlayer isolation film 37. A capacitor upper electrode 151 is formed on the dielectric film 150. A third interlayer isolation film 205 is formed on the capacitor upper electrode 151. The peripheral circuit region of the DRAM according to the embodiment 6 of the present invention is basically similar in structure to that of the DRAM according to the embodiment 1 shown in FIG. 2.

In the DRAM according to the embodiment 6 of the present invention, the capacitor lower electrode 112 is partially embedded in the second interlayer isolation film 37. Therefore, the difference between the vertical positions of an upper surface of the second interlayer isolation film 37 and a top surface of the capacitor lower electrode 112 can be reduced in the memory cell region as compared with the prior art. In case of forming the third interlayer isolation film 205 in the memory cell region and the peripheral circuit region, therefore, a step on an upper surface of the third interlayer isolation film 205 between the memory cell region and the peripheral circuit region can be reduced. In case of forming a wiring layer consisting of aluminum or the like on the third interlayer isolation film 205 by photolithography, consequently, the pattern of the wiring layer can be prevented from being blurred by such a step on the upper surface of the third interlayer isolation film 205. Consequently, the wiring layer can be prevented from disconnection or shorting resulting from a blurred pattern. Thus, the semiconductor device can be implemented with higher density of integration while ensuring the capacitance of the capacitor and attaining high reliability.

Further, the capacitor lower electrode 112, the silicon nitride film 54 and the side wall 55b are in contact with each other as shown in FIG. 72, whereby the silicon nitride film 54 and the side wall 55b can be utilized as masks in an etching step for forming the opening 110 as described later. Therefore, no step of patterning a resist pattern is necessary for forming the contact hole 110 for connecting the capacitor lower electrode 112 with the source/drain region 201b on the major surface of the semiconductor substrate 1, dissimilarly to the prior art. Thus, the number of fabrication steps can be reduced.

With reference to FIGS. 73 to 77, a method of fabricating the DRAM according to the embodiment 6 of the present invention is now described.

First, the trench isolation oxide film 40 (see FIG. 73) is formed on the major surface of the semiconductor substrate 1 (see FIG. 73) to enclose the active region 39. A silicon oxide film (not shown) for defining the gate insulating film 42b is formed on the major surface of the semiconductor substrate 1. A polysilicon film (not shown) for defining the gate electrode 43b is formed on the silicon oxide film. A silicon nitride film (not shown) is formed on the polysilicon film. A resist pattern (not shown) is formed on the silicon nitride film, and employed as a mask for partially removing the silicon nitride film, the polysilicon film and the silicon oxide film by etching. Thus, the gate insulating film 42b (see FIG. 73), the gate electrode 43b (see FIG. 73) and the silicon nitride film 44b (see FIG. 73) are formed. Thereafter the resist pattern is removed. Then, a silicon nitride film (not shown) is formed to cover the overall surface. This silicon nitride film is partially removed by anisotropic etching, thereby forming the side walls 46c and 46d (see FIG. 73) on the side surfaces of the gate insulating film 42b, the gate electrode 43b and the silicon nitride film 44b.

Figure 73:
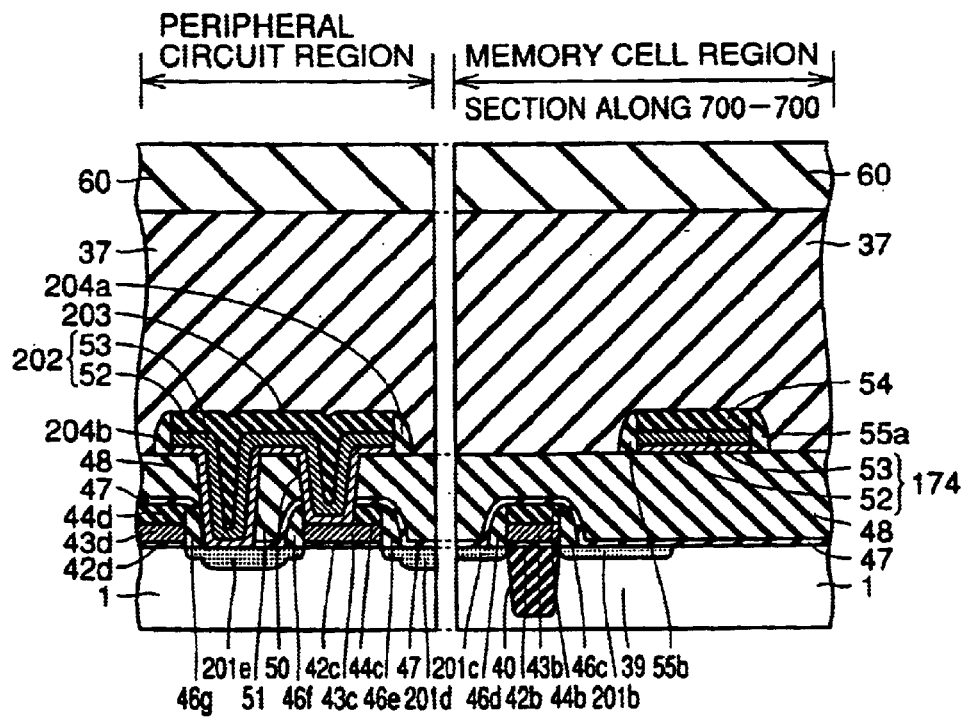
FIGS. 73 to 77 are sectional views for illustrating first to fifth steps of a method of fabricating the DRAM according to the embodiment 6 of the present invention shown in FIG. 72.

The non-doped silicon oxide film 47 (see FIG. 73) is formed to cover the overall surface. The first interlayer isolation film 48 (see FIG. 73) is formed on the non-doped silicon oxide film 47. A doped polysilicon film (not shown) is formed on the first interlayer isolation film 48. A refractory metal silicide film (not shown) is formed on the doped polysilicon film. A silicon nitride film (not shown) is formed on the refractory metal silicide film. A resist pattern (not shown) is formed on the silicon nitride film and thereafter employed as a mask for partially removing the silicon nitride film, the refractory metal silicide film and the doped polysilicon film, thereby forming the bit line 174 (see FIG. 73) consisting of the doped polysilicon film 52 (see FIG. 73) and the refractory metal silicide film 53 (see FIG. 73) and the silicon nitride film 54 (see FIG. 73). A silicon nitride film (not shown) is formed to cover the overall surface and thereafter partially removed by anisotropic etching, thereby forming the side walls 55a and 55b (see FIG. 73). The second interlayer isolation film 37 (see FIG. 73) is formed on the silicon nitride film 54. A boron-doped silicon oxide film 60 (see FIG. 73) is formed on the second interlayer isolation film 37. Thus, the structure shown in FIG. 73 is obtained. Steps of fabricating a field-effect transistor and a wiring layer in a peripheral circuit region are similar to those for the field-effect transistor and the wiring layer in the peripheral circuit region of the DRAM according to the embodiment 1 of the present invention.

Figure 74:
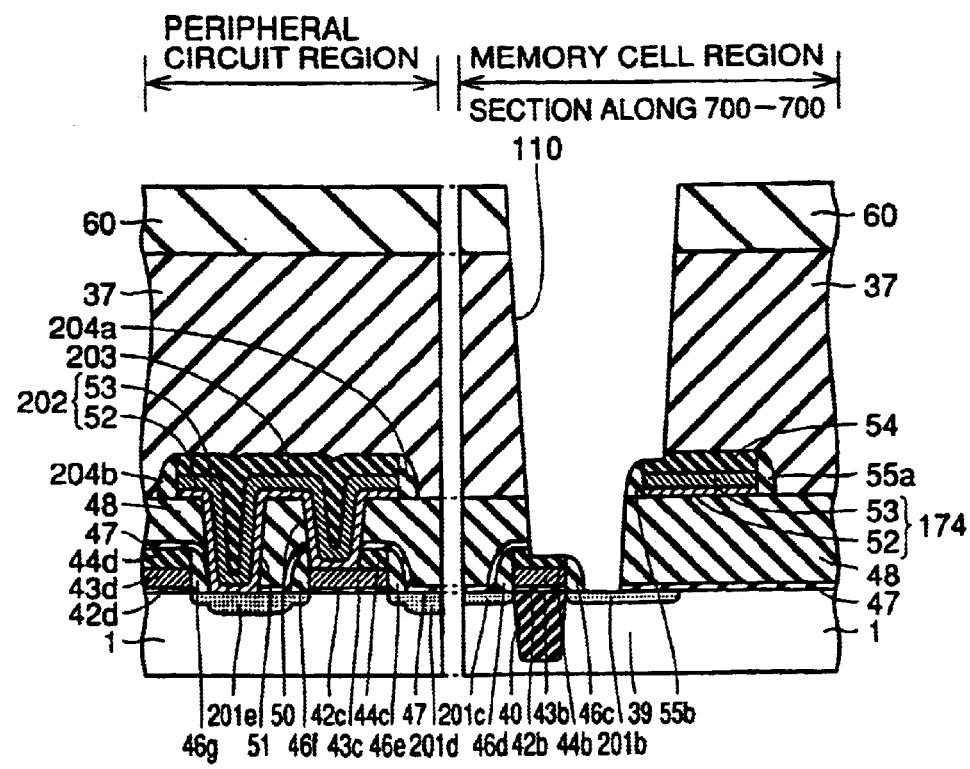

Then, a resist pattern (not shown) is formed on the boron-doped silicon oxide film 60 and thereafter employed as a mask for partially removing the boron-doped silicon oxide film 60, the second interlayer isolation film 37, the first interlayer isolation film 48 and the non-doped silicon oxide film 47, thereby forming the opening 110 (see FIG. 74). In the etching step for forming the opening 110, the silicon nitride films 54 and 44b and the side walls 55b and 46c are employed as parts of the mask, whereby the opening 110 can reach the source/drain region 201b in a self-alignment manner. Thereafter the resist pattern is removed, thereby obtaining the structure shown in FIG. 74.

The width of the opening 110 may be increased by isotropic etching. Thus, the width of a part of the second interlayer isolation film 37 located between the opening 110 and another opening for another capacitor lower electrode can be reduced to be smaller than the minimum working size formable by photolithography. In case of forming the capacitor lower electrode 112 (see FIG. 72) in the opening 110, therefore, the interval between the capacitor lower electrode 112 and the other capacitor lower electrode can be reduced as compared with the prior art. Consequently, the semiconductor device can be implemented with higher density of integration.

Figure 75:
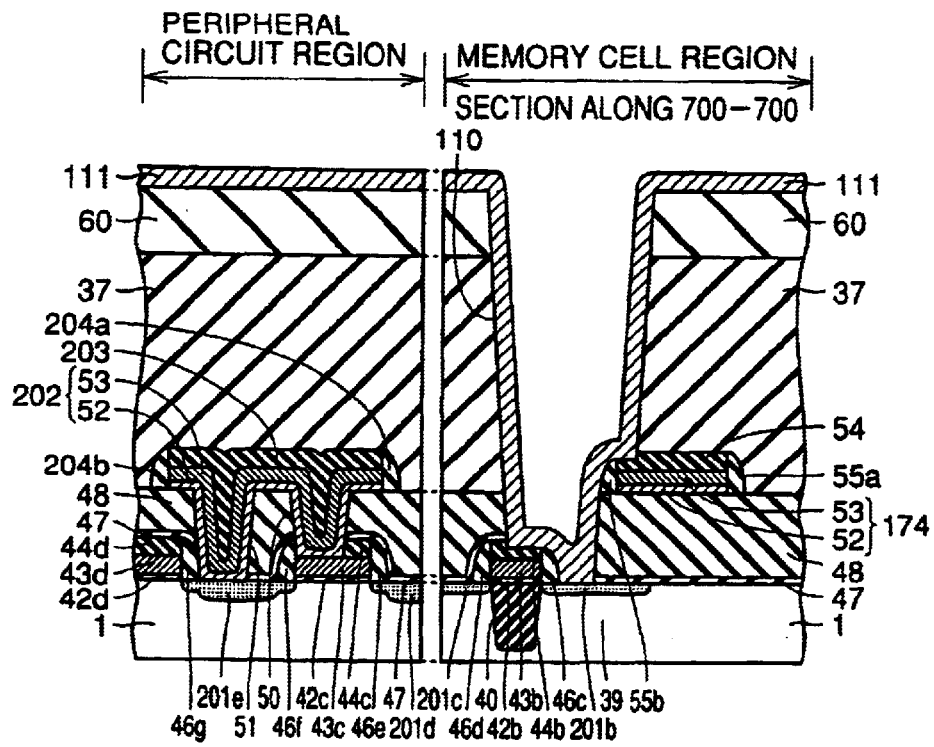

Then, a conductor film 111 consisting of amorphous silicon or the like is formed on the boron-doped silicon oxide film 60 and in the opening 110, as shown in FIG. 75.

Figure 76:
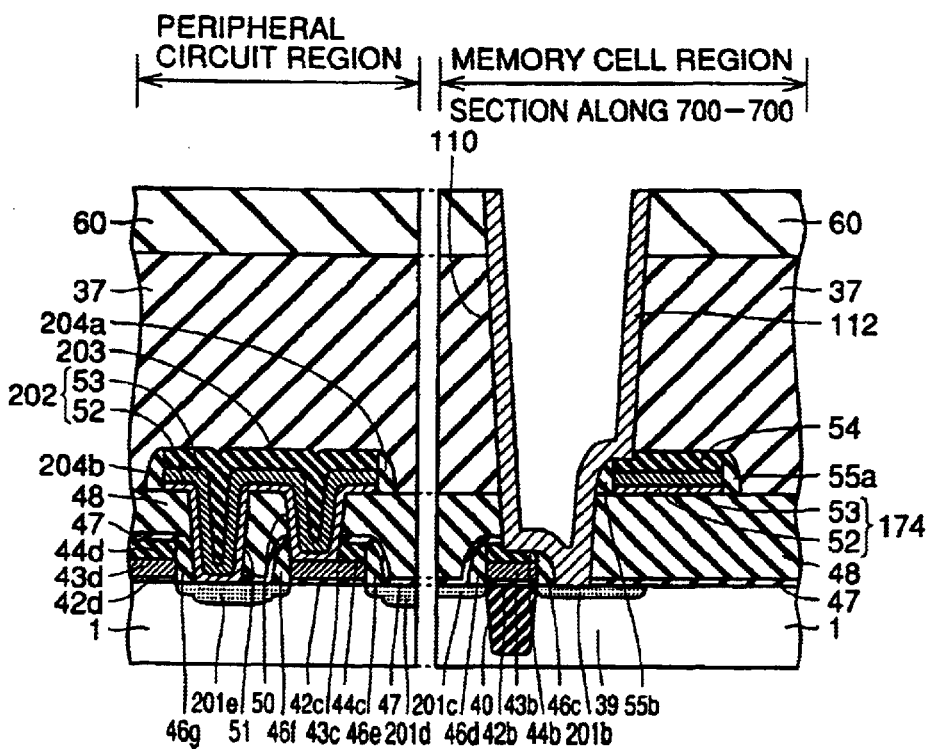

Then, the conductor film 111 (see FIG. 75) located on the boron-doped silicon oxide film 60 is removed by dry etching or CMP, thereby forming the capacitor lower electrode 112, as shown in FIG. 76.

Figure 77:
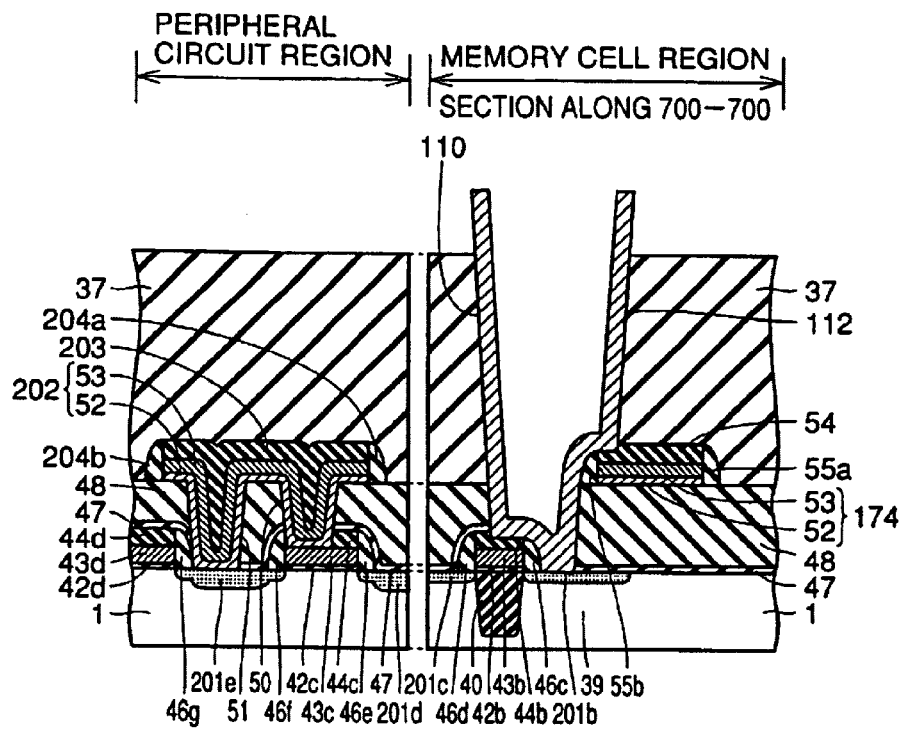

Then, the boron-doped silicon oxide film 60 (see FIG. 76) is removed by etching, as shown in FIG. 77.

Thereafter the dielectric film 150 (see FIG. 72) and the like are formed on the capacitor lower electrode 112 and the second interlayer isolation film 37, thereby obtaining the structure shown in FIG. 72.

Figure 78:
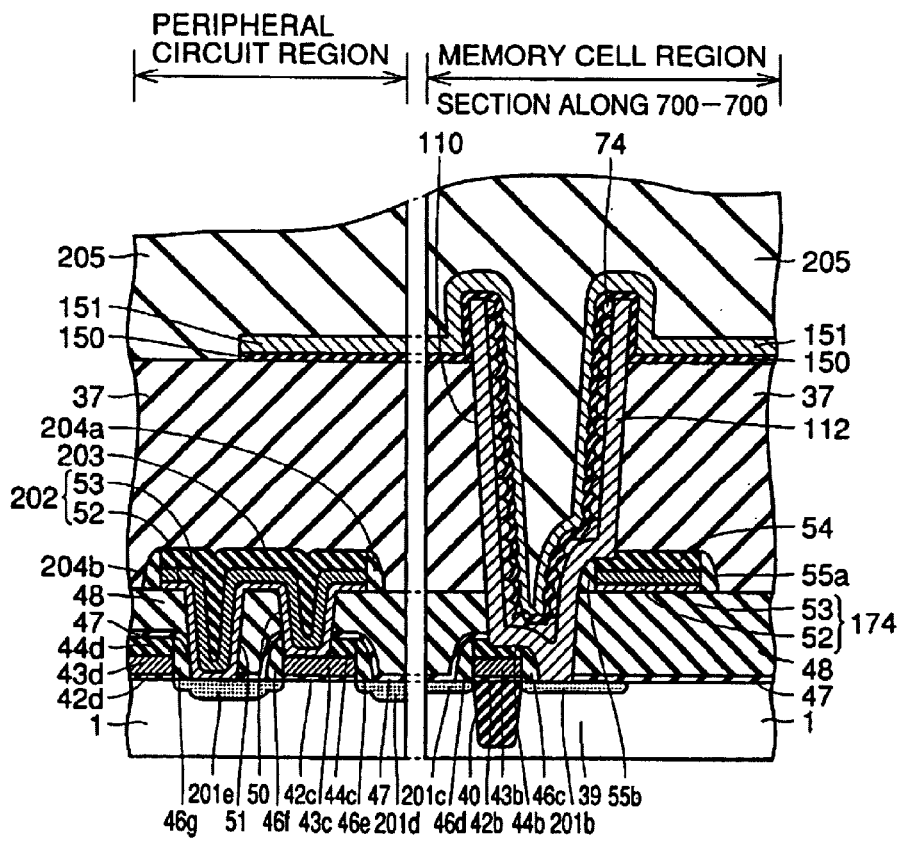
FIG. 78 is a sectional view showing a first modification of the DRAM according to the embodiment 6 of the present invention.

Referring to FIG. 78, a first modification of the DRAM according to the embodiment 6 of the present invention is basically identical in structure to the DRAM according to the embodiment 6 shown in FIG. 72. In the first modification of the DRAM according to the embodiment 6 of the present invention, however, granular crystals 74 are formed on inner side surfaces of a capacitor lower electrode 112. Therefore, the surface area of the capacitor lower electrode 112 can be increased without increasing its occupied area. Thus, the capacitance of the capacitor can be increased. Consequently, the occupied area of the capacitor lower electrode 112 can be reduced while ensuring a constant capacitor capacitance. Consequently, the semiconductor device can be further refined.

In order to fabricate the first modification of the DRAM according to the embodiment 6 of the present invention, fabrication steps identical to those for the DRAM according to the embodiment 6 shown in FIGS. 73 to 75 are carried out and thereafter a fabrication step identical to that for the third modification of the DRAM according to the embodiment 1 shown in FIG. 22 is carried out. Thereafter fabrication steps identical to those for the DRAM according to the embodiment 6 shown in FIGS. 76 and 77 are carried out, thereby obtaining the structure shown in FIG. 78.

Figure 79:
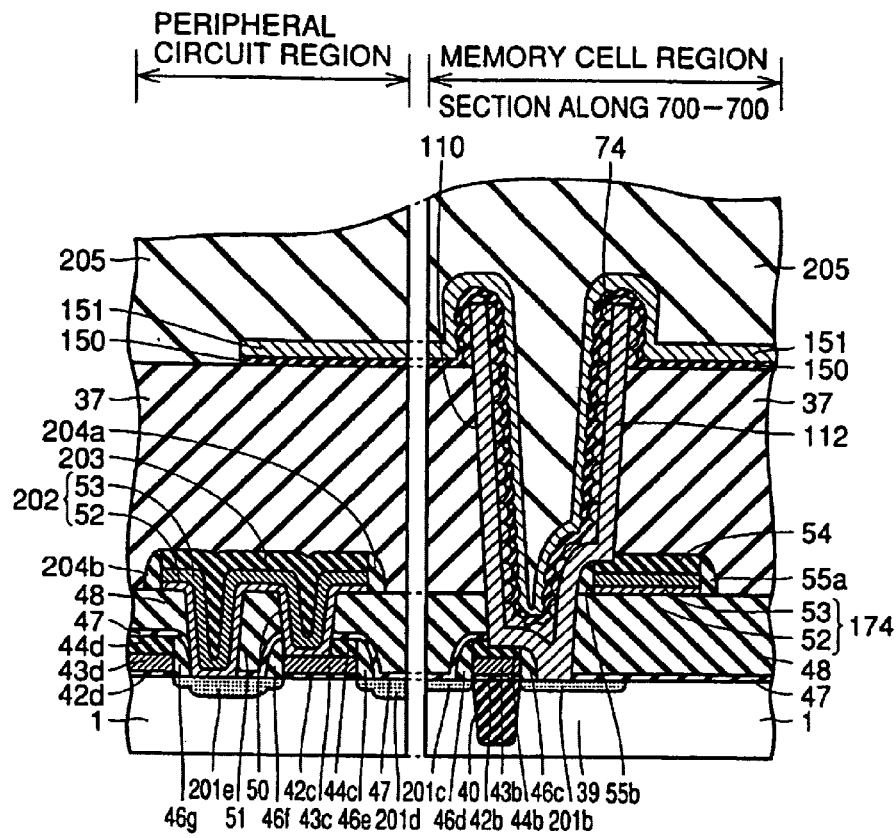
FIG. 79 is a sectional view showing a second modification of the DRAM according to the embodiment 6 of the present invention.

Referring to FIG. 79, a second modification of the DRAM according to the embodiment 6 of the present invention is basically similar in structure to the DRAM according to the embodiment 6 shown in FIG. 72. In the second modification of the DRAM according to the embodiment 6 of the present invention shown in FIG. 79, however, granular crystals 74 are formed also on inner surfaces and outer side surfaces of a capacitor lower electrode 112. Therefore, the surface area of the capacitor lower electrode 112 can be increased without increasing its occupied area. Thus, the occupied area of the capacitor lower electrode 112 can be further reduced while ensuring a constant capacitor capacitance.

Figure 80:
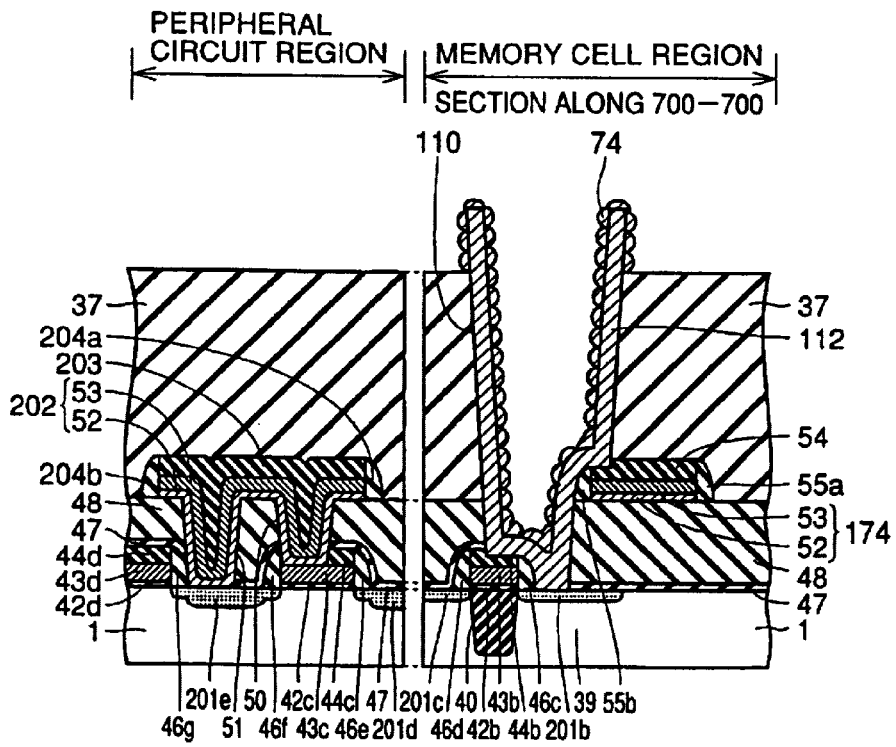
FIG. 80 is a sectional view for illustrating a first step of a method of fabricating the second modification of the DRAM according to the embodiment 6 of the present invention shown in FIG. 79.

With reference to FIG. 80, a method of fabricating the second modification of the DRAM according to the embodiment 6 of the present invention is now described.

First, fabrication steps identical to those for the DRAM according to the embodiment 6 shown in FIGS. 73 to 77 are carried out, and thereafter the granular crystals 74 (see FIG. 80) are formed on the surfaces of the capacitor lower electrode 112. The granular crystals 74 are formed through a step similar to that for forming the granular crystals 74 in the DRAM according to the embodiment 1 of the present invention. Thus, the structure shown in FIG. 80 is obtained.

Thereafter a dielectric film 150 (see FIG. 79) and the like are formed on the granular crystals 74 and a second interlayer isolation film 37, thereby obtaining the structure shown in FIG. 79.

Figure 81:
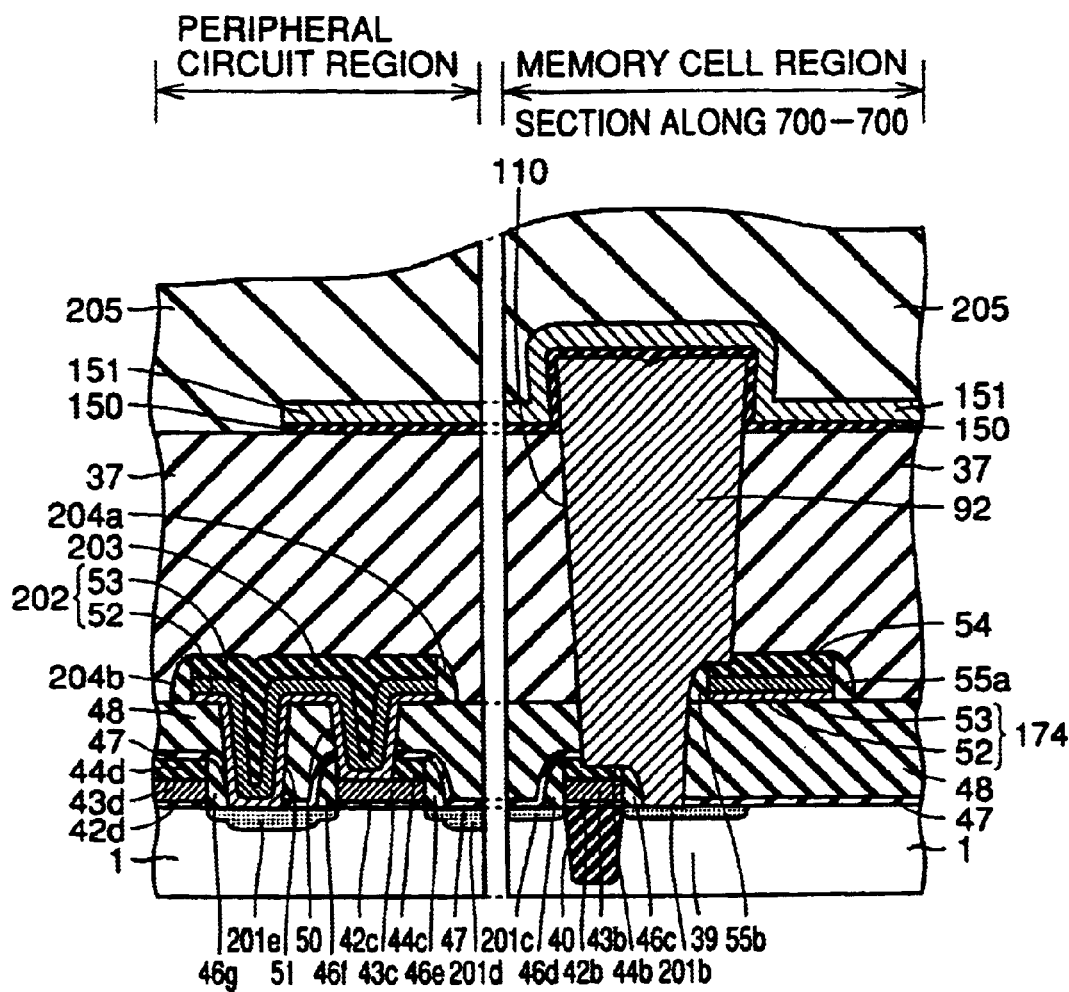
FIG. 81 is a sectional view showing a third modification of the DRAM according to the embodiment 6 of the present invention.

Referring to FIG. 81, a third modification of the DRAM according to the embodiment 6 of the present invention is basically similar in structure to the DRAM according to the embodiment 6 shown in FIG. 72. In the third modification of the DRAM according to the embodiment 6 of the present invention, however, a capacitor lower electrode 92 is in the form of a thick film. The third modification of the DRAM according to the embodiment 6 of the present invention shown in FIG. 81 attains an effect similar to that of the DRAM according to the embodiment 6 shown in FIG. 72.

In order to fabricate the third modification of the DRAM according to the embodiment 6 of the present invention shown in FIG. 81, fabrication steps identical to those for the DRAM according to the embodiment 6 shown in FIGS. 73 and 74 are carried out and thereafter fabrication steps identical to those for the DRAM according to the embodiment 2 shown in FIGS. 28 and 29 are carried out. Thus, the structure shown in FIG. 81 is obtained.

Figure 82:
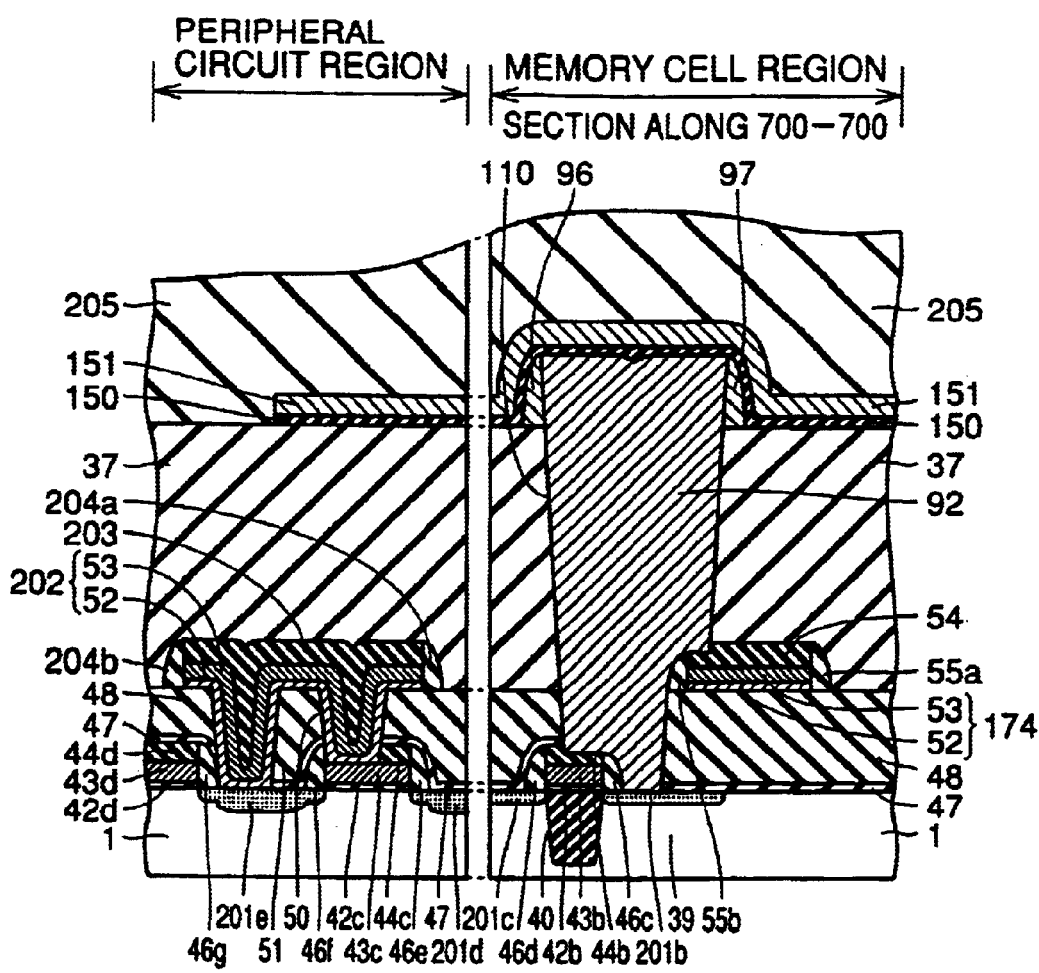
FIG. 82 is a sectional view showing a fourth modification of the DRAM according to the embodiment 6 of the present invention.

Referring to FIG. 82, a fourth modification of the DRAM according to the embodiment 6 of the present invention is basically similar in structure to the third modification of the DRAM according to the embodiment 6 shown in FIG. 81. In the fourth modification shown in FIG. 82, however, side walls 96 and 97 are formed on side surfaces of a capacitor lower electrode 92. Surfaces of the side walls 96 and 97 are at least partially curved. Therefore, the surface areas of the side surfaces of the capacitor lower electrode 92 can be increased as compared with the case of forming no side walls 96 and 97. Thus, the capacitor capacitance can be increased. Therefore, the occupied area of the capacitor lower electrode 92 can be reduced as compared with the prior art while ensuring a constant capacitor capacitance. Consequently, the semiconductor device can be further refined.

In order to fabricate the fourth modification of the DRAM according to the embodiment 6 of the present invention shown in FIG. 82, fabrication steps identical to those for the DRAM according to the embodiment 6 shown in FIGS. 73 and 74 are carried out, and thereafter fabrication steps identical to those for the DRAM according to the embodiment 2 shown in FIGS. 28 and 29 are carried out. Thereafter fabrication steps identical to those for the first modification of the DRAM according to the embodiment 2 of the present invention shown in FIGS. 31 and 32 are carried out. Thus, the structure shown in FIG. 82 is obtained.

Figure 83:
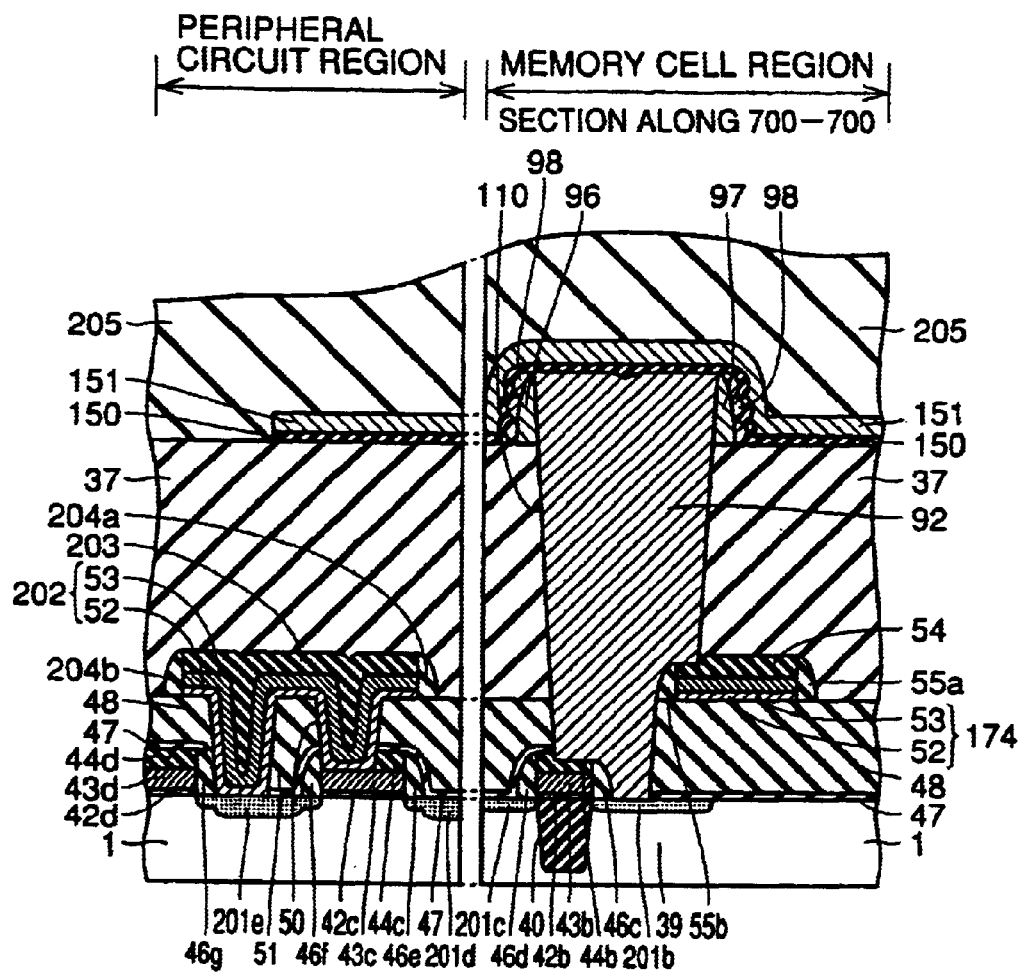
FIG. 83 is a sectional view showing a fifth modification of the DRAM according to the embodiment 6 of the present invention.

Referring to FIG. 83, a fifth modification of the DRAM according to the embodiment 6 of the present invention, which is basically similar in structure to the fourth modification of the DRAM according to the embodiment 6 shown in FIG. 82, further comprises granular crystals 98 on surfaces of side walls 96 and 97 formed on side surfaces of a capacitor lower electrode 92. In the fifth modification of the DRAM according to the embodiment 6 of the present invention comprising the granular crystals 98, therefore, the surface area of the capacitor lower electrode 92 can be further increased without increasing its occupied area. Therefore, the capacitance of the capacitor can be increased. Thus, the occupied area of the capacitor lower electrode 92 can be reduced as compared with the prior art while ensuring a constant capacitor capacitance, and the semiconductor device can be further refined.

In order to fabricate the fifth modification of the DRAM according to the embodiment 6 of the present invention shown in FIG. 83, fabrication steps identical to those for the DRAM according to the embodiment 6 shown in FIGS. 73 and 74 are carried out, and thereafter fabrication steps identical to those for the DRAM according to the embodiment 2 shown in FIGS. 28 and 29 are carried out. Then, fabrication steps identical to those for the first modification of the DRAM according to the embodiment 2 shown in FIGS. 31 and 32 are carried out, and thereafter a fabrication step identical to that for the third modification of the DRAM according to the embodiment 2 shown in FIG. 36 is carried out. Thus, the structure shown in FIG. 83 is obtained.

Figure 84:
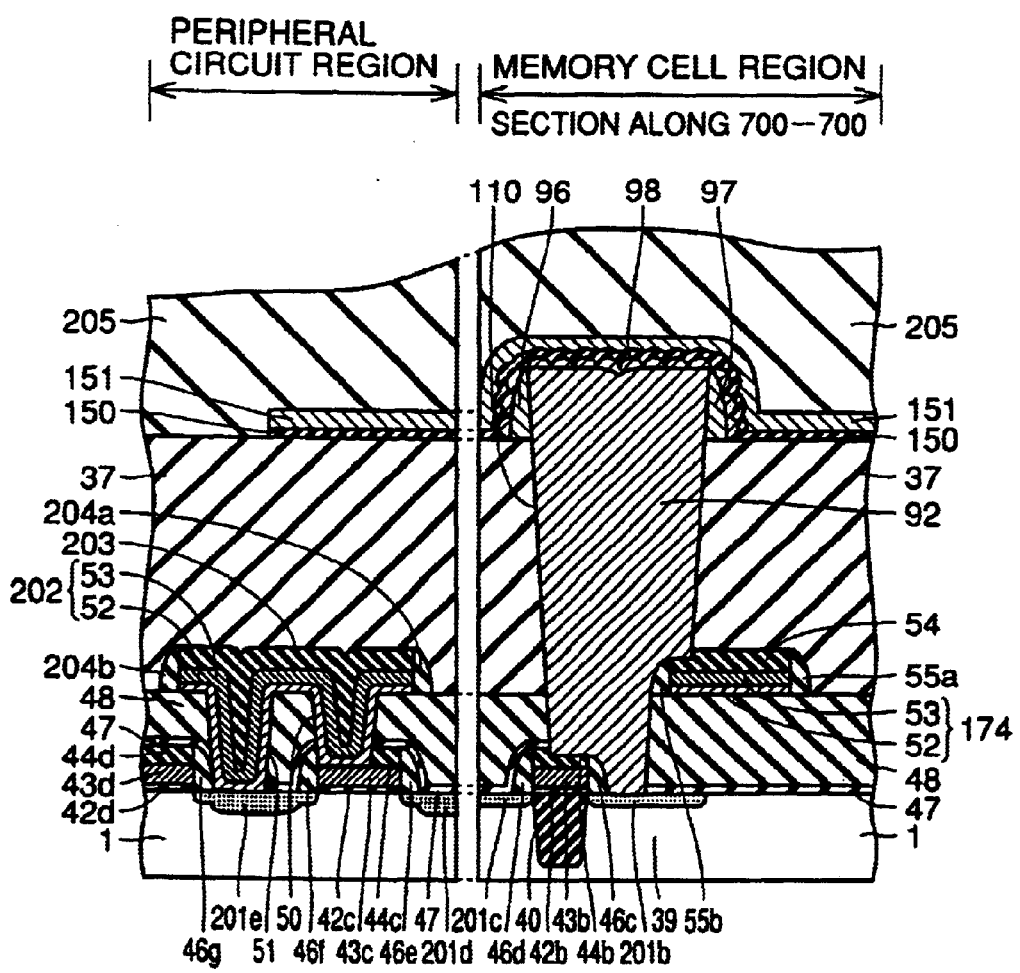
FIG. 84 is a sectional view showing a sixth modification of the DRAM according to the embodiment 6 of the present invention.
Figure 85:
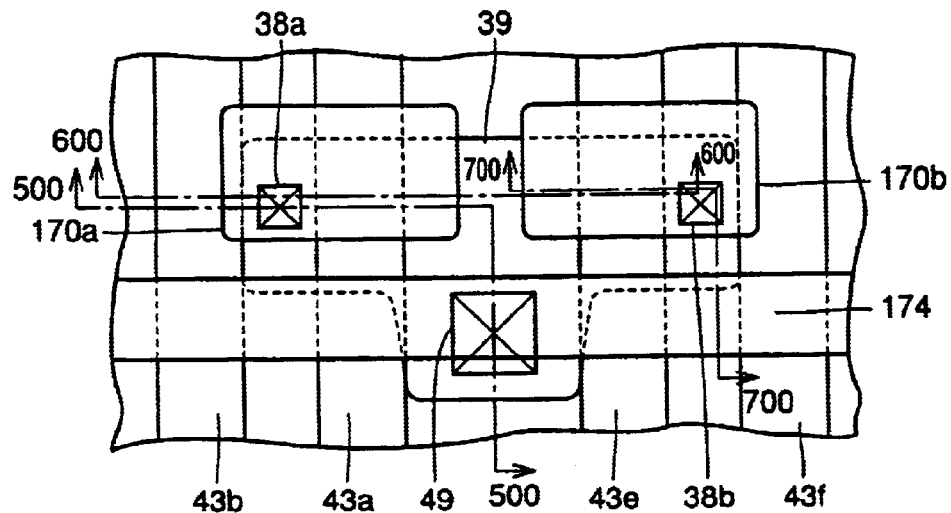
FIG. 85 is a typical plan view of a memory cell of a DRAM according to an embodiment 7 of the present invention.

Referring to FIG. 84, a sixth modification of the DRAM according to the embodiment 6 of the present invention is basically similar in structure to the fifth modification of the DRAM according to the embodiment 6 shown in FIG. 83. In the sixth modification shown in FIG. 84, however, granular crystals 98 are formed also on an upper surface of a capacitor lower electrode 92. Therefore, the surface area of the capacitor lower electrode 92 can be increased as compared with the prior art without increasing its occupied area. Thus, an effect similar to that of the fifth modification of the DRAM according to the embodiment 6 of the present invention shown in FIG. 83 can be attained.

In order to fabricate the sixth modification of the DRAM according to the embodiment 6 of the present invention shown in FIG. 84, a fabrication step identical to that for the fifth modification of the DRAM according to the embodiment 6 shown in FIG. 83 is carried out for forming side walls 96 and 97 and thereafter a fabrication step identical to that for the fourth modification of the DRAM according to the embodiment 2 shown in FIG. 38 is carried out, thereby obtaining the structure shown in FIG. 84.

(Embodiment 7)

Figure 86:
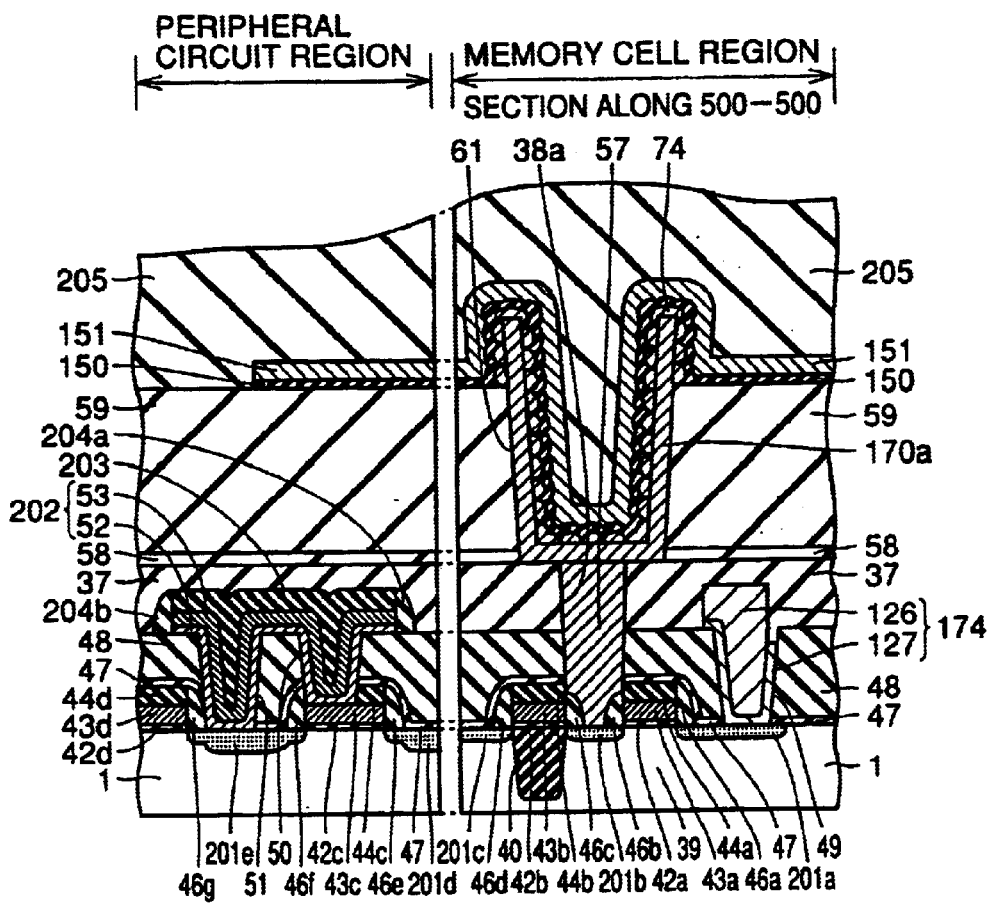
FIG. 86 is a sectional view of the DRAM according to the embodiment 7 of the present invention.

A memory cell region of a DRAM according to an embodiment 7 of the present invention is basically similar in structure to that of the DRAM according to the embodiment 1 shown in FIG. 1. In the DRAM according to the embodiment 7 of the present invention, however, a bit line 174 is smaller in width than a contact hole 49. FIG. 86 shows a section taken along the line 500—500 in FIG. 1. Referring to FIG. 86, the DRAM according to the embodiment 7 of the present invention is basically similar in structure to the first modification of the DRAM according to the embodiment 1 shown in FIG. 16. However, the DRAM according to the embodiment 7 of the present invention shown in FIG. 86 is so formed that the bit line 174 is smaller in width than the contact hole 49.

In addition to the effect of the first modification of the DRAM according to the embodiment 1 of the present invention shown in FIG. 16, therefore, the semiconductor device can be further refined as compared with the conventional case of increasing the width of the bit line 174 to be larger than that of the contact hole 49.

The bit line 174 is directly in contact with a second interlayer isolation film 37, and no wire protection isolation film such as a silicon nitride film is formed therebetween. Therefore, the number of layers formed in the memory cell region can be reduced as compared with the general case of forming a wire protection isolation film on the bit line 174. Thus, the vertical position of an upper surface of a fourth interlayer isolation film 205 can be lowered in the memory cell region, thereby further reducing a step on the upper surface of the fourth interlayer isolation film 205 between the memory cell region and a peripheral circuit region. In case of forming a wiring layer consisting of aluminum or the like on the fourth interlayer isolation film 205 by photolithography, therefore, the pattern of this wiring layer can be prevented from being blurred by such a step on the upper surface of the fourth interlayer isolation film 205. Thus, the wiring layer can be prevented from a defect such a disconnection or shorting, whereby the semiconductor device can be implemented with higher density of integration while ensuring the capacitance of the capacitor and attaining high reliability.

While a method of fabricating the DRAM according to the embodiment 7 of the present invention shown in FIG. 86 is basically similar to that for the first modification of the DRAM according to the embodiment 1 shown in FIG. 16, a refractory metal film 127 of titanium or the like and a tungsten film 126 are formed in the contact hole 49 in a fabrication step identical to that shown in FIG. 7. A resist pattern is formed on the tungsten film 126 and thereafter employed as a mask for partially removing the tungsten film 126 and the refractory metal film 127 by etching, thereby forming the bit line 174 shown in FIG. 86. No wire protection isolation film such as a silicon nitride film is formed on the bit line 174, whereby a surface of a second interlayer isolation film 37 can be readily flattened.

Figure 87:
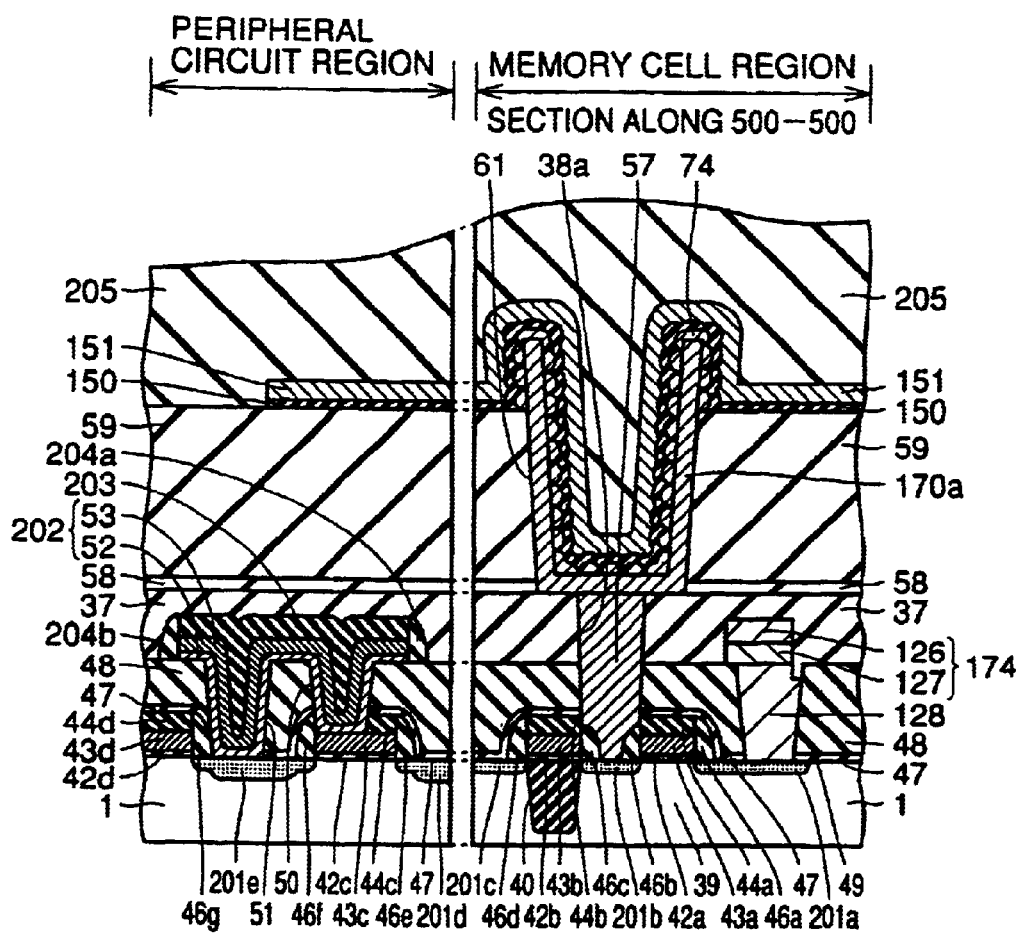
FIG. 87 is a sectional view showing a modification of the DRAM according to the embodiment 7 of the present invention.

Referring to FIG. 87, a modification of the DRAM according to the embodiment 7 of the present invention is basically similar in structure to the DRAM according to the embodiment 7 shown in FIG. 86. In the modification of the DRAM according to the embodiment 7 of the present invention shown in FIG. 87, however, a plug 128 consisting of phosphorus-doped polysilicon or the like is formed in a contact hole 49. A bit line 174 consisting of a refractory metal film 127 of titanium or the like and a tungsten film 126 is formed on this plug 128. The bit line 174 is formed to be smaller in width than the contact hole 49. Thus, an effect similar to that of the DRAM according to the embodiment 7 of the present invention shown in FIG. 86 is attained.

A method of fabricating the modification of the DRAM according to the embodiment 7 of the present invention shown in FIG. 87 is basically similar to that for the DRAM according to the embodiment 7 shown in FIG. 86. In a step of forming the bit line 174 of the modification of the DRAM according to the embodiment 7 shown in FIG. 86, however, the plug 128 consisting of phosphorus-doped polysilicon is first formed in the contact hole 49, for thereafter forming the bit line 174.

(Embodiment 8)

Figure 88:
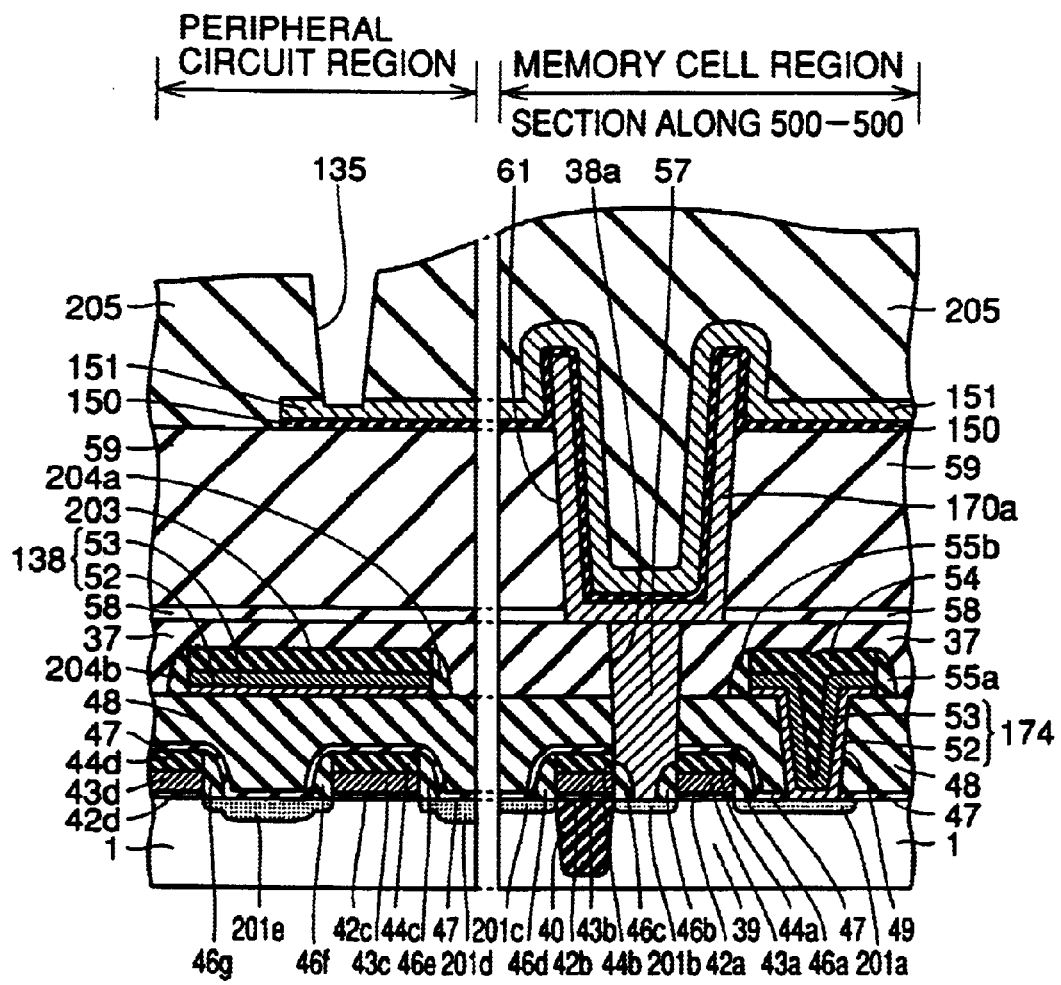
FIG. 88 is a sectional view showing a DRAM according to an embodiment 8 of the present invention.

Referring to FIG. 88, a memory cell region of a DRAM according to an embodiment 8 of the present invention is basically similar in structure to the memory cell region of the DRAM according to the embodiment 1 shown in FIG. 2. A peripheral circuit region of the DRAM according to the embodiment 8 of the present invention is also basically similar in structure to the peripheral circuit region of the DRAM according to the embodiment 1 shown in FIG. 2. In the DRAM according to the embodiment 8 of the present invention shown in FIG. 88, however, a contact hole 135 is formed in the peripheral circuit region for connecting a wiring layer formed on a fourth interlayer isolation film 205 and a capacitor upper electrode 151. Further, a dummy wiring layer 138 is formed on a region located under the contact hole 135, for protecting a peripheral circuit element such as a field-effect transistor in the peripheral circuit region.

Even if the contact hole 135 passes through the capacitor upper electrode 151 and a dielectric film 150 to reach a third interlayer isolation film 59 located under the same or the like in an etching step for forming the contact hole 135, the dummy wiring layer 138 consisting of a doped polysilicon film 52 and a refractory metal silicide film 53 can stop progress of the etching. Consequently, the peripheral circuit element located under the dummy wiring layer 138 can be prevented from damage by the etching. Thus, the semiconductor device can be prevented from a defective operation resulting from damage of the peripheral circuit element. Consequently, a highly reliable semiconductor device can be obtained.

Fabrication steps for the DRAM according to the embodiment 8 of the present invention shown in FIG. 88 are basically similar to those for the DRAM according to the embodiment 1 shown in FIGS. 3 to 14. However, the dummy wiring layer 138 is formed in a fabrication step identical to that for the wiring layer 202 in the peripheral circuit region shown in FIG. 2.

Figure 89:
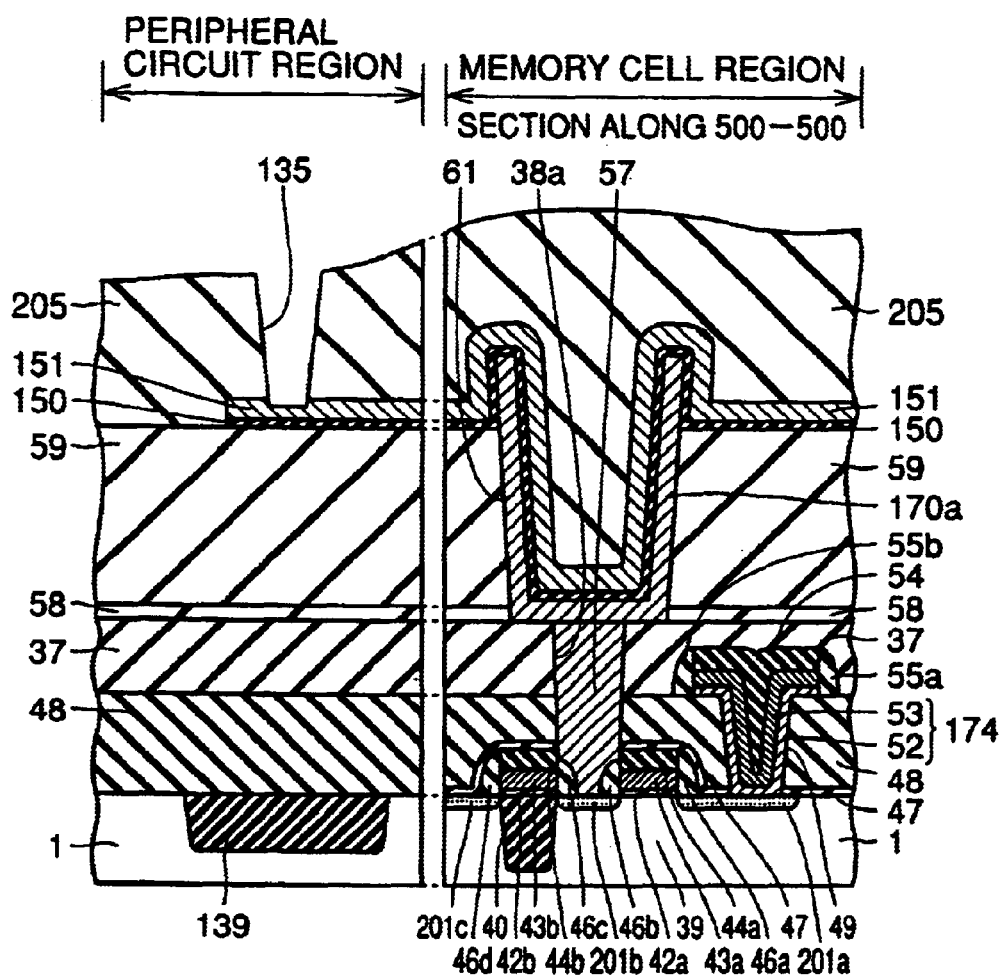
FIG. 89 is a sectional view showing a first modification of the DRAM according to the embodiment 8 of the present invention.

Referring to FIG. 89, a first modification of the DRAM according to the embodiment 8 of the present invention is basically similar in structure to the DRAM according to the embodiment 8 shown in FIG. 88. In the first modification of the DRAM according to the embodiment 8 of the present invention shown in FIG. 89, however, no peripheral circuit elements such as a wiring layer and a field-effect transistor are formed in a region located under a contact hole 135 in a peripheral circuit region.

Even if the contact hole 135 passes through a capacitor upper electrode 151 and the like to reach a third interlayer isolation film 59 located under the same in an etching step for forming the contact hole 135, therefore, no peripheral circuit elements are damaged by this etching.

A method of fabricating the first modification of the DRAM according to the embodiment 8 of the present invention shown in FIG. 89 is basically similar to that for the DRAM according to the embodiment 8 of the present invention shown in FIG. 8. However, the contact hole 135 and the peripheral circuit elements are formed on regions not overlapping with each other in plane.

Figure 90:
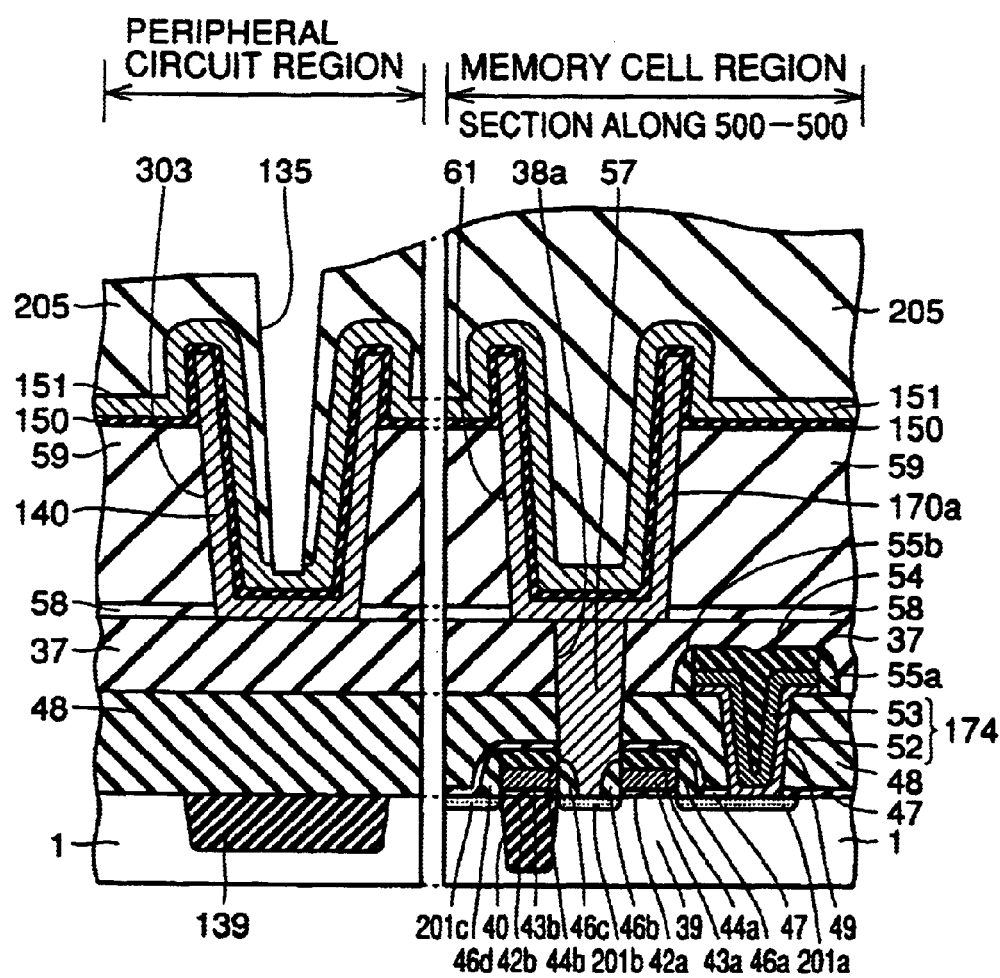
FIG. 90 is a sectional view showing a second modification of the DRAM according to the embodiment 8 of the present invention.

Referring to FIG. 90, a memory cell region of a second modification of the DRAM according to the embodiment 8 of the present invention is basically similar in structure to that of the DRAM according to the embodiment 8 shown in FIG. 88. In a peripheral circuit region, a third interlayer isolation film 59 and a silicon nitride film 58 are partially removed, thereby forming an opening 303. A dummy capacitor lower electrode 140 consisting of a material similar to that for a capacitor lower electrode 170*a* of the memory cell region is formed in the opening 303. A dielectric film 150 is formed on the third interlayer isolation film 59 and the dummy capacitor lower electrode 140. A capacitor upper electrode 151 is formed on the dielectric film 150. The contact hole 135 reaches the capacitor upper electrode 151 on a bottom portion of the dummy capacitor lower electrode 140.

Thus, the dummy capacitor lower electrode 140 is formed for forming the contact hole 135 in the region located above the same, whereby the depth of the contact hole 135 can be made larger than that of the contact hole 135 in the DRAM according to the embodiment 8 of the present invention shown in FIG. 88. Thus, the difference between the depths of another contact hole (not shown) reaching a wiring layer 202 (see FIG. 2) in the peripheral circuit region and the contact hole 135 (see FIG. 90) of the DRAM according to the embodiment 8 of the present invention can be reduced. Consequently, the capacitor upper electrode 151 can be prevented from excessive etching on a bottom portion of the contact hole 135 in an etching step for forming the contact hole 135. Thus, the etching can be prevented from passing through the capacitor upper electrode 151 and reaching the second interlayer isolation film 37 located under the same.

While a method of fabricating the second modification of the DRAM according to the embodiment 8 of the present invention shown in FIG. 90 is basically similar to that for the first modification of the DRAM according to the embodiment 8 shown in FIG. 89, the dummy capacitor lower electrode 140 is formed simultaneously with the capacitor lower electrode 170*a* in the memory cell region.

Figure 91:
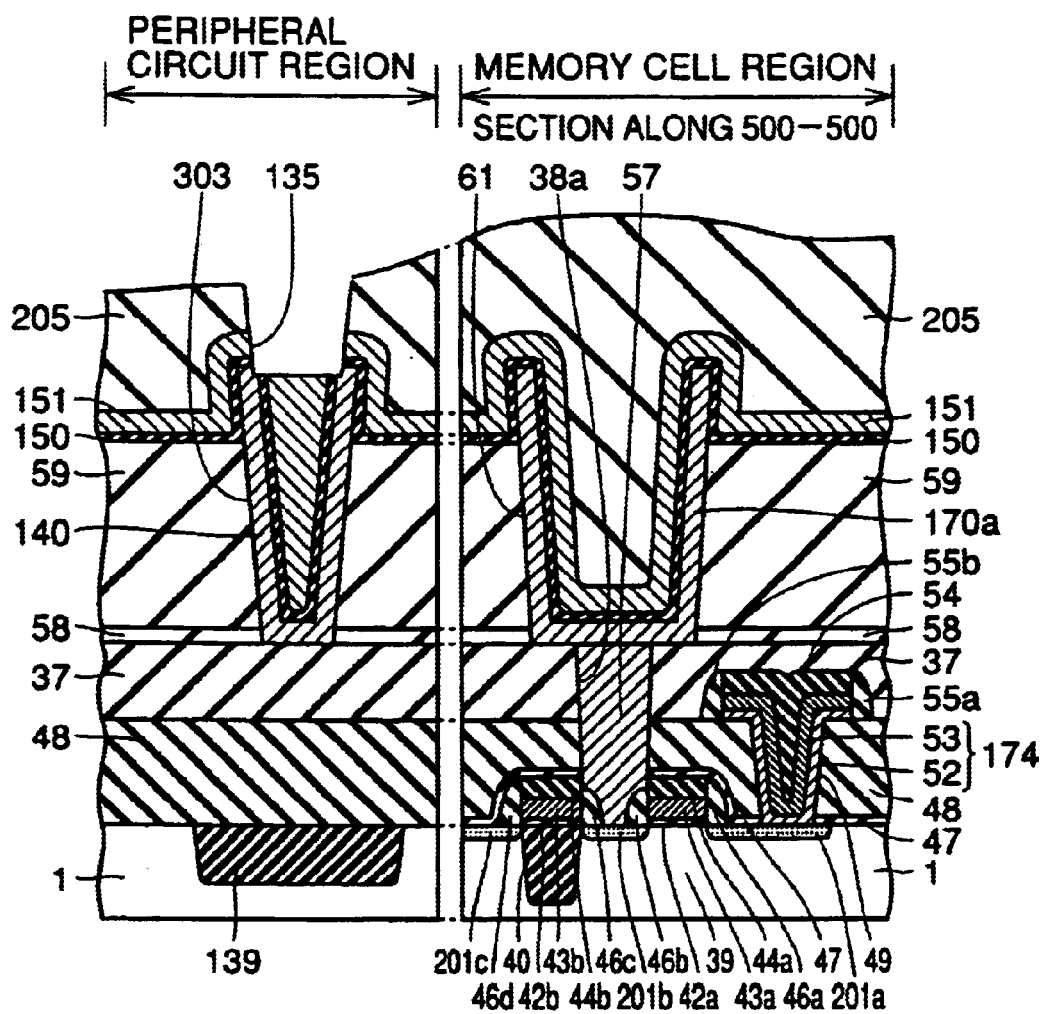
FIG. 91 is a sectional view showing a third modification of the DRAM according to the embodiment 8 of the present invention.

Referring to FIG. 91, a third modification of the DRAM according to the embodiment 8 of the present invention is basically similar in structure to the second modification of the DRAM according to the embodiment 8 shown in FIG. 90. In the third modification of the DRAM according to the embodiment 8 of the present invention shown in FIG. 91, however, the horizontal width of a dummy capacitor lower electrode 140 is reduced while the vertical thickness of a capacitor upper electrode 151 in the dummy capacitor lower electrode 140 is increased as compared with that in the second modification shown in FIG. 90. A contact hole 135 is formed in an upper portion of the capacitor upper electrode 151 having a large vertical thickness.

Thus, the vertical thickness of the capacitor upper electrode 151 located under the contact hole 135 is so increased that the contact hole 135 can be prevented from passing through the capacitor upper electrode 151 and reaching a second interlayer isolation film 37 in an etching step for forming the contact hole 135. Further, the depth of the contact hole 135 can be arbitrarily changed by adjusting the width of an opening 303 and the thickness of the capacitor upper electrode 151.

A method of fabricating the third modification of the DRAM according to the embodiment 8 of the present invention shown in FIG. 91 is basically similar to that for the second modification of the DRAM according to the embodiment 8 shown in FIG. 90.

In order to obtain a semiconductor device which can be implemented with high density of integration while ensuring a constant capacitor capacitance and attaining high reliability, a wire having lower resistance and a lower capacitance is required in a memory cell region and a peripheral circuit region.

Figure 118:
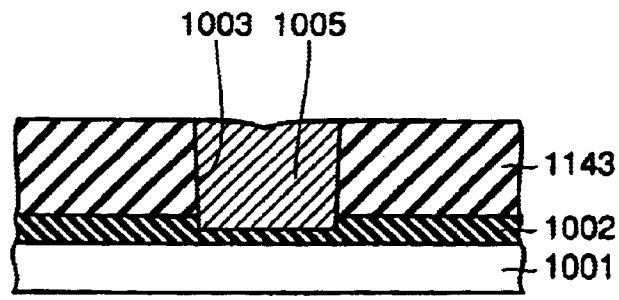
FIG. 118 is a sectional view of a conventional wire.

Referring to FIG. 118, a silicon nitride film 1002 is formed on a major surface of a semiconductor substrate 1001, in relation to a conventional wire. A non-doped silicon oxide film 1143 is formed on the silicon nitride film 1002. The non-doped silicon oxide film 1143 and the silicon nitride film 1002 are partially removed, thereby forming an opening 1003. A wire 1005 consisting of polysilicon is formed in the opening 1003.

Figure 119:
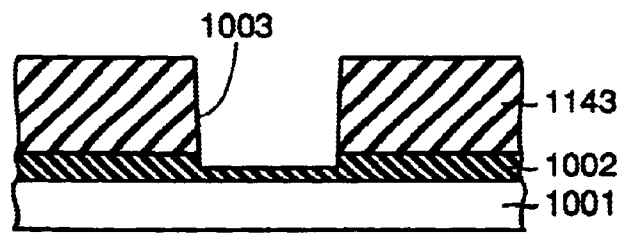
FIGS. 119 and 120 are sectional views for illustrating first and second steps of fabricating the conventional wire shown in FIG. 118.
Figure 120:
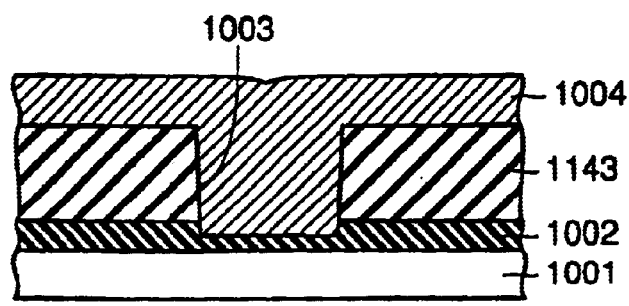

With reference to FIGS. 119 and 120, steps of fabricating the conventional wire 1005 are now described.

First, the silicon nitride film 1002 (see FIG. 119) is formed on the major surface of the semiconductor substrate 1001

(see FIG. 119). The silicon nitride film 1002 may be replaced with a silicon oxi-nitride film or a film having a multilayer structure of a silicon nitride film and a silicon oxi-nitride film. The non-doped silicon oxide film 1143 (see FIG. 119) is formed on the silicon nitride film 1002. The non-doped silicon oxide film 1143 may be replaced with a silicon oxide film doped with phosphorus or boron. A resist pattern (not shown) is formed on the non-doped silicon oxide film 1143 and thereafter employed as a mask for partially removing the non-doped silicon oxide film 1143 and the silicon nitride film 1002, thereby forming the opening 1003 (see FIG. 119). Thus, the structure shown in FIG. 119 is obtained.

Then, a polysilicon film 1004 is formed on the non-doped silicon oxide film 1143 and in the opening 1003, as shown in FIG. 120. The polysilicon film 1004 may be replaced with an amorphous silicon film. The polysilicon film 1004 may be doped with phosphorus, arsenic or no impurity. Further, the polysilicon film 1004 may be replaced with a film of a refractory metal such as tungsten or titanium, or a silicide of such a refractory metal. In addition, the polysilicon film 1004 may be replaced with a metal film of copper or aluminum, or a multilayer structure thereof.

Then, the polysilicon film 1004 located on the non-doped silicon oxide film 1143 is removed by etching or CMP, for obtaining the structure shown in FIG. 118.

Figure 121:
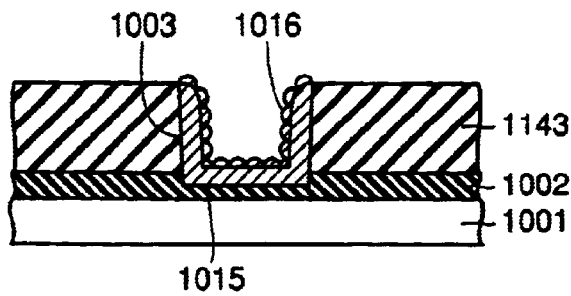
FIG. 121 is a sectional view showing another conventional wire.

FIG. 121 shows an exemplary structure of a second generally proposed wire. Referring to FIG. 121, a silicon nitride film 1002 is formed on a major surface of a semiconductor substrate 1001, in relation to the second generally proposed wire. A non-doped silicon oxide film 1143 is formed on the silicon nitride film 1002. The non-doped silicon oxide film 1143 and the silicon nitride film 1002 are partially removed, thereby forming an opening 1003. A wire 1015 consisting of polysilicon is formed in the opening 1003. Granular crystals 1016 are formed on surfaces of the wire 1015. Thus, the resistance of the wire 1015 can be reduced due to the granular crystals 1016 formed on its surfaces.

Figure 122:
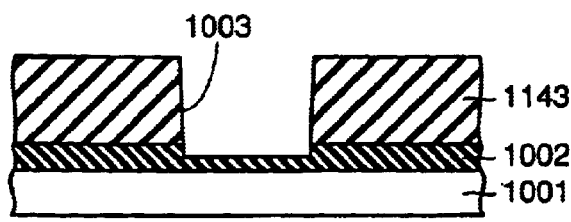
FIGS. 122 to 124 are sectional views for illustrating first to third steps of a method of fabricating the conventional wire shown in FIG. 121.
Figure 123:
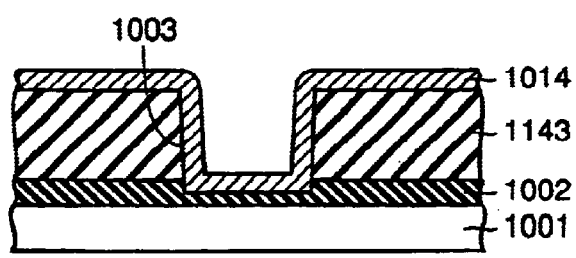
Figure 124:
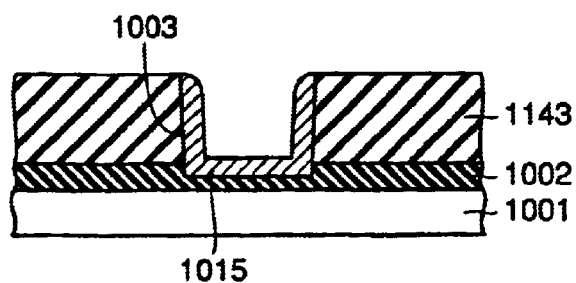

With reference to FIGS. 122 to 124, fabrication steps for the second generally proposed wire 1015 are described.

The silicon nitride film 1002 (see FIG. 122) is formed on the major surface of the semiconductor substrate 1001 (see FIG. 122). The non-doped silicon oxide film 1143 (see FIG. 122) is formed on the silicon nitride film 1002. A resist pattern (not shown) is formed on the non-doped silicon oxide film 1143 and thereafter employed as a mask for partially removing the non-doped silicon oxide film 1143 and the silicon nitride film 1002 by etching, thereby forming the opening 1003 (see FIG. 122). Thereafter the resist pattern is removed. Thus, the structure shown in FIG. 122 is obtained.

Then, a conductor film 1014 consisting of polysilicon is formed in the opening 1003 and on the non-doped silicon oxide film 1143, as shown in FIG. 123.

Then, a part of the conductor film 1014 located on the non-doped silicon oxide film 1143 is removed by etching, thereby obtaining the structure shown in FIG. 124. Thereafter the granular crystals 1016 (see FIG. 121) are formed on the surfaces of the wire 1015 through a step similar to that for the first modification of the DRAM according to the embodiment 1 of the present invention. Thus, the structure shown in FIG. 121 is obtained.

While a low-resistance wire is proposed in general, deterioration of device characteristics such as access delay resulting from increased wire resistance is now coming into question in the generally proposed wire following refinement of the semiconductor device. Thus, further reduction of the resistance and the capacitance of the wire is required. In order to obtain a wire satisfying such requirement, the structure applied to the shape of the capacitor lower electrode in the present invention can be applied. A modification of a wire in the DRAM according to the embodiment 8 of the present invention based on such an idea is now described.

Figure 92:
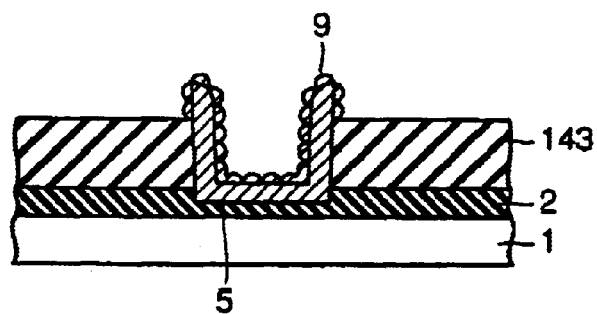
FIG. 92 is a sectional view showing a first modification of a wire of the DRAM according to the embodiment 8 of the present invention.

Referring to FIG. 92, a silicon nitride film 2 is formed on a major surface of a semiconductor substrate 1, in relation to a first modification of a wire of the DRAM according to the embodiment 8 of the present invention. A non-doped silicon oxide film 143 is formed on the silicon nitride film 2. A wire 5 consisting of polysilicon is formed to be partially embedded in the non-doped silicon oxide film 143 and the silicon nitride film 2. Granular crystals 9 are formed on inner surfaces and outer side surfaces of the wire 5.

The wire 5 is thus formed to upwardly extend beyond an upper surface of the non-doped silicon oxide film 143, whereby the sectional area of the wire 5 can be increased while reducing its occupied area. Thus, the resistance of the wire 5 can be reduced. Further, the resistance of the wire 5 can be further reduced due to the granular crystals 9 formed on its surfaces.

With reference to FIGS. 93 to 96, fabrication steps for the first modification of the wire of the DRAM according to the embodiment 8 of the present invention are now described.

Figure 93:
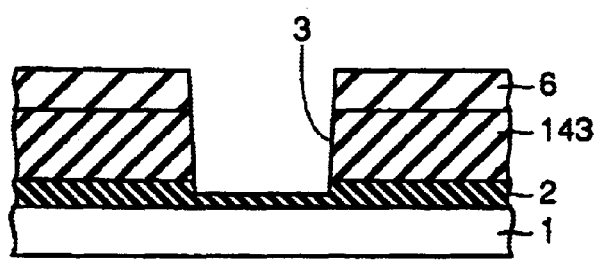
FIGS. 93 to 96 are sectional views for illustrating first to fourth steps of a method of fabricating the first modification of the wire of the DRAM according to the embodiment 8 of the present invention shown in FIG. 92.

First, the silicon nitride film 2 (see FIG. 93) is formed on the major surface of the semiconductor substrate 1 (see FIG. 93). The non-doped silicon oxide film 143 (see FIG. 93) is formed on the silicon nitride film 2. A boron-doped silicon oxide film 6 (see FIG. 93) is formed on the non-doped silicon oxide film 143. A resist pattern (not shown) is formed on the boron-doped silicon oxide film 6 and thereafter employed as a mask for partially removing the boron-doped silicon oxide film 6 and the non-doped silicon oxide film 143 by anisotropic etching, thereby forming an opening 3 (see FIG. 93). Thereafter the resist pattern is removed, thereby obtaining the structure shown in FIG. 93.

Figure 94:
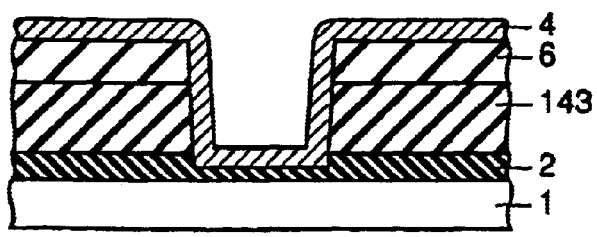

Then, a polysilicon film 4 is formed on the boron-doped silicon oxide film 6 and in the opening 3, as shown in FIG. 94.

Figure 95:
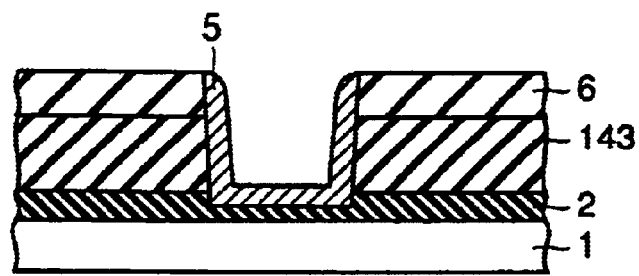

Then, the polysilicon film 4 located on the boron-doped silicon oxide film 6 is removed by etching or CMP, thereby obtaining the structure shown in FIG. 95.

Figure 96:
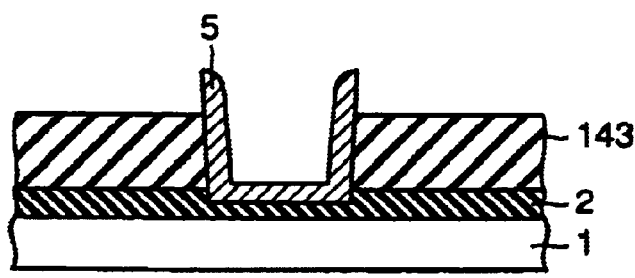

Then, the boron-doped silicon oxide film 6 is removed by etching, thereby obtaining the structure shown in FIG. 96.

Thereafter the granular crystals 9 (see FIG. 92) are formed on the surfaces of the wire 5 with application of the step employed in the first modification of the DRAM according to the embodiment 1 of the present invention, thereby obtaining the structure shown in FIG. 92.

With reference to FIGS. 97 to 100, a modification of the method of fabricating the first modification of the wire of the DRAM according to the embodiment 8 of the present invention is now described.

Figure 97:
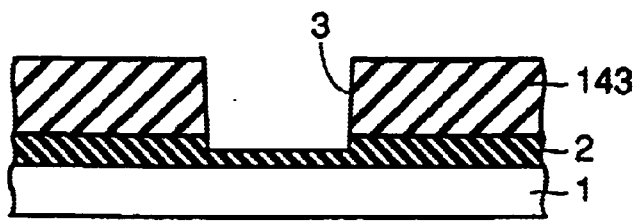
FIGS. 97 to 100 are sectional views for illustrating first to fourth fabrication steps of a modification of the method of fabricating the first modification of the wire of the DRAM according to the embodiment 8 of the present invention shown in FIG. 92.

A silicon nitride film 2 (see FIG. 97) is formed on a semiconductor substrate 1 (see FIG. 97). A non-doped silicon oxide film 143 (see FIG. 97) is formed on the silicon nitride film 2. A resist pattern (not shown) is formed on the non-doped silicon oxide film 143 and thereafter employed as a mask for partially removing the non-doped silicon oxide film 143 and the silicon nitride film 2 by anisotropic etching, thereby forming an opening 3 (see FIG. 97). Thus, the structure shown in FIG. 97 is obtained.

Figure 98:
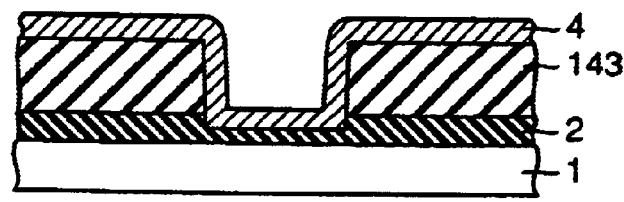

Then, a polysilicon film 4 (see FIG. 98) is formed on the non-doped silicon oxide film 143 and in the opening 3. Thus, the structure shown in FIG. 98 is obtained.

Figure 99:
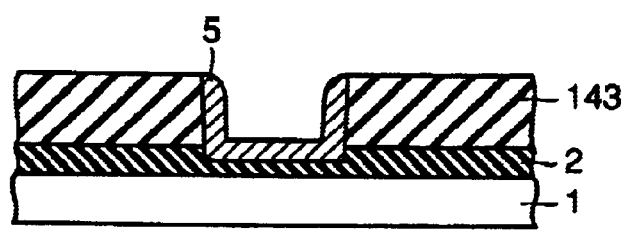

Then, the polysilicon film 4 located on the non-doped silicon oxide film 143 is removed by etching or CMP, thereby obtaining the structure shown in FIG. 99. A wire 5 is formed in the opening 3.

Figure 100:
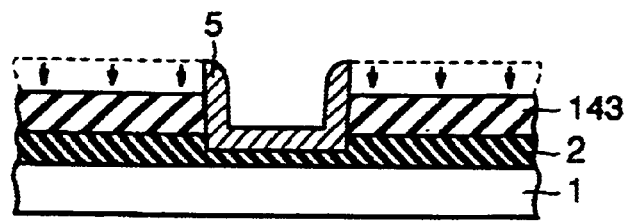

Then, an upper portion of the non-doped silicon oxide film 143 is partially removed by wet etching with an HF aqueous solution, as shown in FIG. 100. The amount of removal of the non-doped silicon oxide film 143 can be controlled by changing the time for dipping the same in the HF aqueous solution.

Thereafter granular crystals 9 are formed on surfaces of the wire 5, thereby obtaining the structure shown in FIG. 92.

Figure 101:
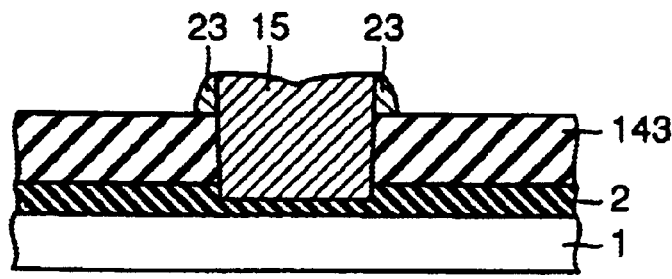
FIG. 101 is a sectional view showing a second modification of the wire of the DRAM according to the embodiment 8 of the present invention.

Referring to FIG. 101, a silicon nitride film 2 is formed on a major surface of a semiconductor substrate 1 in relation to a second modification of the wire of the DRAM according to the embodiment 8 of the present invention. A non-doped silicon oxide film 143 is formed on the silicon nitride film 2. A wire 15 consisting of polysilicon is formed to be partially embedded in the non-doped silicon oxide film 143 and the silicon nitride film 2. Side walls 23 are formed on side surfaces of the wire 15 consisting of polysilicon. Thus, the sectional area of the wire 15 comprising the side walls 23 of polysilicon can be increased. Thus, the resistance of the wire 15 can be further reduced.

Figure 102:
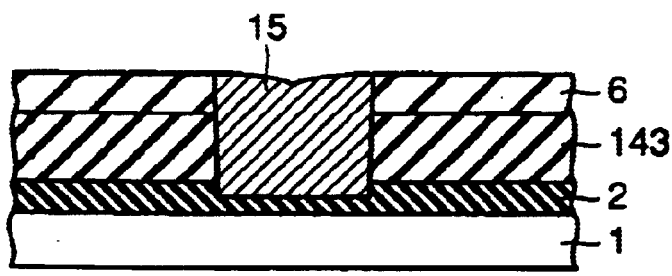
FIGS. 102 to 104 are sectional views for illustrating first to third steps of a method of fabricating the second modification of the wire of the DRAM according to the embodiment 8 of the present invention shown in FIG. 101.
Figure 103:
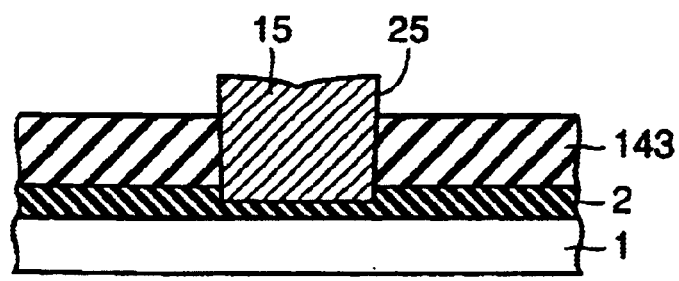
Figure 104:
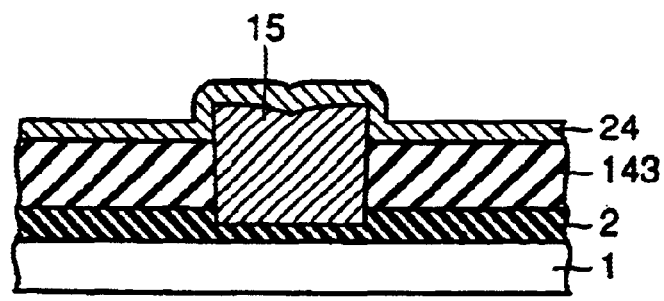

With reference to FIGS. 102 to 104, fabrication steps for the second modification of the wire of the DRAM according to the embodiment 8 of the present invention are now described.

First, a fabrication step identical to that for the first modification of the wire of the DRAM according to the embodiment 8 shown in FIG. 93 is carried out, and thereafter a polysilicon film (not shown) is formed on a boron-doped silicon oxide film 6 (see FIG. 102) and in an opening 3 (see FIG. 93). Thereafter the polysilicon film located on the boron-doped silicon oxide film 6 is removed, thereby forming the wire 15 shown in FIG. 102.

Then, the boron-doped silicon oxide film 6 is removed by etching, thereby obtaining the structure shown in FIG. 103. Thus, parts 25 of the side surfaces of the wire 15 can be exposed.

Then, a polysilicon film 24 is formed to cover the overall surface, as shown in FIG. 104.

Then, the polysilicon film 24 is partially removed by anisotropic etching, thereby obtaining the structure shown in FIG. 101.

Figure 105:
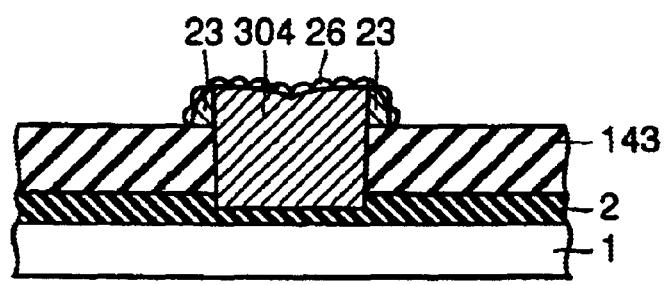
FIG. 105 is a sectional view showing a third modification of the wire of the DRAM according to the embodiment 8 of the present invention.

Referring to FIG. 105, a third modification of the wire of the DRAM according to the embodiment 8 of the present invention is basically similar in structure to the second modification of the wire of the DRAM according to the embodiment 8 of the present invention shown in FIG. 101. In the third modification shown in FIG. 105, however, a wire 304 is made of amorphous silicon. Further, side walls 23 are also made of amorphous silicon, and granular crystals 26 are formed on surfaces of the wire 304 and the side walls 23. Thus, the resistance of the wire 304 can be further reduced due to the granular crystals 26 formed on the surfaces of the wire 304 and the side walls 23.

In order to fabricate the third modification of the wire of the DRAM according to the embodiment 8 of the present invention, fabrication steps identical to those shown in FIGS. 102 to 104 are carried out and a step identical to that for forming the granular crystals 74 in the first modification of the DRAM according to the embodiment 1 of the present invention is carried out, for obtaining the structure shown in FIG. 105.

Figure 106:
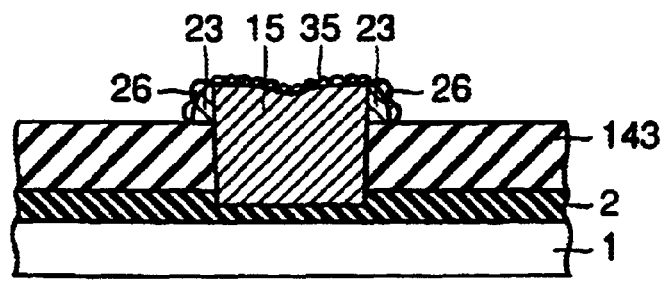
FIG. 106 is a sectional view showing a fourth modification of the wire of the DRAM according to the embodiment 8 of the present invention.

Referring to FIG. 106, a fourth modification of the wire of the DRAM according to the embodiment 8 of the present invention is basically similar in structure to the third modification shown in FIG. 105. In the fourth modification shown in FIG. 106, however, a wire 15 is made of polysilicon, and granular crystals 26 are formed on surfaces of side walls 23 made of amorphous silicon. Granular crystals 35 smaller than the granular crystals 26 are formed on an upper surface of the wire 15. Thus, an effect similar to that of the third modification of the wire of the DRAM according to the embodiment 8 of the present invention can be attained.

Figure 107:
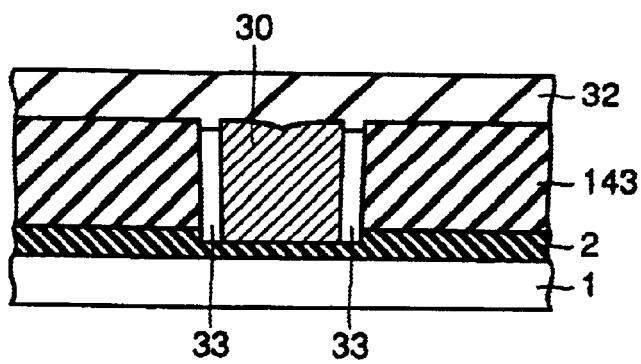
FIG. 107 is a sectional view showing a fifth modification of the wire of the DRAM according to the embodiment 8 of the present invention.

Referring to FIG. 107, a silicon nitride film 2 is formed on a major surface of a semiconductor substrate 1 in relation to a fifth modification of the wire of the DRAM according to the embodiment 8 of the present invention. A non-doped silicon oxide film 143 is formed on the silicon nitride film 2. A wire 30 consisting of polysilicon is formed to be embedded in the non-doped silicon oxide film 143 and the silicon nitride film 2. Clearances 33 are defined between the wire 30, the non-doped silicon oxide film 143 and the silicon nitride film 2. A silicon oxide film 32 is formed to cover the overall surface. Thus, a parasitic capacitance in the wire 30 can be reduced due to the clearances 33 defined on side surfaces thereof. Thus, the semiconductor device can be prevented from delay in an access time resulting from a parasitic capacitance, as well as from deterioration of electric characteristics.

With reference to FIGS. 108 to 112, fabrication steps for the fifth modification of the wire of the DRAM according to the embodiment 8 of the present invention are described.

Figure 108:
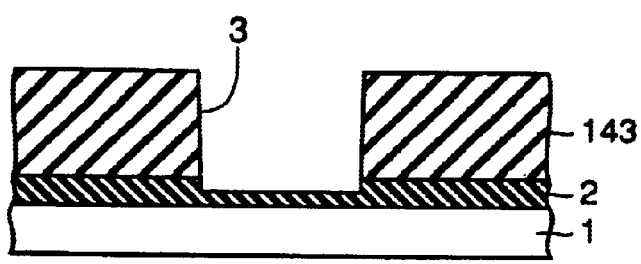
FIGS. 108 to 112 are sectional views for illustrating first to fifth steps of a method of fabricating the fifth modification of the wire of the DRAM according to the embodiment 8 of the present invention shown in FIG. 107.

First, the silicon nitride film 2 (see FIG. 108) is formed on the major surface of the semiconductor substrate 1 (see FIG. 108). A non-doped silicon oxide film 143 (see FIG. 108) is formed on the silicon nitride film 2. A resist pattern (not shown) is formed on the non-doped silicon oxide film 143 and thereafter employed as a mask for partially removing the non-doped silicon oxide film 143 and the silicon nitride film 2 by etching, thereby forming an opening 3 (see FIG. 108). Thus, the structure shown in FIG. 108 is obtained.

Figure 109:
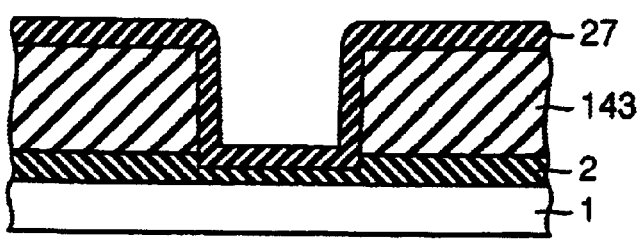

Then, an insulating film 27 (see FIG. 108) such as a silicon nitride film is formed on the non-doped silicon oxide film 143 and in the opening 3. Thus, the structure shown in FIG. 109 is obtained.

Figure 110:
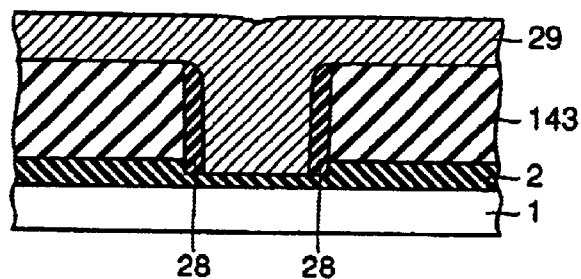

Then, the insulating film 27 is partially removed by anisotropic etching, thereby forming side walls 28 (see FIG. 110) in the opening 3. A polysilicon film 29 is formed on the non-doped silicon oxide film 143 and in the opening 3, as shown in FIG. 110.

Figure 111:
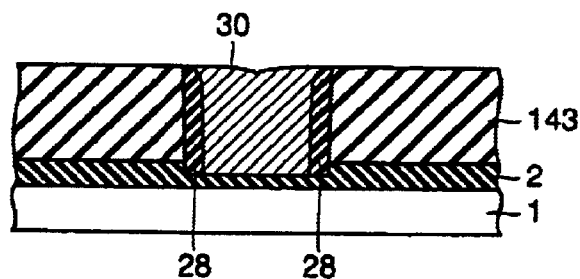

Then, a part of the polysilicon film 29 located on the non-doped silicon oxide film 143 is removed by anisotropic etching or CMP, thereby obtaining the structure shown in FIG. 111.

Figure 112:
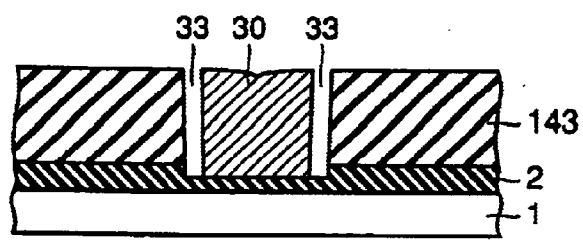

Then, the side walls 28 (see FIG. 111) are selectively removed by etching as shown in FIG. 112, thereby defining the clearances 33 on the side surfaces of the wire 30.

Thereafter a silicon oxide film 32 (see FIG. 107) which is inferior in coverage is formed to cover the overall surface, thereby obtaining the structure shown in FIG. 107.

Figure 113:
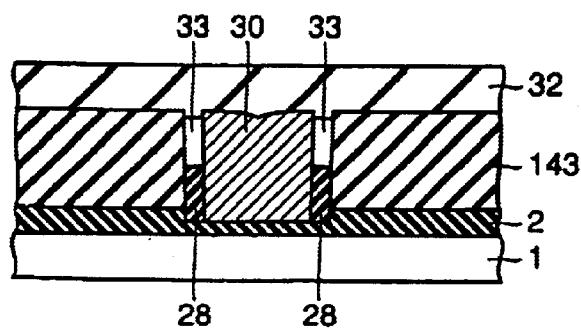
FIG. 113 is a sectional view showing a sixth modification of the wire of the DRAM according to the embodiment 8 of the present invention.
Figure 114:
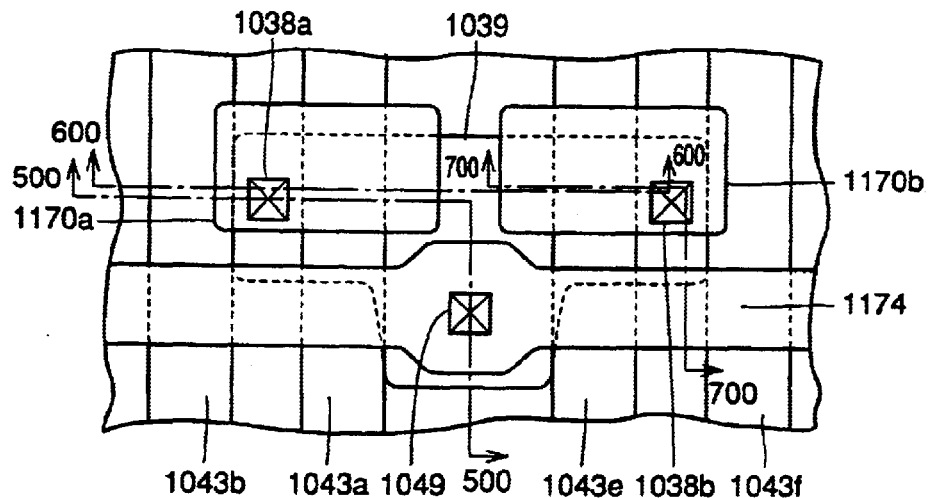
FIG. 114 is a typical plan view showing a memory cell region of a conventional DRAM.
Figure 115:
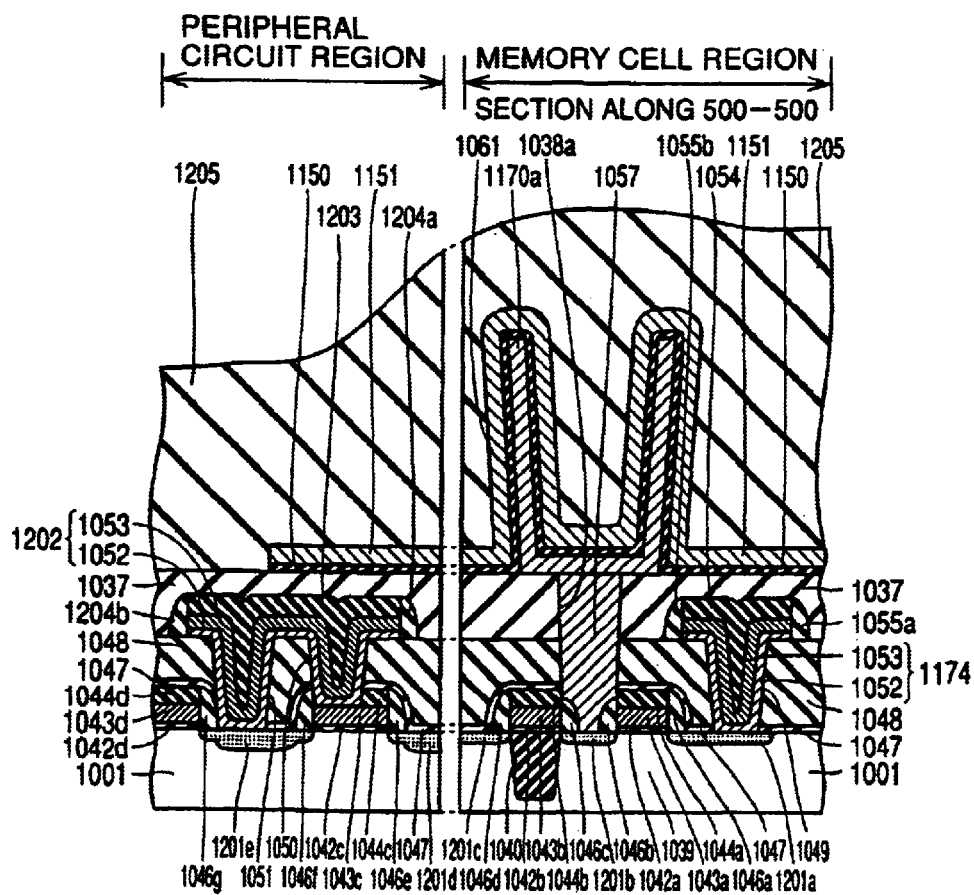
FIG. 115 is a sectional view of the conventional DRAM.
Figure 116:
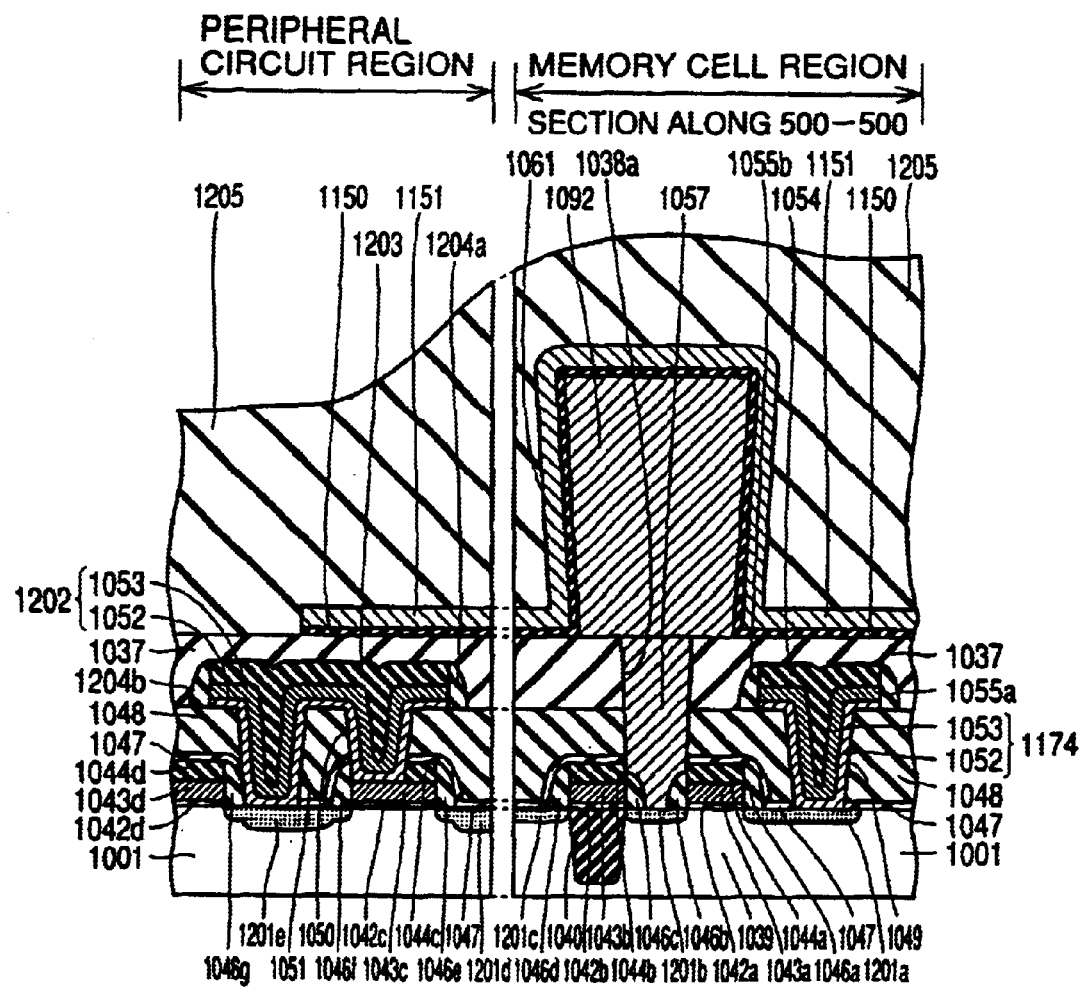
FIG. 116 is a sectional view of another conventional DRAM.
Figure 117:
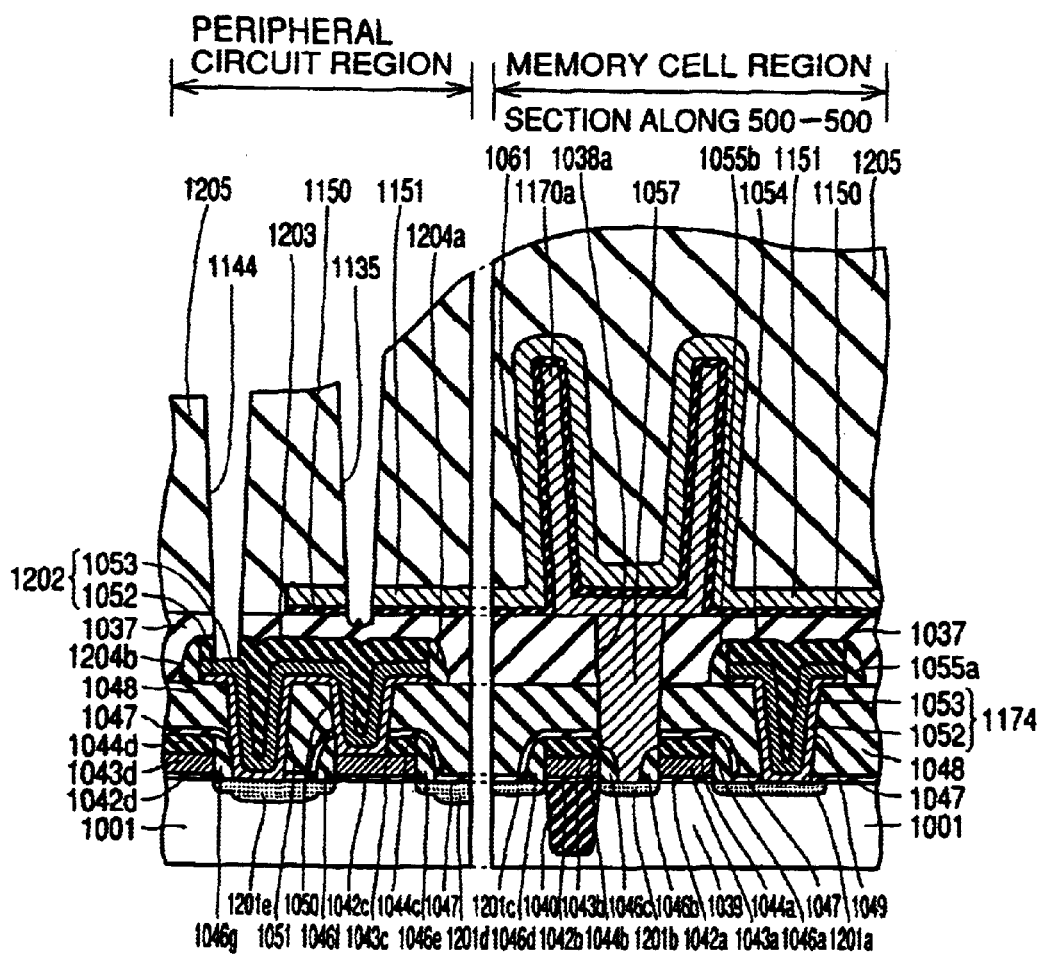
FIG. 117 is a sectional view showing a contact hole passing through a capacitor upper electrode in a peripheral circuit region of the conventional DRAM.

Referring to FIG. 113, a sixth modification of the wire of the DRAM according to the embodiment 8 of the present invention is basically similar in structure to the fifth modification of the wire of the DRAM according to the embodiment 8 shown in FIG. 107. In the sixth modification shown in FIG. 113, however, parts of side walls 28 remain under clearances 33. Also in this structure, an effect similar to that of the fifth modification of the wire of the DRAM according to the embodiment 8 of the present invention shown in FIG. 107 can be attained.

Fabrication steps for the sixth modification of the wire of the DRAM according to the embodiment 8 of the present invention shown in FIG. 113 are basically similar to those for the fifth modification of the wire of the DRAM according to the embodiment 8 shown in FIGS. 108 to 112. In a step identical to that shown in FIG. 112, however, the side walls 28 formed on side surfaces of a wire 30 are not entirely removed but partially left.

The first to sixth modifications of the wire of the DRAM according to the embodiment 8 are also applicable to the DRAMs according to the embodiments 1 to 7 of the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a memory cell region and a peripheral circuit region, comprising:
   a semiconductor substrate having a major surface;
   an insulating film, having an upper surface, being formed on said major surface of said semiconductor substrate to extend from said memory cell region to said peripheral circuit region, wherein said insulating film includes an upper insulating film and lower insulating film being different in etching rate from each other;
   a capacitor lower electrode assembly, including first and second lower electrodes being adjacent to each other through a part of said insulating film, being formed on said major surface of said semiconductor substrate to extend up to a vertical position substantially identical to that of said upper surface of said insulating film in said memory cell region;
   first and second openings formed in the insulating film, and the first and the second lower electrodes formed within the first and second openings, respectively;
   said first and second lower electrodes each of a cylindrical shape having an interior region;
   wherein respective sidewalls of the first and the second lower electrodes are formed to extend in a longitudinal direction with respect to the major surface of the semiconductor substrate, each sidewall having a cross-section the longitudinal direction which is substantially linear; and
   a capacitor upper electrode being formed on said capacitor lower electrode assembly through a dielectric film to extend onto said upper surface of said insulating film, said upper electrode being formed on the interior region of each of the first and second electrodes,
   said capacitor lower electrode assembly including a capacitor lower electrode part upwardly extending in opposition to said capacitor upper electrode and having a top surface and a bottom surface the semiconductor device further comprising granular crystals on a surface of said capacitor lower electrode.

2. The semiconductor device in accordance with claim 1, comprising said dielectric film being formed between at least either a side surface or only a part of said bottom surface of said capacitor lower electrode part and said insulating film.

3. The semiconductor device in accordance with claim 1, wherein
   said part of said insulating film having a width being smaller than the minimum working size formable by photolithography.

4. The semiconductor device in accordance with claim 3, comprising:
   said capacitor upper electrode being formed to extend toward said peripheral circuit region,
   an upper interlayer isolation film being formed on said capacitor upper electrode and having a contact hole exposing a surface of said capacitor upper electrode, and
   a peripheral circuit element protection film being formed under said insulating film in a region located under said contact hole.

5. A semiconductor device including a memory cell region and a peripheral circuit region, comprising:
   a semiconductor substrate having a major surface;
   an insulating film, having an upper surface, being formed on said major surface of said semiconductor substrate to extend from said memory cell region to said peripheral circuit region, wherein said insulating film includes an upper insulating film and lower insulating film being different in etching rate from each other;
   a capacitor lower electrode assembly, including first and second lower electrodes being adjacent to each other through a part of said insulating film, being formed on said major surface of said semiconductor substrate to extend up to a vertical position substantially identical to that of said upper surface of said insulating film in said memory cell region;
   first and second openings formed in the insulating film, and the first and the second lower electrodes formed within the first and second openings, respectively;
   said first and second lower electrodes each of a cylindrical shape having an interior region;
   wherein respective sidewalls of the first and the second lower electrodes are formed to extend in a longitudinal direction with respect to the major surface of the semiconductor substrate; and
   a capacitor upper electrode being formed on said capacitor lower electrode assembly through a dielectric film to extend onto said upper surface of said insulating film, said upper electrode being formed on the interior region of each of the first and second electrodes,
   said capacitor lower electrode assembly including a capacitor lower electrode part upwardly extending in opposition to said capacitor upper electrode and having a top surface and a bottom surface, wherein
   a side surface of said capacitor lower electrode has a curved plane; and
   a first width of the first and second lower electrodes at their upper ends is narrower than a second width in a central portion, in the height direction, of the first and second lower electrodes.

* * * * *